(12) United States Patent
Yamazaki

(10) Patent No.: US 11,789,497 B2
(45) Date of Patent: *Oct. 17, 2023

(54) DISPLAY DEVICE, ELECTRONIC DEVICE, AND SYSTEM

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/395,739

(22) Filed: Aug. 6, 2021

(65) Prior Publication Data

US 2021/0373605 A1 Dec. 2, 2021

Related U.S. Application Data

(63) Continuation of application No. 16/838,070, filed on Apr. 2, 2020, now Pat. No. 11,086,364, which is a
(Continued)

(30) Foreign Application Priority Data

Mar. 23, 2015 (JP) .................................. 2015-059505

(51) Int. Cl.
*G06F 1/16* (2006.01)
*G09F 9/00* (2006.01)
(Continued)

(52) U.S. Cl.
CPC ............ *G06F 1/1652* (2013.01); *G06F 1/162* (2013.01); *G06F 1/1616* (2013.01);
(Continued)

(58) Field of Classification Search
CPC .... G06F 1/1652; G06F 1/1622; G06F 1/1616; G06F 1/162; G06F 1/1618; G06F 1/1654;
(Continued)

(56) References Cited

U.S. PATENT DOCUMENTS 6,297,945 B1    10/2001  Yamamoto
7,724,508 B2 *   5/2010  Bemelmans ............ G09F 9/301
                                                    345/169
(Continued)

FOREIGN PATENT DOCUMENTS

EP        2360517 A     8/2011
EP        2742674 A     6/2014
(Continued)

OTHER PUBLICATIONS

International Search Report (Application No. PCT/IB2016/051384) dated Jun. 14, 2016.
(Continued)

*Primary Examiner* — Rockshana D Chowdhury
(74) *Attorney, Agent, or Firm* — Fish & Richardson P.C.

(57) ABSTRACT

A display region of an electronic device is enlarged. Alternatively, a display region of an electronic device is protected. Alternatively, a display device for extending a display region is provided. A system includes an electronic device including a first display portion positioned on a first surface including an upper surface of a housing and a second display portion positioned on a second surface including a first side surface of the housing, and a display device including a third display portion positioned on a third surface of a support portion and a connection portion having a function of connecting with the housing and a function of reversibly changing the relative positions of the support portion and the housing between a first configuration and a second configuration. The first configuration is a configu-
(Continued)

ration in which the support portion covers the first display portion such that the second display portion is visible. The second configuration is a configuration in which the support portion and the housing are opened such that the first display portion, the second display portion, and the third display portion are visible.

16 Claims, 45 Drawing Sheets

Related U.S. Application Data continuation of application No. 15/559,075, filed as application No. PCT/IB2016/051384 on Mar. 11, 2016, now Pat. No. 10,613,586.

(51) Int. Cl.

| | | |
|---|---|---|
| *G09F 9/30* | (2006.01) | |
| *H04M 1/02* | (2006.01) | |
| *G09F 9/40* | (2006.01) | |
| *H05B 33/02* | (2006.01) | |
| *H10K 77/10* | (2023.01) | |
| H05B 33/26 | (2006.01) | |
| G02F 1/1334 | (2006.01) | |
| G02F 1/137 | (2006.01) | |
| G02F 1/1335 | (2006.01) | |
| G02F 1/1343 | (2006.01) | |
| H10K 50/00 | (2023.01) | |
| H10K 59/126 | (2023.01) | |
| H10K 59/131 | (2023.01) | |
| H10K 102/00 | (2023.01) | |
| G02F 1/1333 | (2006.01) | |
| G02F 1/1368 | (2006.01) | |

(52) U.S. Cl.
CPC .......... *G06F 1/1618* (2013.01); *G06F 1/1622* (2013.01); *G06F 1/1654* (2013.01); *G06F 1/1698* (2013.01); *G09F 9/00* (2013.01); *G09F 9/30* (2013.01); *G09F 9/40* (2013.01); *H04M 1/02* (2013.01); *H05B 33/02* (2013.01); *H10K 77/111* (2023.02); G02F 1/1334 (2013.01); G02F 1/1368 (2013.01); G02F 1/13338 (2013.01); G02F 1/13793 (2021.01); G02F 1/133305 (2013.01); G02F 1/133345 (2013.01); G02F 1/133512 (2013.01); G02F 1/133514 (2013.01); G02F 1/133519 (2021.01); G02F 1/133528 (2013.01); G02F 1/134309 (2013.01); G02F 1/134372 (2021.01); G02F 2202/28 (2013.01); *H05B 33/26* (2013.01); *H10K 50/00* (2023.02); *H10K 59/126* (2023.02); *H10K 59/131* (2023.02); *H10K 2102/3026* (2023.02); *H10K 2102/311* (2023.02); Y02E 10/549 (2013.01)

(58) Field of Classification Search
CPC .............. G06F 1/1698; H01L 51/0097; H01L 27/3276; H01L 27/3272; H01L 2251/5315; H01L 51/50; H01L 2251/5338; H05B 33/02; H05B 33/26; G09F 9/00; G09F 9/30; G09F 9/40; H04M 1/02; G02F 1/1368; G02F 1/133512; G02F 1/133514; G02F 1/133528; G02F 1/134309; G02F 2001/133519; G02F 2001/134372; G02F 2202/28; G02F 2001/13793; G02F 1/1334; G02F 1/133305; G02F 1/133345; G02F 1/13338; Y02E 10/549
See application file for complete search history.

(56) References Cited

U.S. PATENT DOCUMENTS

| | | |
|---|---|---|
| 8,138,869 B1 | 3/2012 | Lauder et al. |
| 8,143,982 B1 | 3/2012 | Lauder et al. |
| 8,143,983 B1 | 3/2012 | Lauder et al. |
| D658,186 S | 4/2012 | Akana et al. |
| D663,304 S | 7/2012 | Akana et al. |
| 8,242,868 B2 | 8/2012 | Lauder et al. |
| 8,253,518 B2 | 8/2012 | Lauder et al. |
| 8,264,310 B2 | 9/2012 | Lauder et al. |
| 8,289,115 B2 | 10/2012 | Cretella, Jr. et al. |
| D671,114 S | 11/2012 | Akana et al. |
| D671,948 S | 12/2012 | Akana et al. |
| 8,344,836 B2 | 1/2013 | Lauder et al. |
| 8,379,377 B2* | 2/2013 | Walters ................ G06F 1/1641 361/679.04 |
| 8,390,411 B2 | 3/2013 | Lauder et al. |
| 8,390,412 B2 | 3/2013 | Lauder et al. |
| 8,390,413 B2 | 3/2013 | Lauder et al. |
| 8,395,465 B2 | 3/2013 | Lauder et al. |
| D682,836 S | 5/2013 | Akana et al. |
| D682,838 S | 5/2013 | Akana et al. |
| 8,514,042 B2 | 8/2013 | Lauder et al. |
| 8,576,031 B2 | 11/2013 | Lauder et al. |
| D697,512 S | 1/2014 | Akana et al. |
| 8,624,695 B2 | 1/2014 | Cretella, Jr. et al. |
| 8,648,679 B2 | 2/2014 | Lauder et al. |
| D701,205 S | 3/2014 | Akana et al. |
| 8,665,044 B2 | 3/2014 | Lauder et al. |
| 8,665,045 B2 | 3/2014 | Lauder et al. |
| D704,702 S | 5/2014 | Akana et al. |
| 8,723,824 B2 | 5/2014 | Myers et al. |
| 8,803,816 B2 | 8/2014 | Kilpatrick, II et al. |
| 8,836,611 B2 | 9/2014 | Kilpatrick, II et al. |
| 8,860,632 B2 | 10/2014 | Kilpatrick, II et al. |
| 8,860,765 B2 | 10/2014 | Kilpatrick, II et al. |
| 8,863,038 B2 | 10/2014 | King et al. |
| 8,866,840 B2 | 10/2014 | Dahl et al. |
| 8,884,730 B2 | 11/2014 | Lauder et al. |
| 8,928,437 B2 | 1/2015 | Lauder et al. |
| 8,933,874 B2 | 1/2015 | Lundqvist et al. |
| 8,947,320 B2 | 2/2015 | King et al. |
| 8,952,867 B2 | 2/2015 | Urawaki et al. |
| 8,975,991 B2 | 3/2015 | Lauder et al. |
| 8,976,141 B2 | 3/2015 | Myers et al. |
| 8,988,876 B2 | 3/2015 | Corbin et al. |
| 9,009,984 B2 | 4/2015 | Caskey et al. |
| D730,362 S | 5/2015 | Akana et al. |
| 9,069,339 B2 | 6/2015 | Cretella, Jr. et al. |
| 9,088,006 B2 | 7/2015 | Yamazaki et al. |
| 9,107,287 B2 | 8/2015 | Ryu |
| 9,111,841 B2 | 8/2015 | Yamazaki et al. |
| 9,176,535 B2* | 11/2015 | Bohn .................... G06F 1/1681 |
| D745,004 S | 12/2015 | Kim |
| 9,274,741 B2 | 3/2016 | Moon |
| 9,300,772 B2 | 3/2016 | Kim |
| 9,329,630 B2 | 5/2016 | Lauder et al. |
| 9,335,793 B2 | 5/2016 | Rothkopf |
| 9,411,451 B2 | 8/2016 | Myers et al. |
| 9,438,709 B2 | 9/2016 | Kim |
| 9,491,272 B2 | 11/2016 | Kim |
| 9,494,980 B2 | 11/2016 | Corbin et al. |
| D773,470 S | 12/2016 | Akana et al. |
| D775,124 S | 12/2016 | Kim |
| D775,625 S | 1/2017 | Kim |
| 9,547,340 B2* | 1/2017 | Min ........................ G06F 1/162 |
| 9,564,473 B2 | 2/2017 | Yamazaki et al. |
| 9,568,954 B2 | 2/2017 | Lauder et al. |
| 9,602,644 B2 | 3/2017 | Kim |
| 9,627,648 B2 | 4/2017 | Yamazaki et al. |
| D792,393 S | 7/2017 | Akana et al. |
| 9,753,495 B2 | 9/2017 | Matsumoto |

(56) References Cited

U.S. PATENT DOCUMENTS

| | | | |
|---|---|---|---|
| 9,870,194 B2* | 1/2018 | Bang | G09F 15/0012 |
| 10,042,393 B2 | 8/2018 | Ryu | |
| 10,152,217 B2 | 12/2018 | Moon | |
| 10,178,208 B2 | 1/2019 | Kim | |
| 10,244,091 B2 | 3/2019 | Kim | |
| 2010/0060664 A1 | 3/2010 | Kilpatrick, II et al. | |
| 2010/0085274 A1* | 4/2010 | Kilpatrick, II | G06F 1/1641 345/1.3 |
| 2010/0085382 A1* | 4/2010 | Lundqvist | G06F 3/1438 345/659 |
| 2010/0277665 A1* | 11/2010 | Kuo | G02F 1/13336 349/73 |
| 2011/0109526 A1 | 5/2011 | Bauza et al. | |
| 2011/0216064 A1* | 9/2011 | Dahl | H04M 1/0247 345/428 |
| 2012/0037928 A1* | 2/2012 | Shim | G02B 5/3033 257/E33.068 |
| 2012/0194448 A1* | 8/2012 | Roth | G06F 1/1643 361/679.01 |
| 2012/0235894 A1* | 9/2012 | Phillips | G09G 3/36 345/156 |
| 2012/0262367 A1* | 10/2012 | Chiu | G06F 1/1626 345/156 |
| 2012/0307423 A1 | 12/2012 | Bohn et al. | |
| 2013/0076649 A1* | 3/2013 | Myers | G06F 3/0488 361/679.01 |
| 2013/0093304 A1* | 4/2013 | Childs | F16M 11/38 312/240 |
| 2013/0300697 A1* | 11/2013 | Kim | G06F 1/1626 345/173 |
| 2014/0029190 A1* | 1/2014 | Sato | G06F 1/1641 361/679.27 |
| 2014/0065326 A1* | 3/2014 | Lee | G09F 9/301 428/12 |
| 2014/0204511 A1 | 7/2014 | Oh et al. | |
| 2014/0213324 A1* | 7/2014 | Tan | G06F 1/1677 455/566 |
| 2014/0215201 A1* | 7/2014 | Pfeifer | G06F 9/441 713/100 |
| 2014/0319550 A1 | 10/2014 | Yamazaki et al. | |
| 2015/0009128 A1 | 1/2015 | Matsumoto | |
| 2015/0022561 A1 | 1/2015 | Ikeda et al. | |
| 2015/0049281 A1* | 2/2015 | Lee | H10K 50/844 349/110 |
| 2015/0130767 A1 | 5/2015 | Myers et al. | |
| 2016/0026381 A1* | 1/2016 | Kim | G06F 3/04817 715/761 |
| 2016/0085319 A1* | 3/2016 | Kim | H04M 1/0268 345/156 |
| 2016/0224238 A1 | 8/2016 | Rothkopf | |
| 2016/0291642 A1* | 10/2016 | Kwak | G06F 3/04886 |
| 2016/0295176 A1* | 10/2016 | Jeong | G06F 1/1637 |
| 2016/0306392 A1* | 10/2016 | Park | G06F 3/041 |
| 2017/0010633 A1 | 1/2017 | Corbin et al. | |
| 2017/0038641 A1* | 2/2017 | Yamazaki | G02F 1/133308 |
| 2017/0125144 A1 | 5/2017 | Lauder et al. | |
| 2017/0148866 A1 | 5/2017 | Yamazaki et al. | |
| 2018/0074553 A1* | 3/2018 | Yamazaki | H05B 33/02 |
| 2018/0164852 A1* | 6/2018 | Lim | H04M 1/0214 |
| 2019/0191022 A1 | 6/2019 | Kim | |

FOREIGN PATENT DOCUMENTS

| | | |
|---|---|---|
| EP | 3041147 A | 7/2016 |
| EP | 3041148 A | 7/2016 |
| EP | 3070851 A | 9/2016 |
| EP | 3125508 A | 2/2017 |
| EP | 3190476 A | 7/2017 |
| EP | 3223435 A | 9/2017 |
| EP | 3223436 A | 9/2017 |
| EP | 3247045 A | 11/2017 |
| EP | 3327543 A | 5/2018 |
| EP | 3512105 A | 7/2019 |
| JP | 2010-086081 A | 4/2010 |
| JP | 2011-237949 A | 11/2011 |
| JP | 2012-502372 | 1/2012 |
| JP | 2012-508406 | 4/2012 |
| JP | 2012-513033 | 6/2012 |
| JP | 2013-025617 A | 2/2013 |
| JP | 2014-026385 A | 2/2014 |
| JP | 2014-512552 | 5/2014 |
| JP | 2014-519626 | 8/2014 |
| JP | 2014-197522 A | 10/2014 |
| JP | 2014-225010 A | 12/2014 |
| JP | 2014-535086 | 12/2014 |
| JP | 2015-028617 A | 2/2015 |
| JP | 2015-038606 A | 2/2015 |
| KR | 10-1504237 | 3/2015 |
| WO | WO-2010/028394 | 3/2010 |
| WO | WO-2010/028397 | 3/2010 |
| WO | WO-2010/028399 | 3/2010 |
| WO | WO-2010/028402 | 3/2010 |
| WO | WO-2010/028403 | 3/2010 |
| WO | WO-2010/028404 | 3/2010 |
| WO | WO-2010/028405 | 3/2010 |
| WO | WO-2010/028406 | 3/2010 |
| WO | WO-2010/028407 | 3/2010 |
| WO | WO-2012/049968 | 4/2012 |
| WO | WO-2012/167204 | 12/2012 |
| WO | WO-2013/048881 | 4/2013 |
| WO | WO-2013/103278 | 7/2013 |
| WO | WO-2014/017122 | 1/2014 |
| WO | WO-2014/175198 | 10/2014 |
| WO | WO-2015/002037 | 1/2015 |
| WO | WO-2015/008715 | 1/2015 |

OTHER PUBLICATIONS

Written Opinion (Application No. PCT/IB2016/051384) dated Jun. 14, 2016.

* cited by examiner

FIG. 1A1
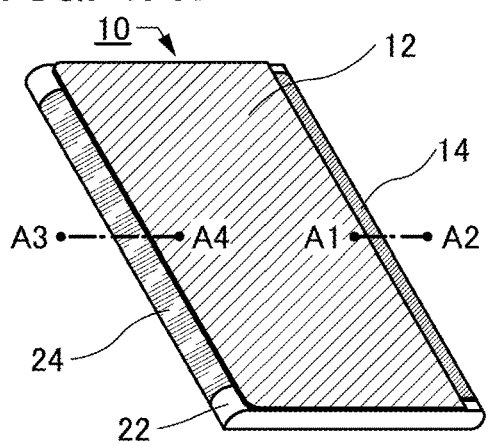
FIG. 1A2
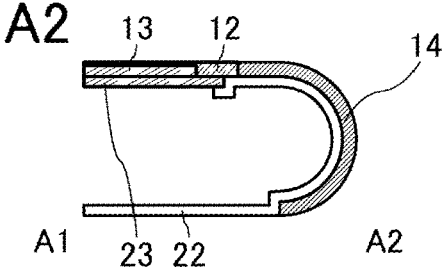
FIG. 1A3
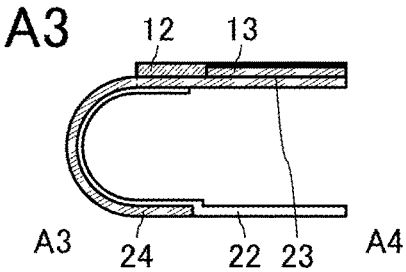
FIG. 1B1
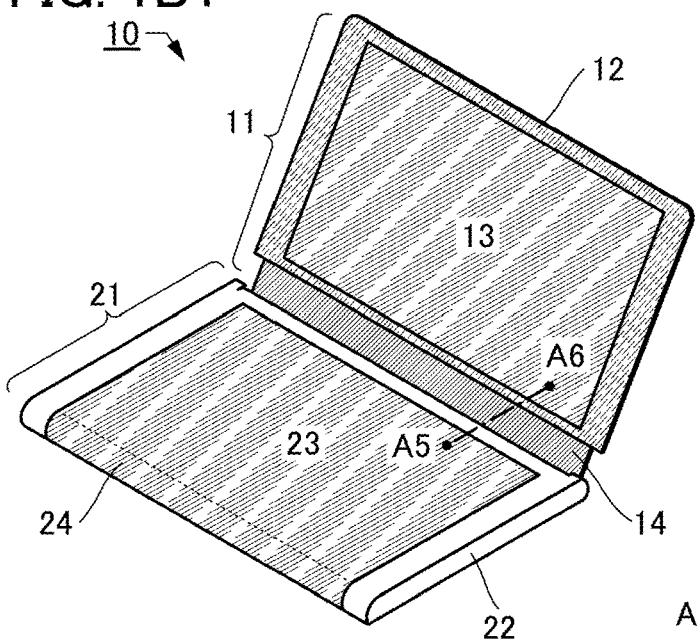
FIG. 1B2
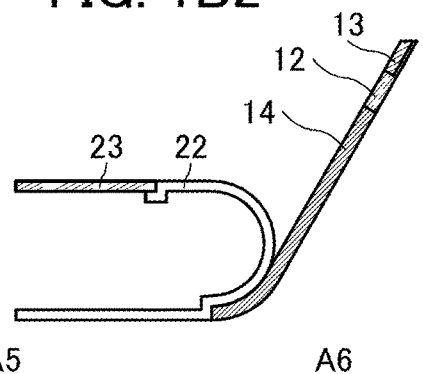
FIG. 1C1
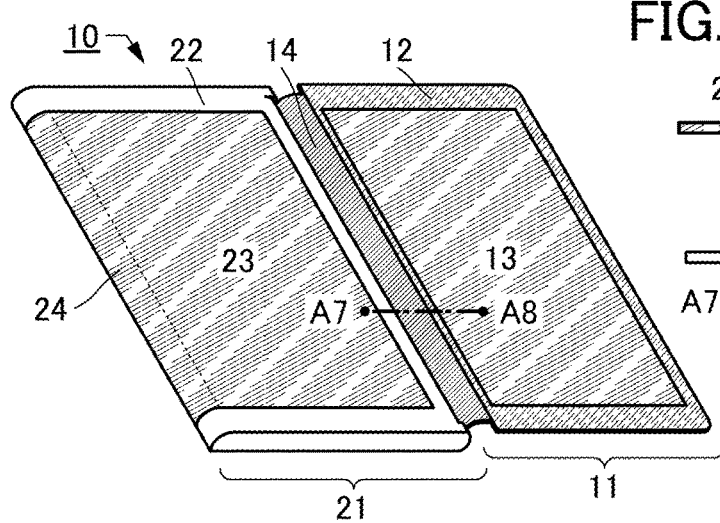
FIG. 1C2
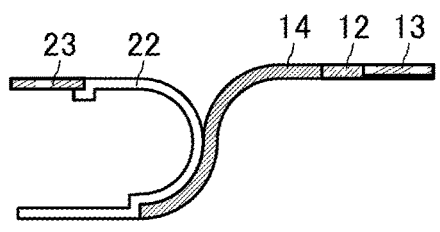

FIG. 2A1
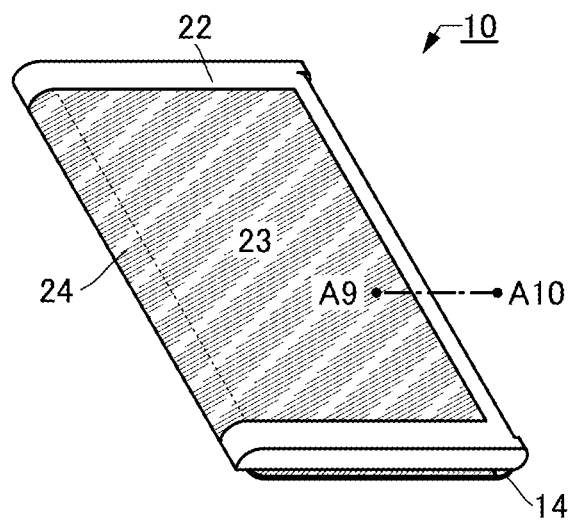
FIG. 2A2
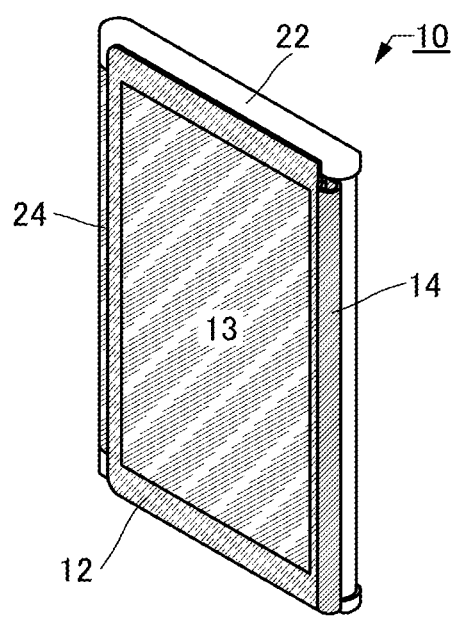
FIG. 2A3
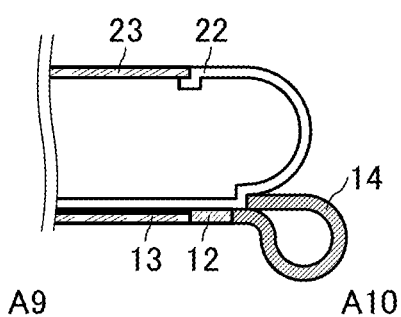

FIG. 4A1
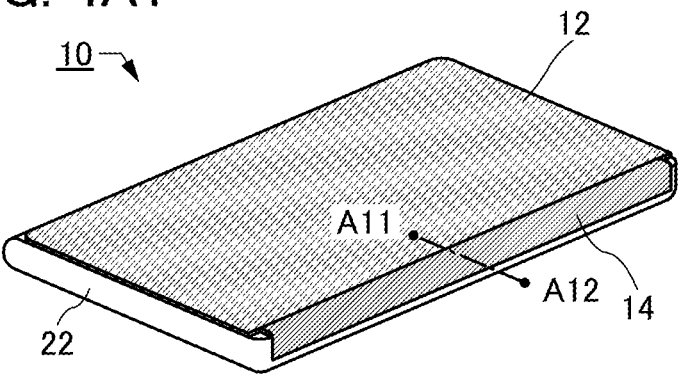
FIG. 4A2
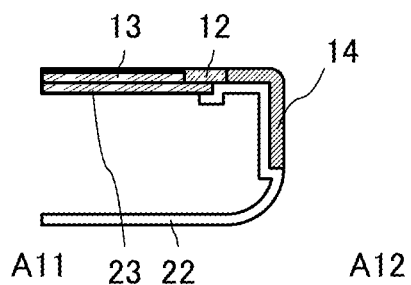
FIG. 4B1
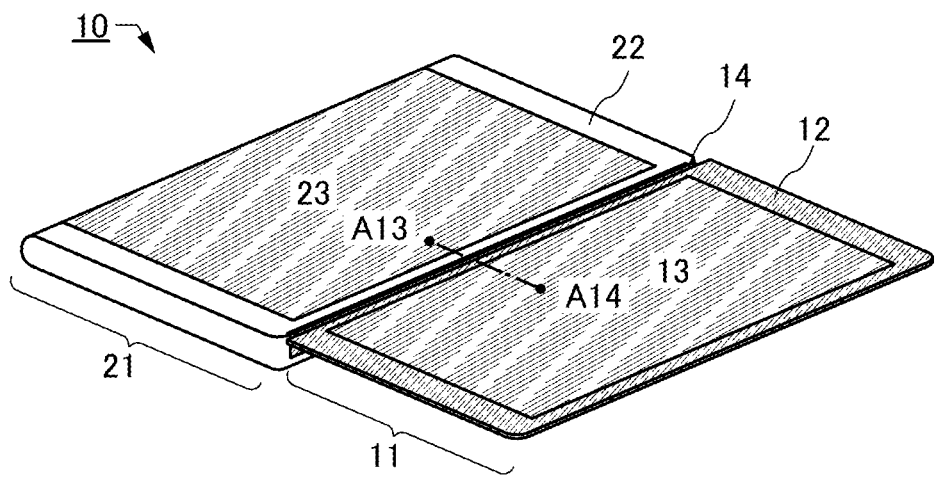
FIG. 4B2
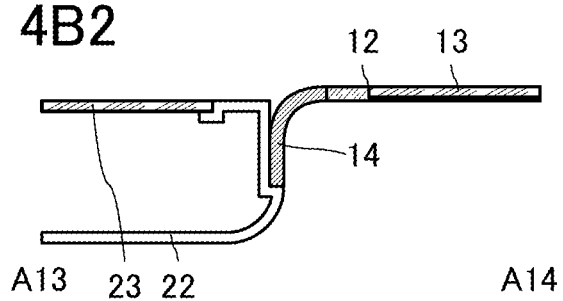

FIG. 5A1
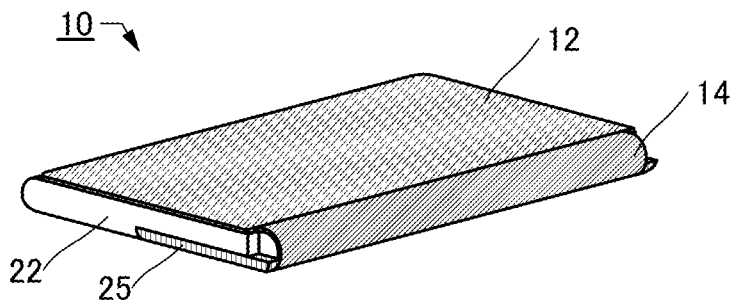
FIG. 5A2
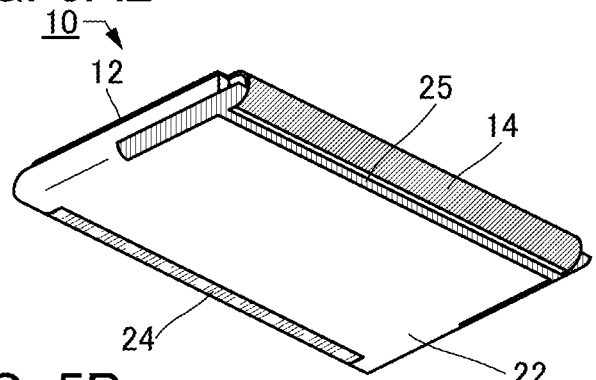
FIG. 5B
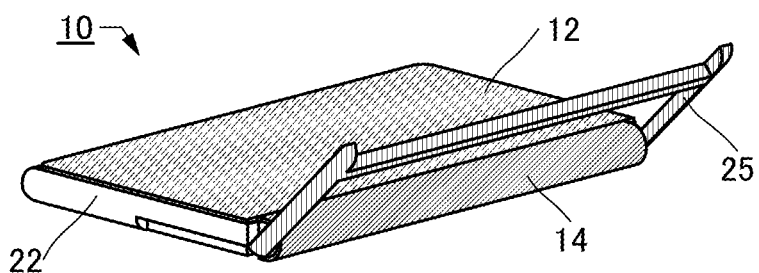
FIG. 5C
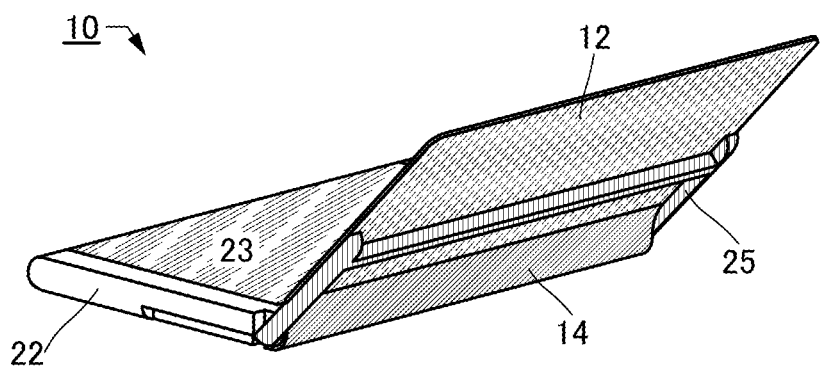

FIG. 11A1
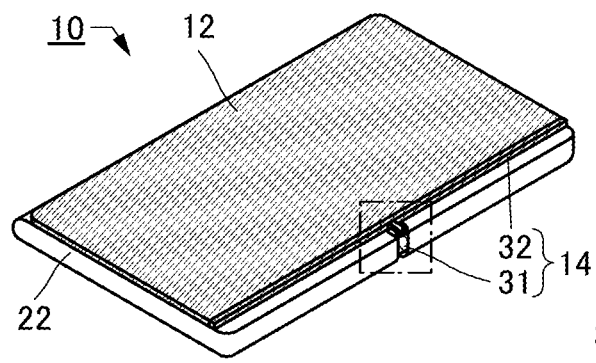
FIG. 11A2
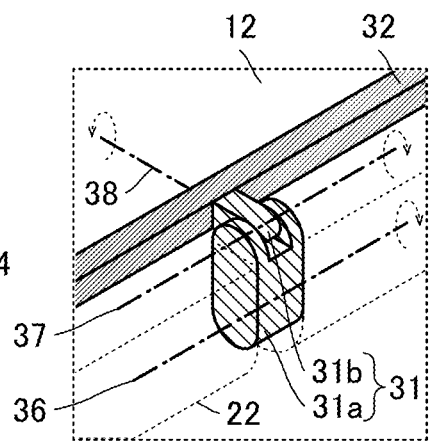
FIG. 11B
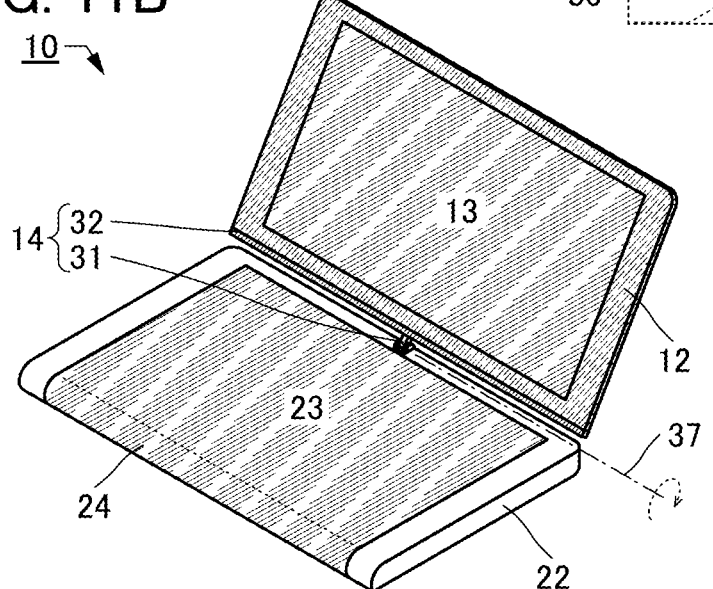
FIG. 11C
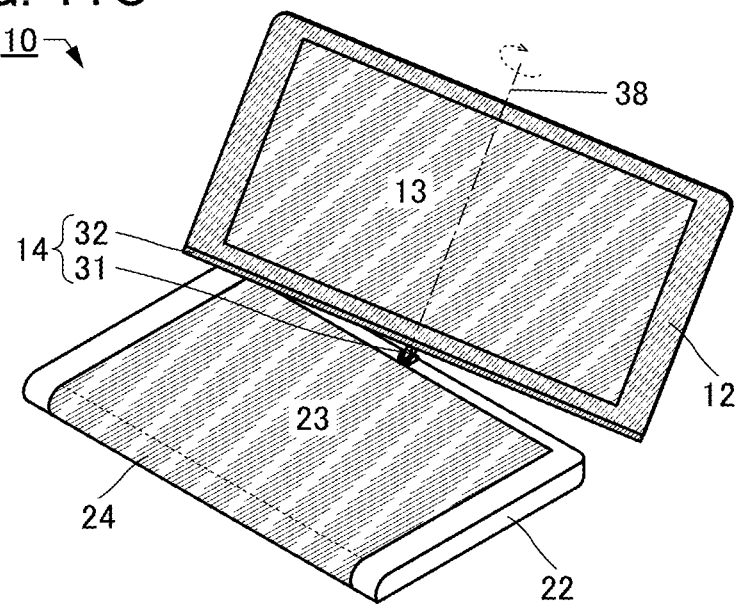

FIG. 45A
WRITING PERIOD
FIG. 45B
SENSING PERIOD
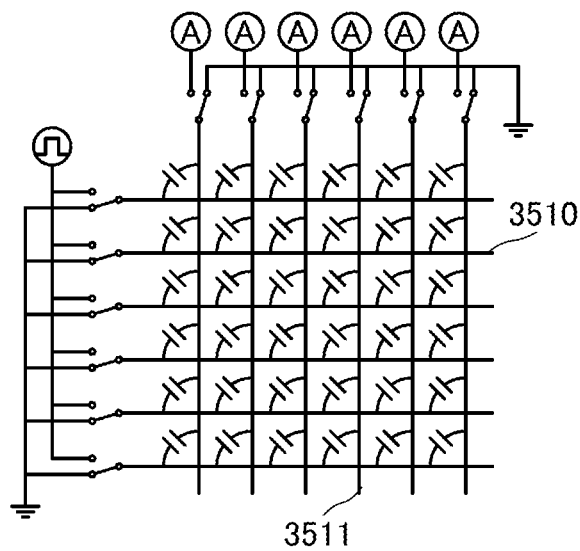
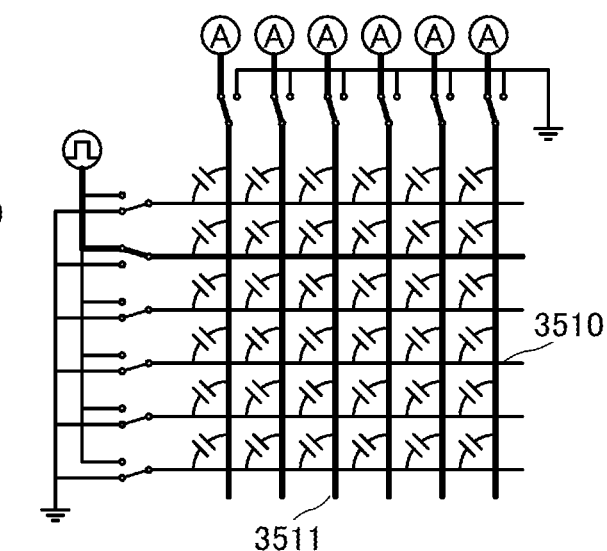

DISPLAY DEVICE, ELECTRONIC DEVICE, AND SYSTEM

CROSS-REFERENCE TO RELATED APPLICATIONS

This application is a continuation of U.S. application Ser. No. 16/838,070, filed Apr. 2, 2020, now allowed, which is a continuation of U.S. application Ser. No. 15/559,075, filed Sep. 18, 2017, now U.S. Pat. No. 10,613,586, which is incorporated by reference and is a U.S. National Phase Application under U.S.C. § 3.71 of International Application No. PCT/IB2016/051384, filed Mar. 11, 2016, which is incorporated by reference and claims the benefit of a foreign priority application filed in Japan as Application No. 2015-059505, on Mar. 23, 2015.

TECHNICAL FIELD

One embodiment of the present invention relates to a display device. One embodiment of the present invention relates to an electronic device. One embodiment of the present invention relates to a system including a display device.

Note that one embodiment of the present invention is not limited to the above technical field. As the technical field of one embodiment of the present invention disclosed in this specification, a semiconductor device, a display device, a light-emitting device, a power storage device, a memory device, an electronic device, a lighting device, an input device, an input/output device, a driving method thereof, or a manufacturing method thereof can be given as an example.

BACKGROUND ART

Electronic devices including display devices have recently been diversified. As one of such electronic devices, an electronic device such as a cellular phone, a smartphone, a tablet terminal, or a wearable terminal is given.

As display devices, typically, a light-emitting device including a light-emitting element such as an organic EL (Electro Luminescence) element or a light-emitting diode (LED: Light Emitting Diode), a liquid crystal display device, electronic paper that performs display by an electrophoretic method or the like, and the like are given.

Patent Document 1 discloses a flexible light-emitting device using an organic EL element.

PRIOR ART DOCUMENT

Patent Document

[Patent Document 1] Japanese Published Patent Application No. 2014-197522

SUMMARY OF THE INVENTION

Problems to be Solved by the Invention

In recent years, browsability of display has been considered to be improved by enlarging display regions of electronic devices to increase the amount of display. However, in applications of portable devices and the like, an enlargement of display regions might entail a reduction in portability (also referred to as portability). For this reason, an improvement in browsability of display and a high portability have been difficult to achieve at the same time.

An object of one embodiment of the present invention is to enlarge a display region of an electronic device. Alternatively, an object is to protect a display region of an electronic device. Alternatively, an object is to provide a function of selecting the size of a display region of an electronic device depending on its application. Alternatively, an object is to provide a display device for extending a display region of an electronic device. Alternatively, an object is to provide a highly portable electronic device.

Alternatively, an object of one embodiment of the present invention is to provide a novel display device, a novel electronic device, or a novel system including a display device.

Note that the description of these objects does not disturb the existence of other objects. In one embodiment of the present invention, there is no need to achieve all of these objects. In addition, objects other than the above can be derived from the description of the specification and like.

Means for Solving the Problems

One embodiment of the present invention is a display device that is attachable to an electronic device. The electronic device includes a housing, and the housing includes a first display portion and a second display portion. The first display portion is positioned on a first surface including an upper surface of the housing, and the second display portion is positioned on a second surface including a first side surface of the housing. In addition, the display device includes a support portion, a connection portion, and a third display portion. The third display portion is positioned on a third surface of the support portion. The connection portion has a function of connecting with the housing and a function of reversibly changing the relative positions of the support portion and the housing between a first configuration and a second configuration. The first configuration is a configuration in which the support portion covers the first display portion such that the second display portion is visible. The second configuration is a configuration in which the support portion and the housing are opened such that the first display portion, the second display portion, and the third display portion are visible.

In addition, it is preferable that, in the first configuration, the first display portion and the third display portion be positioned to face each other.

In addition, it is preferable that, in the first configuration, the support portion be positioned not to cover at least a portion of the second display portion.

In addition, it is preferable that the support portion include a light-transmitting portion, and in the first configuration, the light-transmitting portion be positioned to cover a portion of the first side surface of the housing so as to overlap with the second display portion.

In addition, it is preferable that the support portion be flexible and have a function of allowing the third display portion to be bent.

In addition, it is preferable that the connection portion be flexible. In that case, it is preferable that the relative positions of the support portion and the housing be reversibly changed between the first configuration and the second configuration by bending the connection portion.

In addition, it is preferable that the connection portion include a hinge structure with two or more rotation axes. In that case, it is preferable that the hinge structure enable the relative positions of the support portion and the housing to be reversibly changed between the first configuration and the second configuration.

In addition, it is preferable that the connection portion include a reception portion supplied with power and a signal from the housing. In that case, it is preferable that the reception portion be supplied with the power and the signal from the housing wirelessly.

In addition, it is preferable that the connection portion have a function of being magnetically attachable to and detachable from the housing.

In addition, another embodiment of the present invention is an electronic device to which a display device is attachable. The electronic device includes a housing, and the housing includes a first display portion and a second display portion. The first display portion is positioned on a first surface including an upper surface of the housing, and the second display portion is positioned on a second surface including a first side surface of the housing. In addition, the display device includes a support portion, a connection portion, and a third display portion. The third display portion is positioned on a third surface of the support portion. The connection portion has a function of connecting with the housing and a function of reversibly changing the relative positions of the support portion and the housing between a first configuration and a second configuration. The first configuration is a configuration in which the support portion covers the first display portion such that the second display portion is visible. The second configuration is a configuration in which the support portion and the housing are opened such that the first display portion, the second display portion, and the third display portion are visible.

In addition, it is preferable that the connection portion be attachable to a second side surface opposite to the first side surface of the housing.

In addition, it is preferable that the first display portion and the second display portion be constituted by one display panel. In addition, it is preferable that the second display portion include a curved portion.

In addition, it is preferable that the housing include a support mechanism. In addition, it is preferable that, in the second configuration, the support mechanism have a function of supporting the support portion such that the first surface and the third surface are at a predetermined angle.

In addition, it is preferable that the support mechanism include a lock mechanism such that the relative positions of the housing and the support portion include a plurality of stable positions.

In addition, it is preferable that the housing include a transmission portion for supplying power and a signal to the connection portion. In addition, in that case, it is preferable that the transmission portion supply the power and the signal from the housing wirelessly.

In addition, it is preferable that the housing have a function of being magnetically attachable to and detachable from the connection portion.

In addition, as another embodiment of the present invention, a system including any of the above display devices and any of the above electronic devices can be constituted.

Effect of the Invention

According to one embodiment of the present invention, a display region of an electronic device can be enlarged. Alternatively, a display region of an electronic device can be protected. Alternatively, a function of selecting the size of a display region of an electronic device depending on its application can be provided. Alternatively, a display device for extending a display region of an electronic device can be provided. Alternatively, a highly portable electronic device can be provided.

BRIEF DESCRIPTION OF THE DRAWINGS

FIGS. 1A1, 1A2, 1A3, 1B1, 1B2, 1C1, and 1C2 A structure example of a system according to an embodiment.

FIGS. 2A1, 2A2, and 2A3 A structure example of a system according to an embodiment.

FIG. 3 A structure example of a system according to an embodiment.

FIGS. 4A1, 4A2, 4B1, and 4B2 A structure example of a system according to an embodiment.

FIGS. 5A1, 5A2, 5B, and 5C A structure example of a system according to an embodiment.

FIGS. 11A1, 11A2, 11B, and 11C A structure example of a system according to an embodiment.

FIGS. 45A and 45B Drawings illustrating an operation of a touch sensor and a pixel according to an embodiment.

MODE FOR CARRYING OUT THE INVENTION

Figure 3:
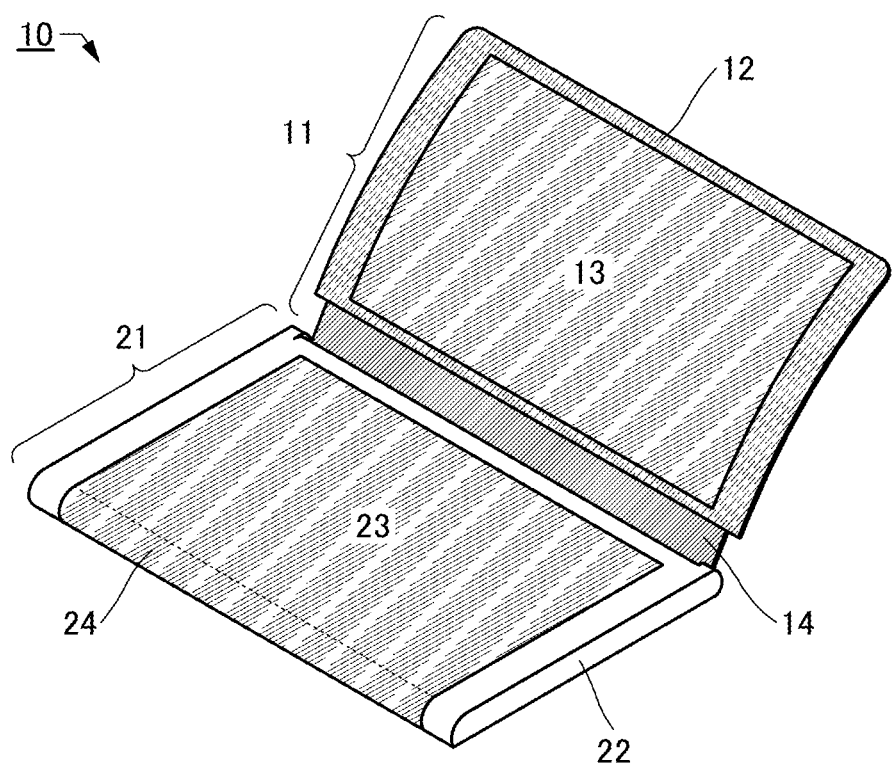

Embodiments will be described in detail with reference to the drawings. Note that the present invention is not limited to the following description. It will be readily appreciated by those skilled in the art that modes and details thereof can be modified in various ways without departing from the spirit and scope of the present invention. Thus, the present invention should not be construed as being limited to what is described in the following embodiments.

Note that in the structures of the invention described below, the same portions or portions having similar functions are denoted by the same reference numerals in different drawings, and a repeated description thereof is omitted. Furthermore, the same hatching pattern is applied to similar functions, and the portions are not especially denoted by reference numerals in some cases.

Note that in each drawing described in this specification, the size, the layer thickness, or the region of each component is exaggerated for clarity in some cases. Therefore, it is not necessarily limited to the illustrated scale.

Note that in this specification and the like, ordinal numbers such as "first" and "second" are used in order to avoid confusion between components and do not limit the number.

Embodiment 1

In this embodiment, structure examples of a display device, an electronic device, and a system of one embodiment of the present invention will be described.

Structure Example 1

FIGS. 1(A1), (B1), and (C1) are perspective schematic views of a system 10 including a display device 11 and an electronic device 21. FIG. 1(A1) illustrates a state where the display device 11 and the electronic device 21 overlap with each other (this state is also referred to as a closed state or a folded state). FIG. 1(B1) illustrates a state where they are unfolded (this state is also referred to as an opened state). FIG. 1(C1) illustrates a state where they are further unfolded (opened) to be substantially parallel to each other.

In addition, FIGS. 1(A2) and (A3) are cross-sectional schematic views corresponding to the section line A1-A2 and the section line A3-A4 in FIG. 1(A1), respectively. In addition, FIG. 1(B2) is a cross-sectional schematic view corresponding to the section line A5-A6 in FIG. 1(B1). In addition, FIG. 1(C2) is a cross-sectional schematic view corresponding to the section line A7-A8 in FIG. 1(C1). Note that the internal structure of a housing 22 is omitted in each cross-sectional schematic view.

The display device 11 includes a support 12, a display portion 13, and a connection portion 14. The electronic device 21 includes the housing 22, a display portion 23, and a display portion 24.

The connection portion 14 connects the support 12 and the housing 22 to each other. In addition, the connection portion 14 has a function of changing the relative positions of the support 12 and the housing 22. This enables the relative positions of the support 12 and the housing 22 to be reversibly changed from a configuration illustrated in FIG. 1(A1) to a configuration illustrated in FIG. 1(C1) through a configuration illustrated in FIG. 1(B1).

For example, the connection portion 14 may be flexible or may have a hinge structure. A structure example of the connection portion 14 having a hinge structure will be described later.

In addition, the connection portion 14 can be attached to the housing 22. Here, the connection portion 14 and the housing 22 may be attached and fixed to each other so that a user cannot detach them, or the connection portion 14 and the housing 22 may be attached to each other so that a user can detach them. For example, a portion of the housing 22 may have a fixing mechanism with which the connection portion 14 can engage, or may have a fixing mechanism with which the housing 22 and the connection portion 14 can be mechanically or magnetically fixed to each other so as to be detachable as described later. In addition, in that case, it is preferable that the connection portion 14 and the housing 22 be electrically connected to each other or be capable of transmitting and receiving power and a signal therebetween.

The display portion 13 is provided along a surface of the support 12. More specifically, the display portion 13 is provided along a surface of the support 12 which is positioned on the electronic device 21 side in a state where the support 12 and the electronic device 21 overlap with each other as illustrated in FIG. 1(A1).

The electronic device 21 includes, inside the housing 22, a battery, a printed board on which a variety of ICs such as an arithmetic unit and a driver circuit are mounted, and the like. In addition, electronic components such as a wireless receiver, a wireless transmitter, a wireless power receiver, and a variety of sensors, e.g., an acceleration sensor, may be incorporated as appropriate into the housing 22, so that the electronic device 21 can function as a portable terminal, a portable image reproducing device, a portable lighting device, or the like. A camera, a speaker, a variety of input/output terminals such as a terminal for power supply and a terminal for signal supply, a variety of sensors such as an optical sensor, an operation button, or the like may also be incorporated into the housing 22. In addition, the support 12 may also include a printed board, an electronic component, a camera, a speaker, a variety of input/output terminals such as a terminal for power supply and a terminal for signal supply, a variety of sensors such as an optical sensor, an operation button, or the like as described above.

The display portion 23 is provided along a surface of the housing 22. In addition, the display portion 24 is provided along a side surface of the housing 22.

An example in which the display portion 23 and the display portion 24 are connected seamlessly is described here. For example, the display portion 23 and the display portion 24 may be formed by curving or bending a portion of one display panel. In FIGS. 1(B1), (C1), and the like, a boundary between the display portion 23 and the display portion 24 is indicated by a broken line.

It is preferable that the display portion 23 perform display along a flat surface. It is also preferable that at least a portion of the display portion 24 perform display along a curved surface.

Here, when the display portion 23 and the display portion 24 are seamlessly continuous, for example, there is a case where the boundary therebetween is unclear. In this specification and the like, when the two display portions are seamlessly continuous, a line connecting points of change in curvature of these surfaces in the direction from the display portion 23 side toward the display portion 24 side is regarded as the boundary between the two display portions. Therefore, when the two display portions are seamlessly continuous, at least a portion of the display portion 24 includes a curved surface.

In the configuration in which the support 12 and the housing 22 overlap with each other (this configuration is also referred to as a closed state) as illustrated in FIG. 1(A1) or the like, the display portion 23 is preferably covered with the support 12. In this way, a portion of the support 12 functions as a protective cover for a surface of the display portion 23 and can prevent the surface of the display portion 23 from being damaged. In addition, the support 12 can prevent a surface of the display portion 13 from being damaged at this time. In addition, in the state illustrated in FIG. 1(A1), the surface of the display portion 23 and the surface of the display portion 13 may be in contact with each other. However, a gap is preferably provided between the surface of the display portion 13 and the surface of the display portion 23 such that these surfaces are not in contact with each other, in which case these surfaces can be prevented from being rubbed together and damaged.

Furthermore, in that case, the display portion 24 is preferably not covered with the support 12. In this way, the display portion 24 is visible to a user even in the state where the support 12 and the housing 22 are closed; thus, the user can see information displayed on the display portion 24. Furthermore, when the display portion 24 includes a touch sensor, an icon or the like displayed on the display portion 24 can be operated.

As the information displayed on the display portion 24, various information such as notification of an incoming e-mail, call, social networking service (SNS), or the like, the subject of an e-mail, an SNS, or the like, the sender of an e-mail, an SNS, or the like, the message, the date, the time, information on playing voice or music, the volume, the temperature, the battery level, the communication status, the reception strength of an antenna, and the status of downloading a file can be displayed. In addition, the display portion 24 may display icons associated with various applications, icons associated with various functions, operation buttons, a slider, or the like. For example, there is an icon associated with a function of adjusting the volume or fast-forwarding, a fast-rewinding, and the like during the playback of voice or music. Alternatively, an icon associated with a function of answering the call or placing the call on hold or a function of awaking the operation invalid state (the lock state) of the electronic device 20 or the system 10, for example, may be displayed.

In addition, in the state where the support 12 and the housing 22 are closed, it is preferable that the display portion 23 and the display portion 13 not perform display. It is preferable that pixels in a portion of the display panel not be driven in the case where the display portion 23 and the display portion 24 include a single display panel. In addition, in the case where a display device including a backlight like a transmissive liquid crystal device is used as the display portion 23 or the display portion 13, it is preferable that the backlight not be driven. Power consumption can be significantly reduced by preventing a portion of the display portion that is not visible to a user from displaying an image (or from operating) when the support 12 and the housing 22 are closed.

In the configuration illustrated in FIG. 1(B1), the display portion 23 can display an image functioning as a keyboard or a touch pad, for example. That is, when a portion of the display portion 23 functions as an input means and the display portion 13 functions as a main display portion (main display), the system 10 can be used as a notebook-type computer or a game machine. Alternatively, when both the display portion 13 and the display portion 23 display text data, the system 10 can be used as a foldable electronic book reader.

In the configuration illustrated in FIG. 1(C1), the display portion 13 can function as an extended display. That is, the display portion 23 and the display portion 13 can display a large image that the electronic device 21 alone cannot display, or can separately display different images. Furthermore, the electronic device 21 and the display device 11 can separately display images associated with different applications to achieve multitasking.

In addition, FIGS. 2(A1) and (A2) illustrate an example of the case where the display device 11 is folded to the side opposite to the display portion 23 side of the housing 22 (hereinafter also referred to as the back side or back surface side). FIG. 2(A1) illustrates the display portion 23 side, and FIG. 2(A2) illustrates the back side of the housing 22. In addition, FIG. 2(A3) illustrates a cross-sectional schematic view corresponding to the section line A9-A10 in FIG. 2(A1).

In such a configuration, display can be performed along two surfaces or three surfaces of the housing 22. For example, when the display portion 23 and the display portion 13 display the same image, a user can show the same image as that the user sees to a person facing the user. Alternatively, when the display portion 23 and the display portion 13 display different images, different images can be presented to a user and a person facing the user, which can be utilized for an application such as an interactive game.

Note that the above usage methods are mere examples, and images or the like that can be displayed on the display portions in each configuration are not limited to those given above. A variety of display for different applications can be performed.

FIG. 3 illustrates an example of the case where the support 12 of the display device 11 is bent. In that case, the display portion 13 of the display device 11 can perform display along the curved surface.

In addition, FIG. 1(A2) and the like illustrate the case where a side surface of the housing 22 on a side to which the connection portion 14 is attached has a convexly curved shape. Furthermore, the connection portion 14 and the housing 22 are attached to each other such that the connection portion 14 curves along the curved surface in the configuration in which the support 12 and the housing 22 overlap with each other. This structure can prevent the relative positions of the support 12 and the housing 22 from being easily changed when the support 12 and the housing 22 overlap with each other. In addition, when the support 12 and the housing 22 are closed, two side surfaces of the system 10, i.e., a side surface on the display portion 24 side and a side surface on the connection portion 14 side, may be similarly curved and have substantially symmetrical shapes as illustrated in FIGS. 1(A2) and (A3). In this way, the system 10 with the display device 11 attached thereto can have a plainer (or simpler) design. In addition, it is preferable that a surface of the housing 22 have a recessed shape into which the connection portion 14 fits so as not to generate a level difference between the surface of the connection portion 14 and the surface of the housing 22 in the state where the support 12 and the housing 22 overlap with each other.

In addition, the side surface of the housing 22 on the side to which the connection portion 14 is attached may have a flat shape as illustrated in FIGS. 4(A1), (A2), (B1), and (B2). In that case, the connection portion 14 includes a portion that is bent along the surface of the housing 22 in the configuration in which the housing 22 and the support 12 overlap with each other as illustrated in FIGS. 4(A1) and (A2). In addition, a connecting portion between the housing 22 and the connection portion 14 (here, an end portion of the connection portion 14) may be positioned on the display portion 23 side with respect to the back surface of the housing 22; in this way, a design can be made in which the height of the display portion 23 and the height of the display portion 13 are substantially equal to each other in the state where the housing 22 and the support 12 are opened as illustrated in FIG. 4(B2).

Here, it is preferable that modules including a touch sensor be provided in the display panels in the display portion 13, the display portion 23, and the display portion 24 so as to overlap with the display surface sides of the display panels. In addition, at least a portion of the module including a touch sensor in the display portion 24 or the display portion 13 is preferably flexible and bendable along the display panel. At this time, the module including a touch sensor may be bonded to the display panel with an adhesive or the like, or a polarizing plate or a cushion material (e.g., a separator) may be provided therebetween. In addition, the thickness of the module including a touch sensor is preferably smaller than or equal to that of the display panel.

Alternatively, the display panels in the display portion 13, the display portion 23, and the display portion 24 may function as a touch panel. For example, the display panel may be an on-cell touch panel or an in-cell touch panel. In the case of using the structure of the on-cell or in-cell touch panel, the thickness of the display panel can be small even when the display panel also serves as a touch panel.

In addition, the display portion 13 does not necessarily have a function of a touch sensor. Even in that case, the display device 11 can function as an extended display of the electronic device 21 to improve display browsability. In addition, the display portion 13 preferably has a function of a touch sensor because a region that a user can operate can be enlarged and therefore a more user-friendly application can be incorporated.

As materials that can be used for the housing 22, plastic, a metal such as aluminum, an alloy such as stainless steel or a titanium alloy, rubber such as silicone rubber, and the like can be used.

In the case where the connection portion 14 is flexible, a material that partly or entirely changes its shape elastically can be favorably used. For example, the whole connection portion 14 may be elastic, or the connection portion 14 may contain an elastic material at least in a bending portion.

For example, a material with a Young's modulus lower than that of the housing 22 can be used for the connection portion 14. In addition, even in the case where a material with a Young's modulus higher than or comparable to that of the housing 22 is used, the material can be used for the connection portion 14 by making the connection portion 14 thinner than the housing 22. As materials that can be used to form the connection portion 14, plastic, rubber, a metal, an alloy, and the like can be used. For example, a material such as a silicone resin or a gel may also be used.

In the case where a hinge is used as the connection portion 14, a rigid material is preferably used for that part. For example, plastic, a metal such as aluminum, an alloy such as stainless steel or a titanium alloy, or the like is preferably used.

It is preferable to use a highly rigid material for the support 12 because a function of a protective cover can be enhanced. It is also preferable to use an elastic material for the support 12 because an impact can be relieved when the system 10 is dropped or the system 10 comes in contact with a hard object, for example. In addition, when the support 12 and the display panel used for the display portion 13 are each flexible, the display portion 13 can perform display along a curved surface. A material that can be used for the support 12 can be selected as appropriate from materials that can be used for the housing 22 or the connection portion 14.

A variety of display panels can be used as the display portion 13, the display portion 23, and the display portion 24.

In addition, in the case where the display portion 13 and the support 12 are used in a bent state, a flexible display panel is preferably used in the display portion 13. Furthermore, even in the case where the display portion 13 and the support 12 are not used in a bent state, the display device 11 can include a flexible display panel to reduce the weight of the display device 11. Accordingly, an increase in total weight of the system 10 can be suppressed even when the display device 11 is used.

Here, in the case where the display portion 24 performs display along a curved surface, a flexible display panel is preferably used in the display portion 24. In addition, a structure is preferable in which a single flexible display panel be used in the display portion 23 and the display portion 24 and be partly curved in the display portion 24. Accordingly, the number of components of the electronic device 21 can be reduced, or the weight of the electronic device 21 can be decreased with the use of the flexible display panel.

In addition, as display panels or touch panels used in the display portion 23, the display portion 24, and the display portion 13, the same display elements or different display elements may be used. For example, a touch panel including a liquid crystal element may be used in the display portion 23 and the display portion 24, and a touch panel including an organic EL element may be used in the display portion 13. Alternatively, a touch panel including a liquid crystal element may be used in the display portion 23, and a touch panel including an organic EL element may be used in the display portion 24 and the display portion 13.

A display element which can be used in the display portion 13, the display portion 23, and the display portion 24, a display device or a display panel, which is a device including a display element, a light-emitting device, and a light-emitting device, which is a device including a light-emitting element, can use various types or can include various elements.

For example, a display device including a display element such as a MEMS (Micro Electro Mechanical System) element or an electron-emissive element can be used. As a MEMS display element, a MEMS shutter display element, an optical interference type MEMS display element, and the like are given. A carbon nanotube may be used for the electron-emissive element. Alternatively, electronic paper may be used. As the electronic paper, an element using a microcapsule method, an electrophoretic method, an electrowetting method, an Electronic Liquid Powder (registered trademark) method, or the like can be used.

For example, in this specification and the like, an active matrix method in which an active element is included in a pixel or a passive matrix method in which an active element is not included in a pixel can be used.

In an active matrix method, as an active element (an active element or a non-linear element), not only a transistor but also various active elements (active elements or non-linear elements) can be used. For example, an MIM (Metal Insulator Metal), a TFD (Thin Film Diode), or the like can also be used. Since such an element has few numbers of manufacturing steps, manufacturing cost can be reduced or yield can be improved. Alternatively, since the size of such an element is small, the aperture ratio can be improved, so that power consumption can be reduced or higher luminance can be achieved.

As a method other than the active matrix method, the passive matrix type in which an active element (an active element or a non-linear element) is not used can also be used. Since an active element (an active element or a non-linear element) is not used, the manufacturing process can be simplified, whereby manufacturing cost can be reduced or yield can be improved. Alternatively, since an active element (an active element or a non-linear element) is not used, the aperture ratio can be improved, so that power consumption can be reduced or higher luminance can be achieved, for example.

The above is the description of Structure Example 1.

Structure Example 2

A structure example whose structure is partly different from that of Structure Example 1 described above will be described below. Note that the description of the portions already described is omitted and different portions are described.

FIGS. 5(A1), (A2), (B), and (C) are perspective schematic views of a system 10 described as an example below. The system 10 illustrated in each drawing of FIG. 5 is different from that in Structure Example 1 mainly in including a support mechanism 25.

FIGS. 5(A1) and (A2) illustrate a state where the housing 22 and the support 12 are closed. FIG. 5(A1) illustrates the support 12 side, and FIG. 5(A2) illustrates the back surface side of the housing 22.

The housing 22 includes the support mechanism 25 in part thereof. As illustrated in FIGS. 5(A1, A2), the support mechanism 25 is preferably stored in the housing 22 when not in use. For example, a portion of a surface of the housing 22 and a portion of a surface of the support mechanism 25 are made to be positioned on the same plane when the support mechanism 25 is stored in the housing 22. In this way, the electronic device 21 can have a functionally excellent design and can be put in a bag or a pocket without getting stuck. In addition, when the housing 22 and the support mechanism 25 are integrated as described above, the support mechanism 25 does not need to be carried around separately from the electronic device 21, leading to improved convenience.

FIG. 5(B) illustrates a state where the support mechanism 25 is pulled out from the housing 22. In addition, FIG. 5(C) illustrates a state where the support 12 is further opened.

The support mechanism 25 has a function of supporting a portion of a surface of the support 12 on the side opposite to the display portion 13. In other words, the support mechanism 25 has a function of supporting the support 12 such that a surface of the display portion 23 of the electronic device 21 and a surface of the display portion 13 of the display device 11 are at a predetermined angle. The support mechanism 25 described above can stabilize the position of the support 12 as compared with the configuration illustrated in FIG. 1(B1) or FIG. 3, for example. In addition, even when the connection portion 14 does not include a hinge mechanism, for example, the relative positions of the housing 22 and the support 12 can be fixed.

Here, the support mechanism 25 preferably includes a mechanism capable of locking the relative positions of the support 12 and the housing 22 at one or more stable positions (this mechanism is also referred to as a lock mechanism) and a mechanism capable of releasing the lock. It is particularly preferable that the lock mechanism have two or more stable positions. With such a mechanism, a user can adjust the angle according to his or her preference.

Figure 6:
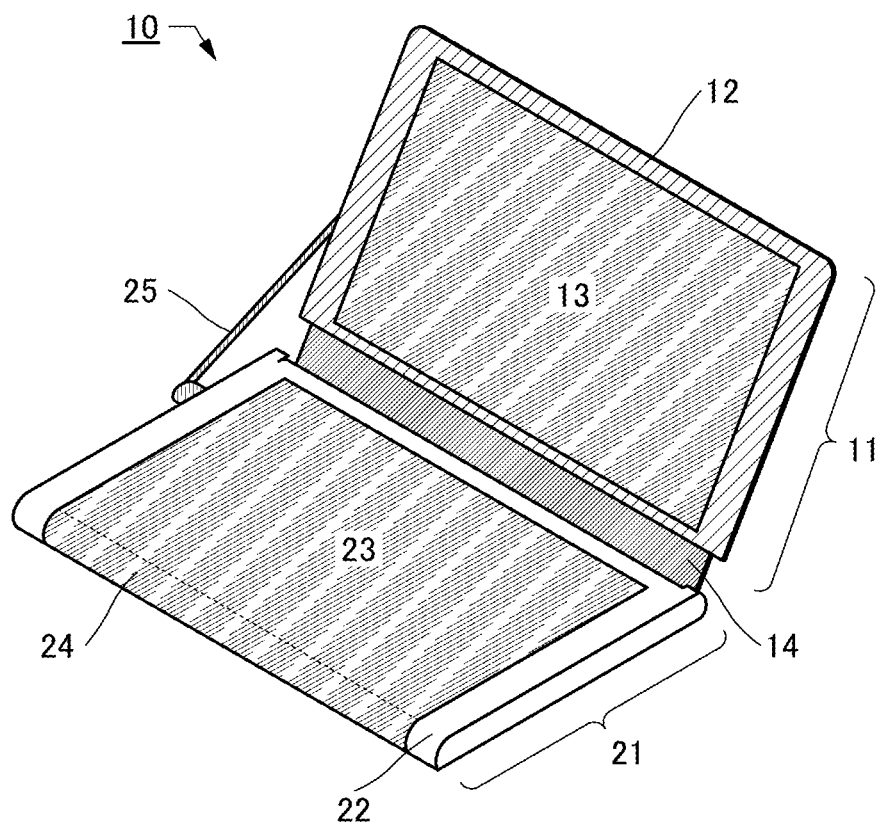
FIG. 6 A structure example of a system according to an embodiment.

Note that the structure of the support mechanism 25 is not particularly limited to the above as long as the mechanism can support the support 12. For example, FIG. 6 illustrates an example of the structure of the support mechanism 25 capable of supporting one end portion of the support 12. With a mechanism of the support mechanism 25 to rotate with respect to the housing 22, the support 12 can be supported in a state where the support 12 and the housing 22 are opened at a given angle.

The above is the description of Structure Example 2.

Structure Example 3

A structure example whose structure is partly different from those of the above structure examples will be described below. Note that the description of the portions already described is omitted and different portions are described.

Figure 7A:
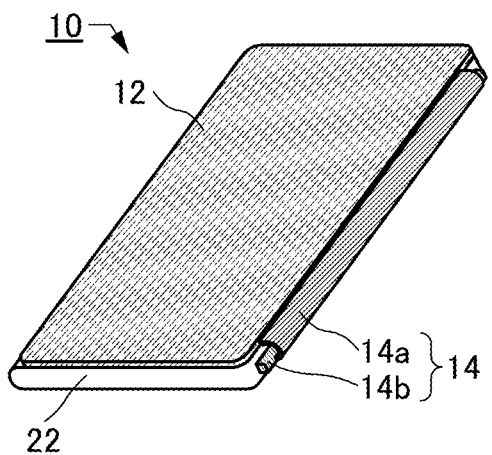
FIGS. 7A to 7C A structure example of a system according to an embodiment.

FIGS. 7(A), (B), and (C) are perspective schematic views of a system 10 described as an example below. The system 10 illustrated in each drawing of FIG. 7 is different from those described above mainly in a structure of the connection portion 14.

Figure 7B:
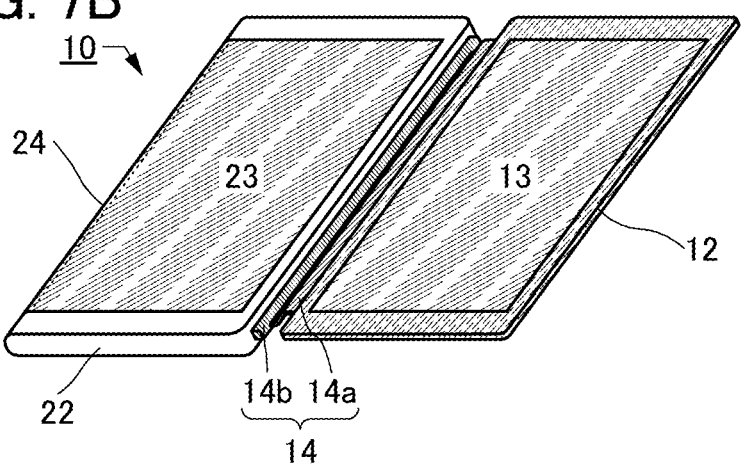
Figure 7C:
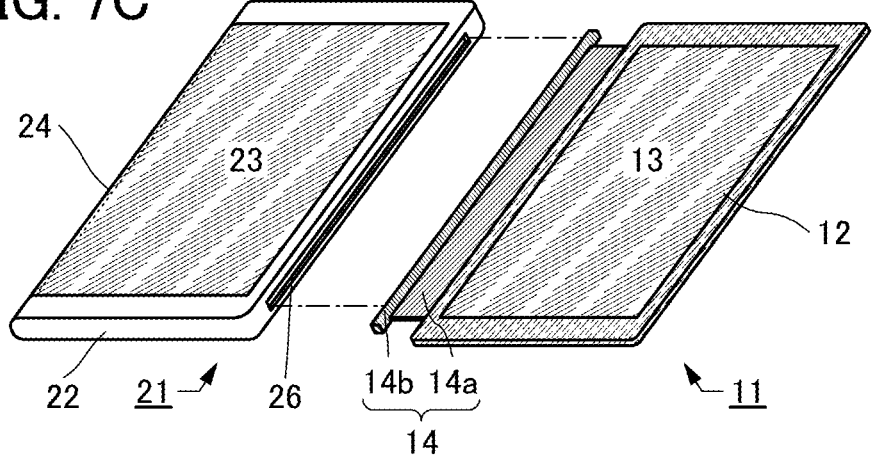

FIG. 7(A) illustrates a state where the housing 22 and the support 12 are closed. FIG. 7(B) illustrates a state where they are opened. In addition, FIG. 7(C) illustrates a state where the electronic device 21 and the display device 11 are separated from each other.

The connection portion 14 of the display device 11 illustrated each drawing of in FIG. 7 includes a movable portion 14a and a detachment portion 14b.

The movable portion 14a has a function of connecting the detachment portion 14b and the support 12 to each other.

The movable portion 14a also has a function of bending in a manner similar to that of the connection portion 14 in the above structural example.

The housing 22 includes an engagement portion 26 which engages with the detachment portion 14b. Accordingly, the display device 11 can be detachably attached to the electronic device 21. The engagement portion 26 and the detachment portion 14b may include a mechanism capable of locking each other mechanically so that these components attached to each other are not easily detached from each other.

In addition, the engagement portion 26 preferably includes a terminal for transmitting power or a signal from the housing 22 to the display device 11. In addition, the detachment portion 14b preferably includes a terminal for receiving the signal. Moreover, the terminal of the engagement portion 26 and the terminal of the detachment portion 14b can be provided so as to be in contact with each other when the display device 11 is attached to the electronic device 21.

Alternatively, the housing 22 may include an antenna for transmitting the power or the signal in a position close to the engagement portion 26, and the detachment portion 14b may include an antenna for receiving the power or the signal, in order to wirelessly supply the power or the signal from the electronic device 21 to the display device 11.

Here, in the housing 22, the terminal for transmitting power or a signal or the antenna and a circuit for wirelessly transmitting them can be referred to as a transmission portion. In addition, the terminal provided in the connection portion 14 for receiving power or a signal or the antenna and a circuit for wirelessly receiving them can be referred to as a reception portion.

Figure 8:
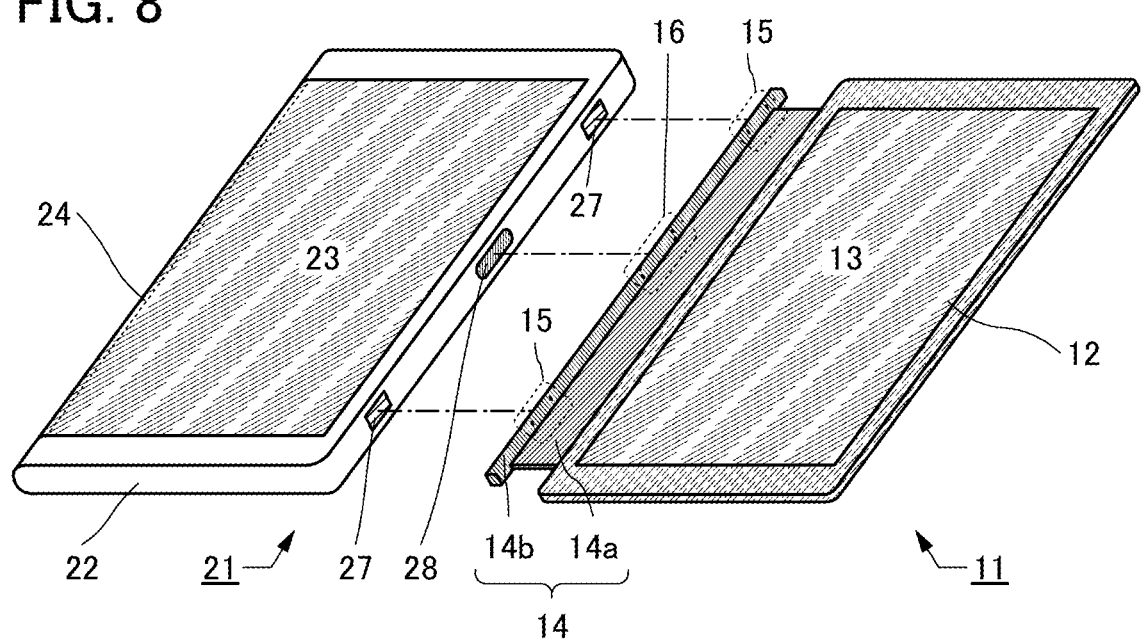
FIG. 8 A structure example of a system according to an embodiment.

In addition, FIG. 8 illustrates a configuration in which the housing 22 includes a connection mechanism 27 and a terminal 28 instead of the engagement portion 26. Furthermore, the detachment portion 14b includes a connection mechanism 15 and a terminal 16.

It is preferable here that the connection mechanism 27 and the connection mechanism 15 be magnetically connectable to each other. For example, a magnet or the like may be provided in one of the connection mechanism 27 and the connection mechanism 15, and a magnetic metal or a soft magnetic material that can be magnetized by the magnetic body can be provided in the other. Alternatively, an electromagnet may be used.

In addition, the terminal 28 and the terminal 16 are electrically connected to each other when the detachment portion 14b and the housing 22 are connected to each other, and through these terminals, power or a signal can be transmitted and received between the housing 22 and the display device 11. In addition, the terminal 28 and the terminal 16 may have a structure in which power or a signal can be transmitted and received through the above-described antennas.

The above is the description of Structure Example 3.

Structure Example 4

A structure example whose structure is partly different from those of the above structure examples will be described below. Note that the description of the portions already described is omitted and different portions are described.

Figure 9A:
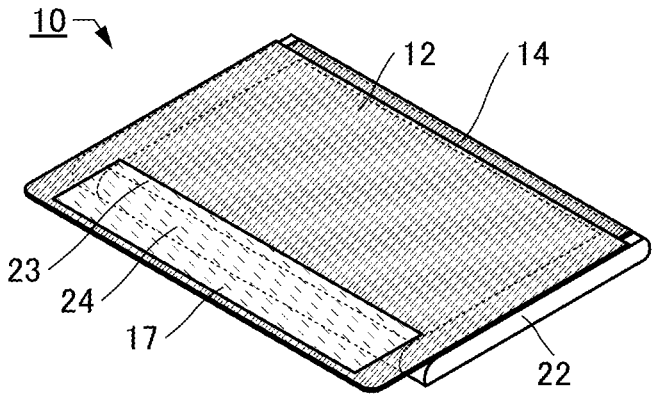
FIGS. 9A to 9C A structure example of a system according to an embodiment.

FIGS. 9(A), (B), and (C) are perspective schematic views of a system 10 described as an example below. The system 10 illustrated in each drawing of FIG. 9 is different from those described above mainly in a structure of the support 12.

The support 12 includes a window portion 17 which transmits visible light. The window portion 17 is provided on the side opposite to the connection portion 14 with the display portion 13 therebetween.

Figure 9B:
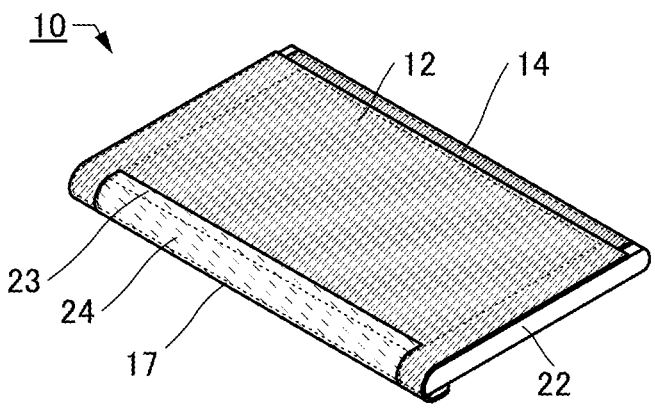

A portion provided with the window portion 17 in the support 12 is flexible. Accordingly, in the state where the housing 22 and the support 12 are closed, a side surface of the housing 22 can be covered with the window portion 17 as illustrated in FIG. 9(B), from the state illustrated in FIG. 9(A). Therefore, the window portion 17 can function as a protective cover for protecting a surface of the display portion 24 provided at the side surface of the housing 22.

Since the window portion 17 transmits visible light, a user can see the display portion 24 even in the state where the side surface of the housing 22 is covered with the window portion 17 as illustrated in FIG. 9(B). In addition, in the case where the display portion 24 has a function of a touch panel, a user can operate the display portion 24 through the window portion 17.

A material of the window portion 17 is not particularly limited as long as the material transmits visible light and is flexible. For example, a resin, glass that is thin enough to have flexibility, or the like can be used. In the case of using a resin, a surface thereof is preferably subjected to hard-coating treatment or the like because the surface can be prevented from being damaged easily.

Figure 9C:
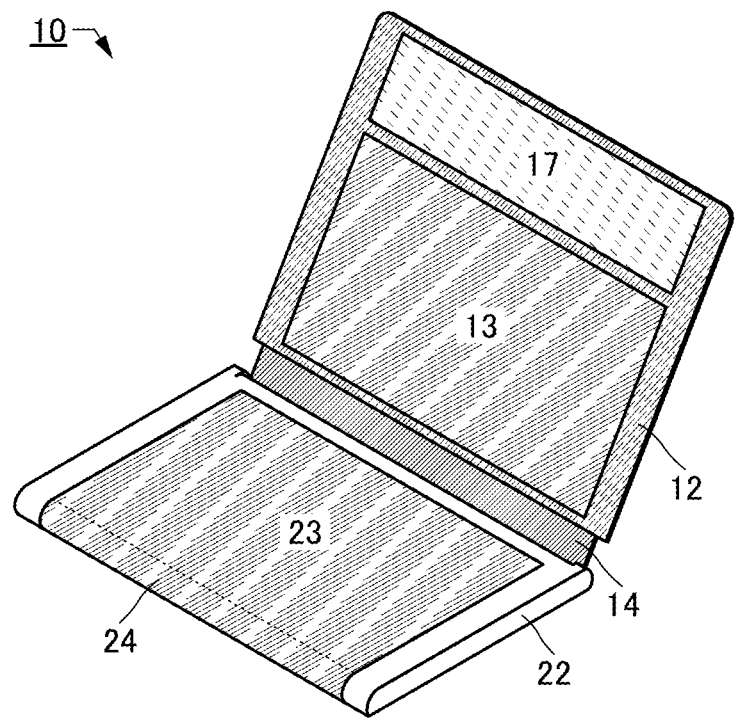

In addition, a light-transmitting display panel can also be used in the window portion 17. For example, a display panel having a see-through function with a light-transmitting material used for a wiring of a pixel can be used. This enables the window portion 17 to be used as a display portion in a state where the housing 22 and the support 12 are opened as illustrated in FIG. 9(C), and thus enables a display region to be enlarged. In addition, the window portion 17 may have a function of a touch sensor.

In addition, the window portion 17 can protect the surface of the display portion 24 by being bent along the display portion 24 also in the case where the support 12 is located on the back surface side of the housing 22.

Figure 10A:
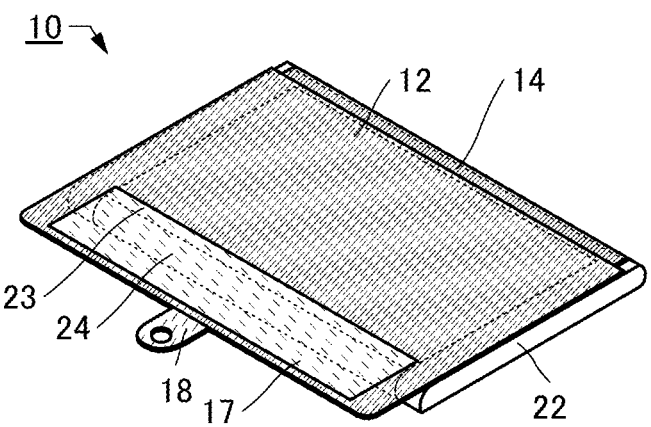
FIGS. 10A and 10B A structure example of a system according to an embodiment.
Figure 10B:
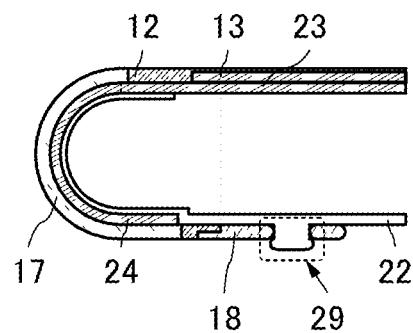

FIGS. 10(A) and (B) illustrate a structure including a fastener 18 on the side of the support 12 which is opposite to the connection portion 14. FIG. 10(B) is a cross-sectional schematic view in a state where one end of the support 12 is fixed to the housing 22 with the fastener 18.

The fastener 18 has, for example, an opening as illustrated in FIG. 10(A). In addition, a projection 29 engaging with the opening of the fastener 18 is provided on the back surface side of the housing 22 as illustrated in FIG. 10(B). In this manner, the fastener can fix the support 12 and the housing 22 in a closed state.

Note that the structure of the fastener 18 is not limited to this example, and for example, the support 12 and the housing 22 may be magnetically fastened to each other. In that case, the fastener 18 which projects from the support 12 as illustrated in FIG. 10(A) may be provided, or overlapping portions of the support 12 and the housing 22 may be magnetically fixed to each other so as to be detachable.

The above is the description of Structure Example 4.

Structure Example 5

A structure example whose structure is partly different from those of the above structure examples will be described below. Note that the description of the portions already described is omitted and different portions are described.

FIGS. 11(A1), (A2), (B), and (C) are perspective schematic views of a system 10 described as an example below. The system 10 illustrated in each drawing of FIG. 11 is different from those described above mainly in a structure of the connection portion 14.

The connection portion 14 includes a hinge 31 and an immovable portion 32.

The immovable portion 32 has a function of connecting the hinge 31 and the support 12 to each other. In the case where a flexible material is used for the support 12, a material that is more rigid than the support 12 is preferably used for the immovable portion 32. In addition, in the case where the support 12 has rigidity, a portion of the support 12 may function as the immovable portion 32.

FIG. 11(A2) is an enlarged view of a region surrounded by a dashed dotted line in FIG. 11(A1). In FIG. 11(A2), the support 12 and the housing 22 are illustrated as being transparent.

The hinge 31 includes a first portion 31a and a second portion 31b. The first portion 31a and the housing 22 are attached to each other so as to be rotatable on a rotation axis 36. The first portion 31a and the second portion 31b are attached to each other so as to be rotatable on a rotation axis 37. The second portion 31b and the immovable portion 32 are attached to each other so as to be rotatable on a rotation axis 38.

Here, the rotation axis 36 and the rotation axis 37 are preferably parallel to each other. In addition, the rotation axis 38 and the rotation axis 37 are preferably perpendicular to each other.

Such a structure including the hinge 31 with two or more rotation axes as the connection portion 14 can improve the degree of freedom in terms of the relative positions of the housing 22 and the display device 11.

FIG. 11(B) illustrates an example in which the support 12 is rotated with respect to the housing 22 on the rotation axis 37 from the state illustrated in FIG. 11(A1). The hinge 31 allows a reversible change in shape from the state in which the housing 22 and the support 12 are closed to the state in which they are opened.

In addition, FIG. 11(C) illustrates an example in which the support 12 is rotated on the rotation axis 38 from the state illustrated in FIG. 11(B). In this manner, the hinge 31 enables the support 12 to be rotated not only in a folding direction but also in a direction crossing the folding direction, and enables the orientation of the support 12 to be adjusted according to user's preference.

Figure 12A:
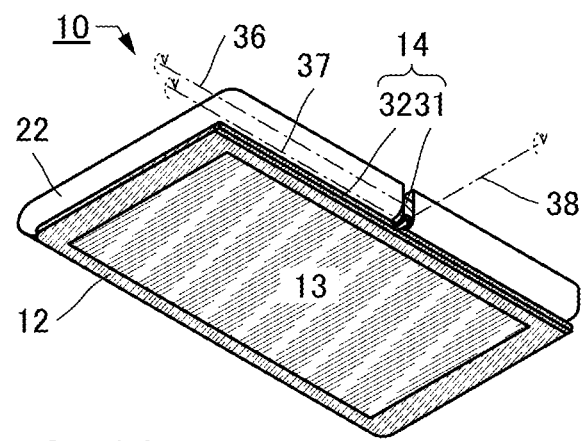
FIGS. 12A and 12B A structure example of a system according to an embodiment.

In addition, FIG. 12(A) illustrates a state where the support 12 is rotated on the rotation axis 36 and the rotation axis 37 from the state illustrated in FIG. 11(B) and the support 12 is positioned on the back surface side of the housing 22.

Figure 12B:
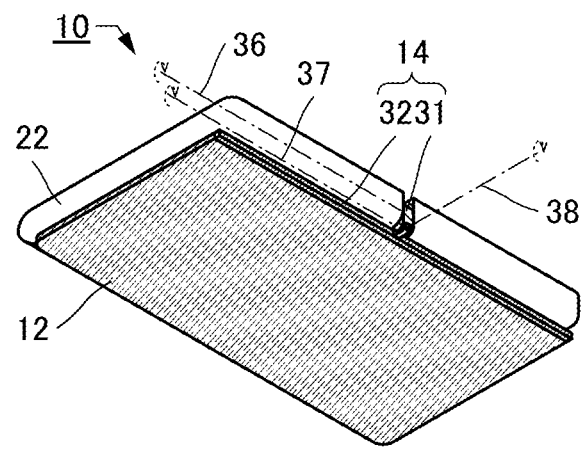

In addition, FIG. 12(B) illustrates a state where the support 12 is rotated on the rotation axis 38 and is thereby positioned such that the display portion 13 of the support 12 and the back surface of the housing 22 face each other. In that case, the display portion 13 can be protected by the support 12 even in the case where the support is positioned on the back surface side of the housing 22.

Here, the connection portion 14 including the hinge 31 and the immovable portion 32 is preferably configured to enable power or a signal to be transmitted and received between the electronic device 21 and the display device 11. For example, this can be achieved by providing a wiring or the like inside the hinge 31. Alternatively, wireless power or signal transmission and reception may be achieved by providing an antenna in the housing 22 and providing an antenna in the immovable portion 32 or the support 12.

Note that the hinge 31 and the immovable portion 32 are described as part of the display device 11 in the system 10 described here as an example, but can also be regarded as part of the electronic device 21. Alternatively, the system 10 can be regarded as including the display device 11 that includes the support 12, the electronic device 21 that includes the housing 22, and a connection device that includes the hinge 31.

The above is the description of Structure Example 5.

Modification Example

Modification examples in which the structure of the electronic device 21 is partly different will be described below.

In each of the above-described structure examples, the side surface of the housing 22 of the electronic device 21 has a convexly curved surface and the display portion 24 is provided along the convexly curved surface and also on the back surface side of the housing 22. The structure of the display portion 24 is not limited thereto, and the display portion 24 may be provided along a flat surface. Furthermore, the display portion 24 is not necessarily provided also on the back surface side of the housing 22, and may have an end portion at a portion of the side surface of the housing 22.

Figure 13A:
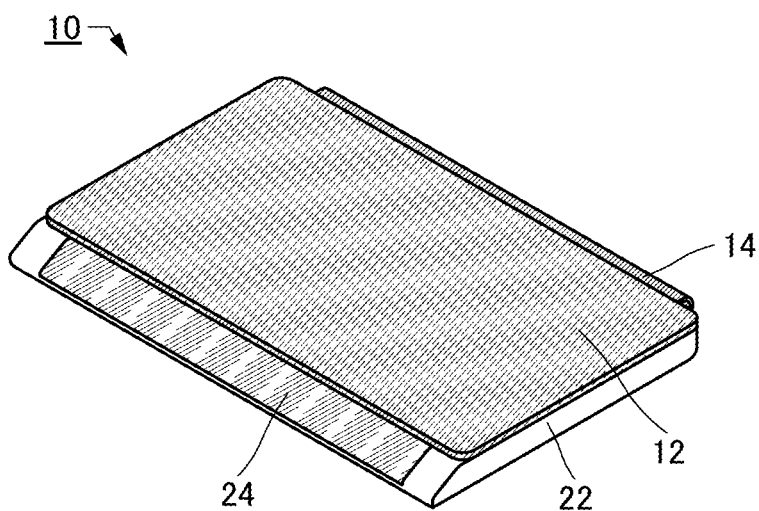
FIGS. 13A and 13B A structure example of a system according to an embodiment.

FIGS. 13(A) and (B) illustrate an example of the case where a portion of the housing 22 in which the display portion 24 is provided has a flat surface. In addition, the case where a plane parallel to the display portion 23 and a plane parallel to a portion of the display portion 24 are not parallel to each other is illustrated. In addition, the display portion 23 and the display portion 24 are connected at the boundary therebetween, and the display portion 23 and the display portion 24 can perform continuous display.

Figure 14A:
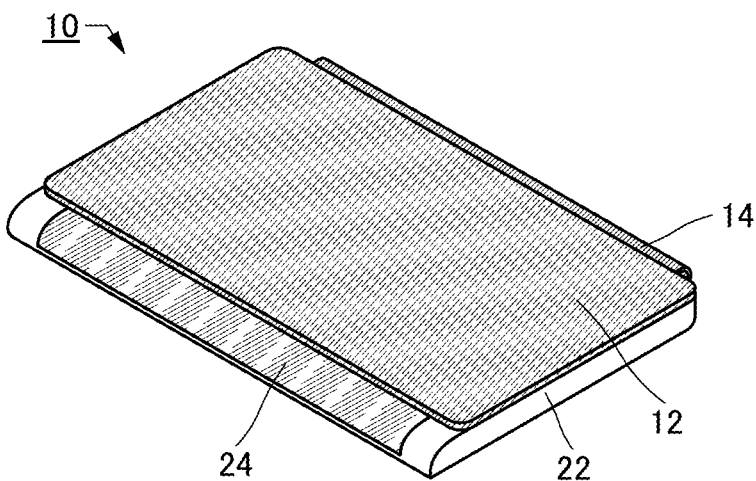
FIGS. 14A and 14B A structure example of a system according to an embodiment.
Figure 14B:
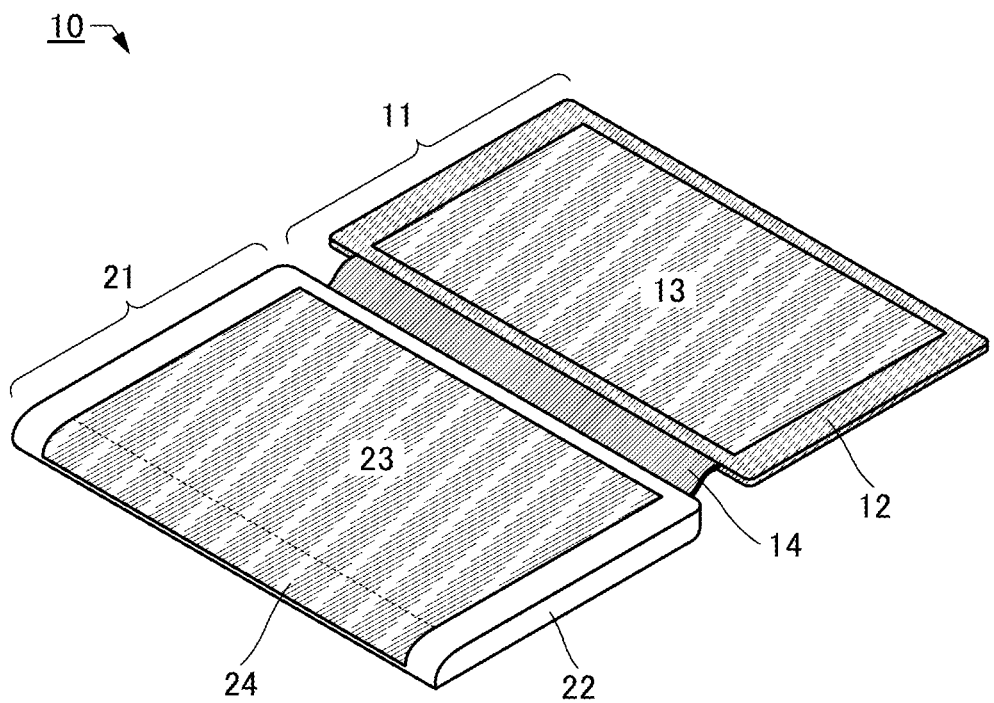

FIGS. 14(A) and (B) illustrate an example in which an end portion of the display portion 24 is positioned at a portion of the side surface of the housing 22 without reaching the back surface of the housing 22. Here, in the example illustrated in FIG. 14, the display portion 24 can perform display along a curved surface.

In addition, in the above-described example, the display portion 23 and the display portion 24 are seamlessly continuous. However, these display portions are not necessarily continuous, and a non-display portion may be provided between the two display portions.

Figure 15A:
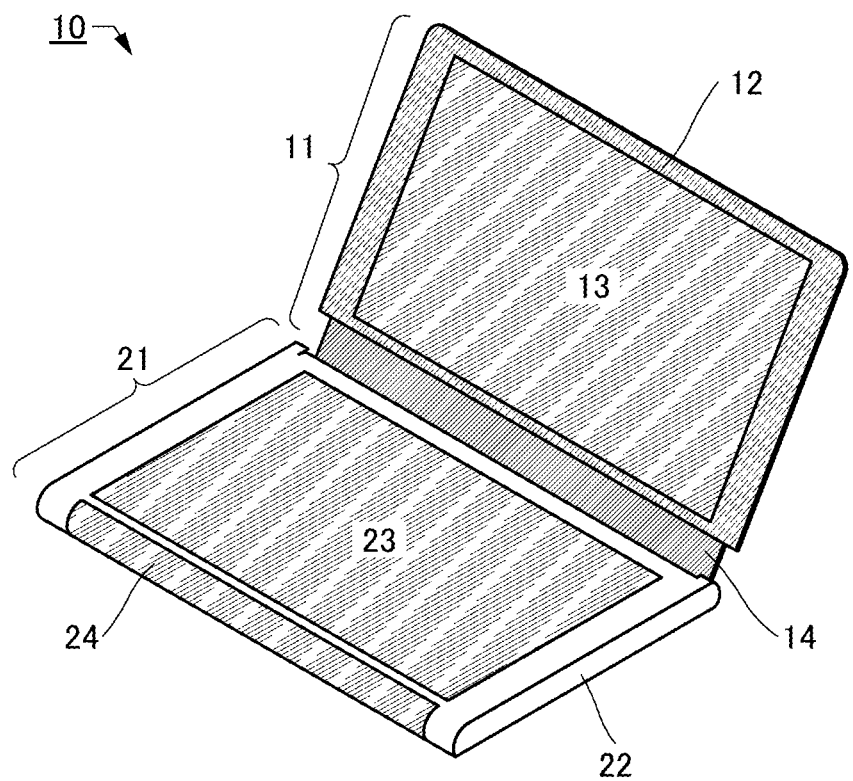
FIGS. 15A and 15B A structure example of a system according to an embodiment.

FIG. 15(A) illustrates an example of the structure illustrated in each drawing of FIG. 1 in the case where the display portion 23 and the display portion 24 are not continuous. Here, the display portion 23 and the display portion 24 may include different display panels. For example, a display panel having low flexibility or no flexibility can be used in the display portion 23, and a display panel having higher flexibility than the display panel used in the display portion 23 can be used in the display portion 24.

Figure 13B:
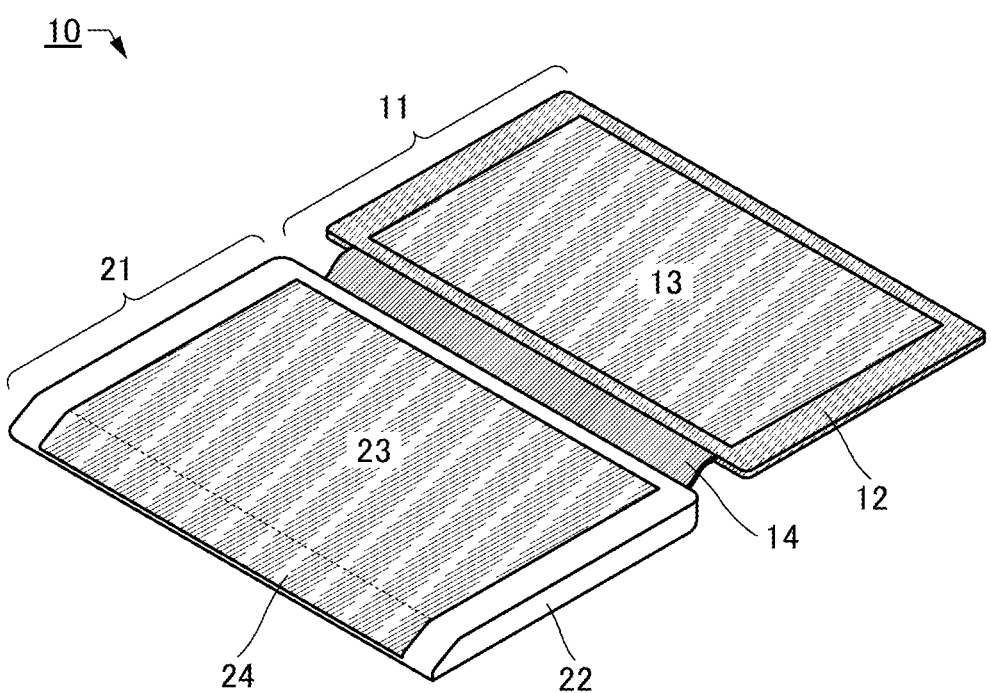
Figure 15B:
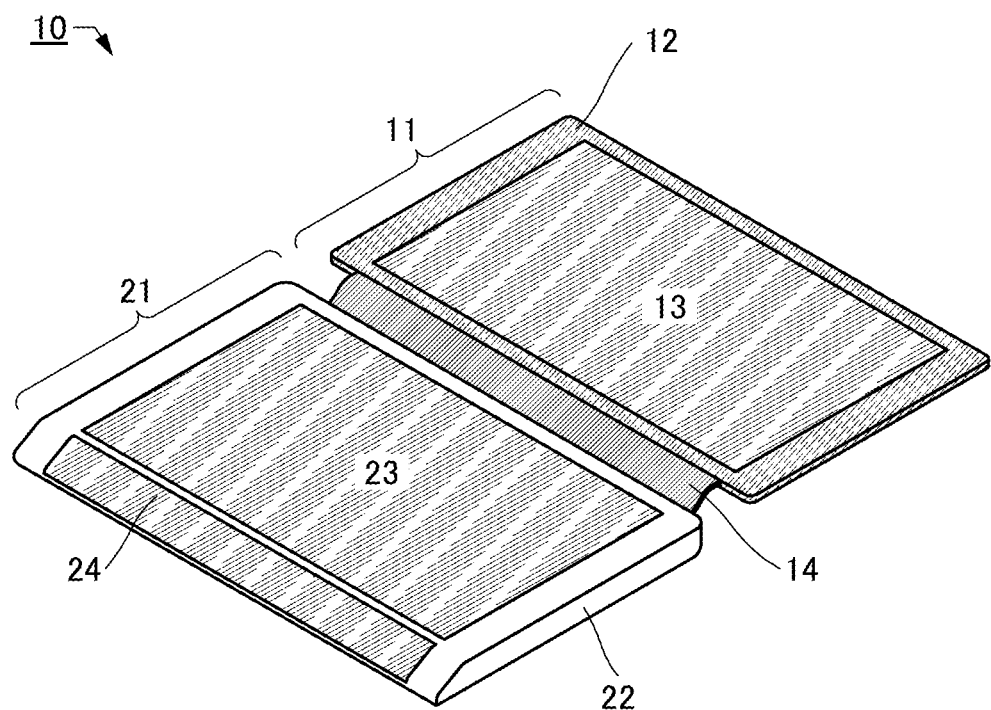

In addition, FIG. 15(B) illustrates an example of the structure illustrated in FIG. 13 in the case where the display portion 23 and the display portion 24 are not continuous. In the structure illustrated in FIG. 15(B), the display portion 23 and the display portion 24 can each be a display portion which performs display along a flat surface. In that case, a display panel having low flexibility or no flexibility can be used in each of the display portion 23 and the display portion 24.

In addition, the display portion 24 can be variously configured as long as it covers a portion of the side surface of the housing 22.

Figure 16A:
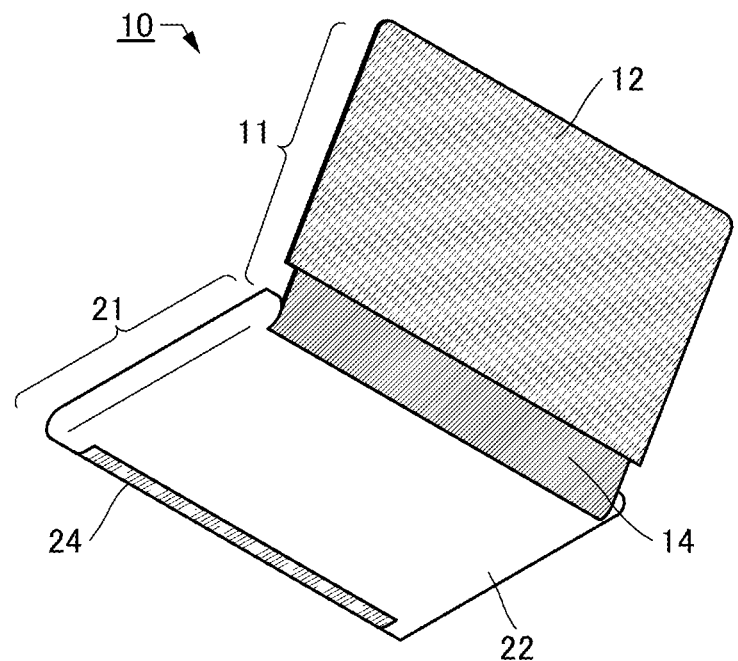
FIGS. 16A and 16B A structure example of a system according to an embodiment.
Figure 16B:
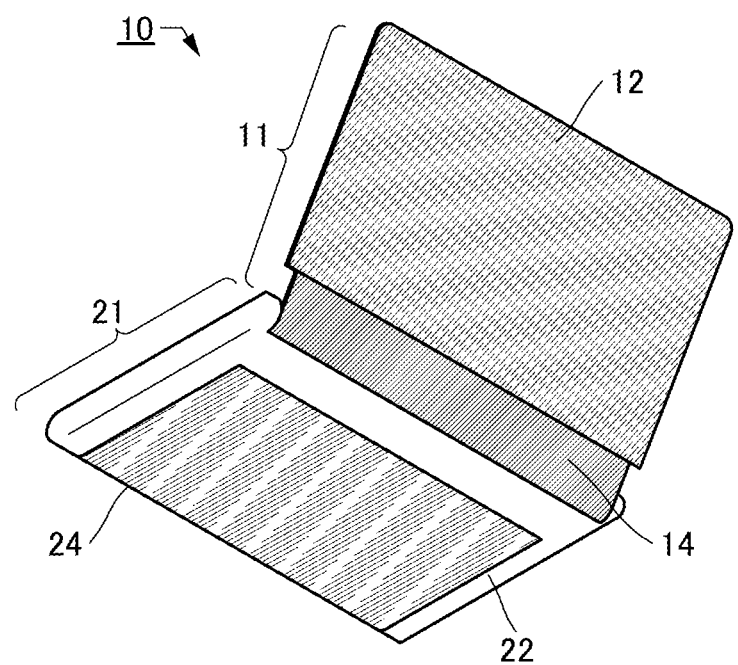

FIG. 16(A) is a perspective view of the configuration illustrated in FIG. 1(B1) which is seen from the back surface side of the housing 22. As illustrated, the display portion 24 can be provided so as to reach a portion of the back surface of the housing 22. In addition, FIG. 16(B) illustrates an example of the case where the area of a portion of the back surface of the housing 22 covered with the display portion 24 is large. FIG. 16(B) illustrates an example in which an end portion of the display portion 24 is located closer to the connection portion 14 than the middle of the back surface of the housing 22.

Figure 17A:
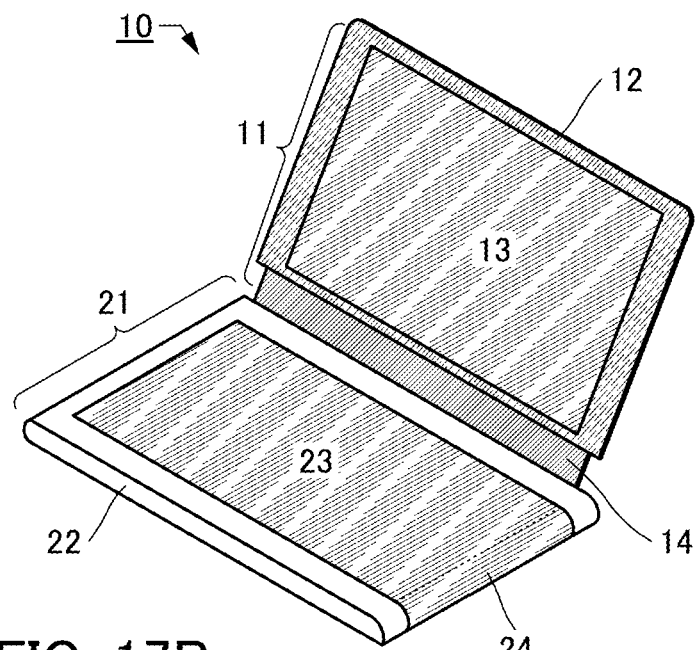
FIGS. 17A and 17B A structure example of a system according to an embodiment.
Figure 17B:
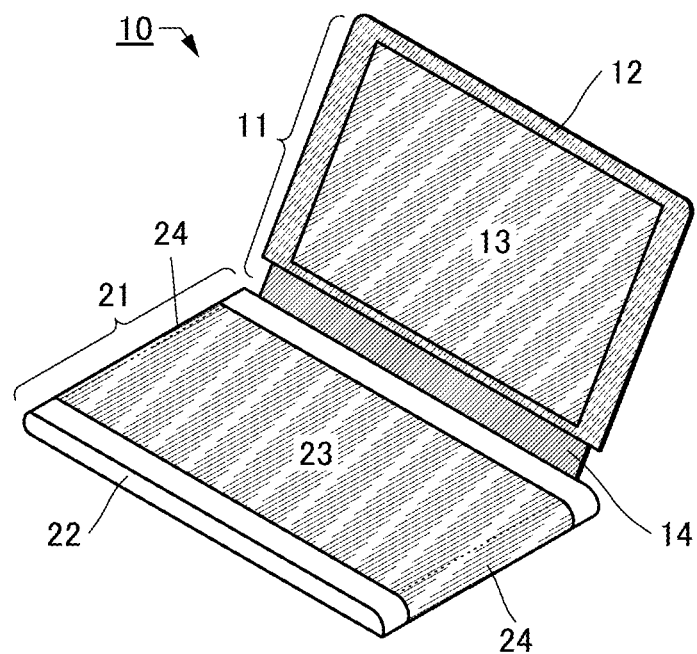

In addition, although the display portion 24 is provided along the side surface in the direction of a long side of the housing 22 in the above-described examples, the display portion 24 may be provided along a side surface in the direction of a short side of the housing 22 as illustrated in FIG. 17(A). Furthermore, the display portion 24 may be provided along two or more side surfaces of the housing 22 as illustrated in FIG. 17(B).

Figure 18A:
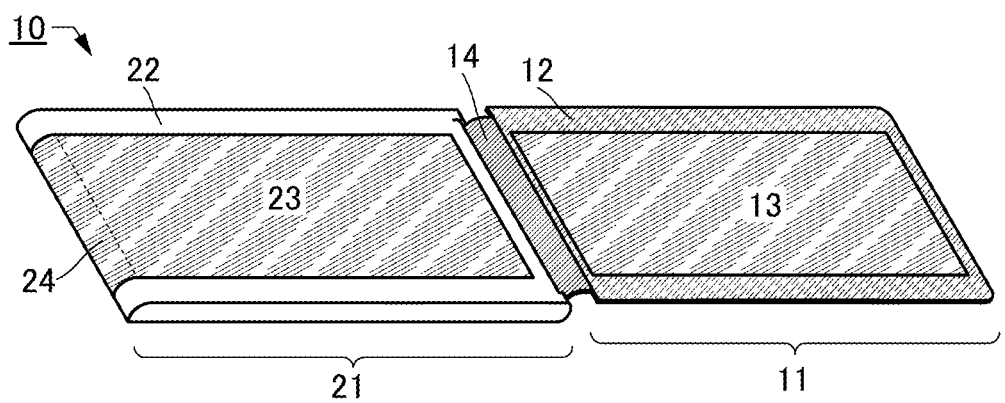
FIGS. 18A and 18B A structure example of a system according to an embodiment.
Figure 18B:
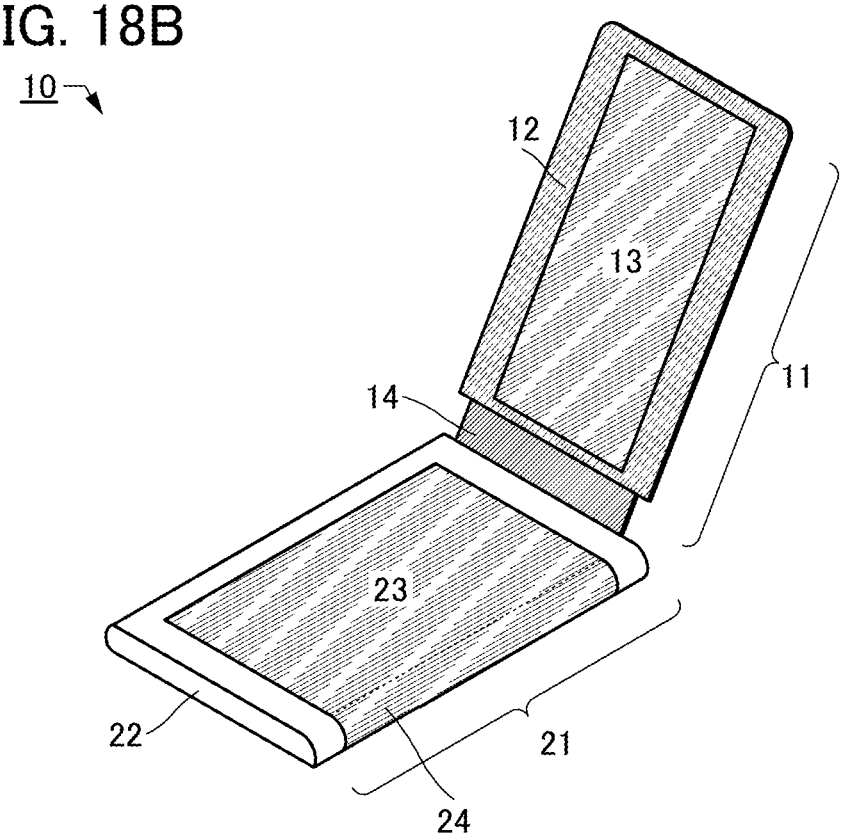

In addition, although the connection portion 14 of the display device 11 is attached in the direction of a long side of the housing 22 in the above-described examples, the position at which the connection portion 14 is attached is not limited. For example, the connection portion 14 may be attached to a side surface in the direction of a short side of the housing 22 as illustrated in FIGS. 18(A) and (B). Here, FIG. 18(A) illustrates an example in which the display portion 24 is provided along a side surface in the direction of a short side of the housing 22. In addition, FIG. 18(B) illustrates an example in which the display portion 24 is provided along a side surface in the direction of a long side of the housing 22.

Note that it is needless to say that the structure of the display device 11 in the system 10 described as a modification example is not limited to the structure described here and can be replaced with any of the structures described in the above structure examples. Furthermore, the structure of the housing 22 can be changed as appropriate depending on the structure of the connection portion 14 of the display device 11.

The above is the description of the modification example.

<Hardware Configuration Examples of System>

Hardware configuration examples of the electronic device 21 and the display device 11 included in the system 10 will be described below with reference to the drawings.

Figure 19:
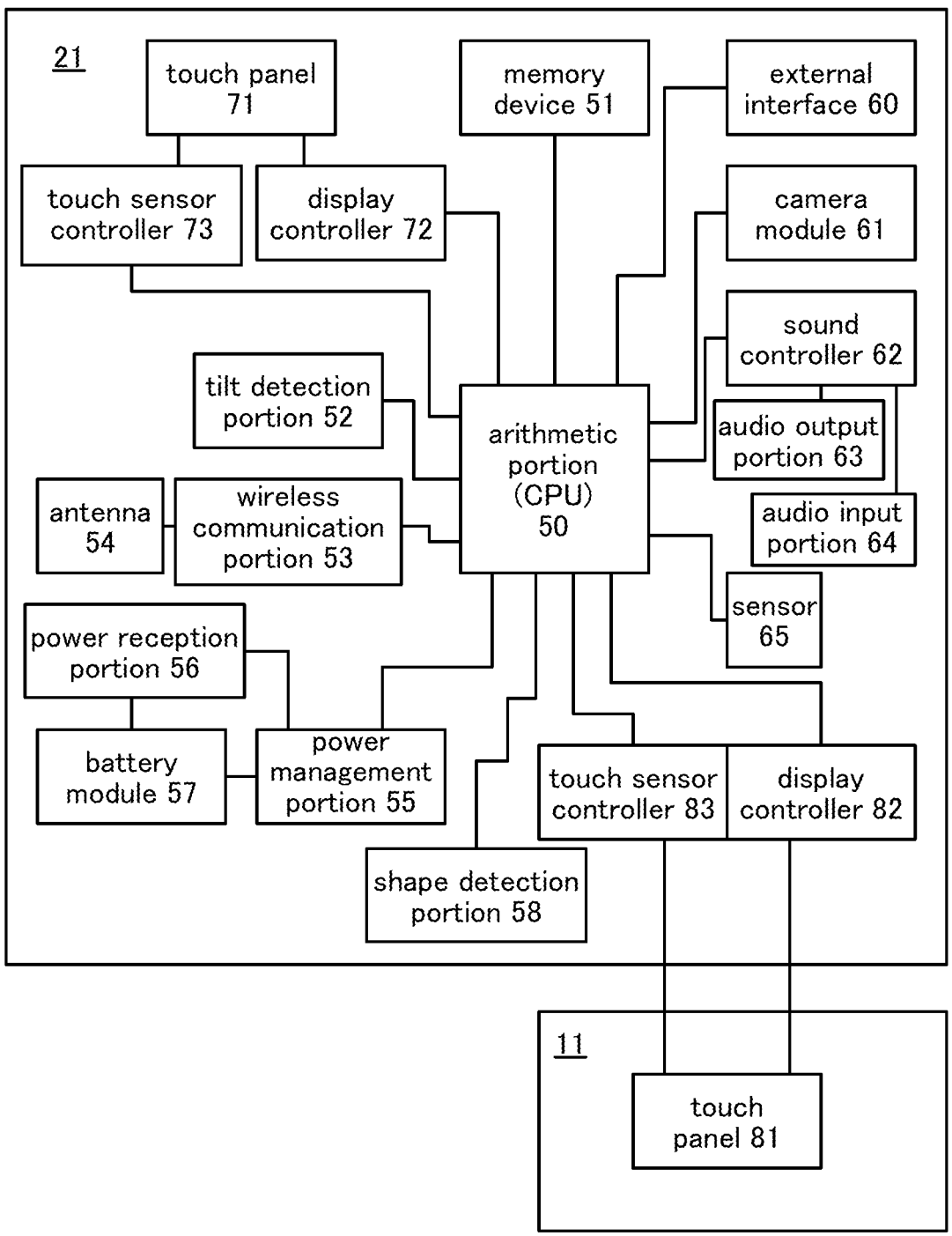
FIG. 19 A structure example of a system according to an embodiment.

FIG. 19 is a block diagram illustrating a configuration example of the system 10. The system 10 includes the display device 11 and the electronic device 21.

Note that in a block diagram attached to this specification, components are classified according to their functions and shown as independent blocks; however, it is practically difficult to completely separate the components according to their functions, and one component may have a plurality of functions.

The electronic device 21 includes an arithmetic portion (CPU) 50, a memory device 51, a tilt detection portion 52, a wireless communication portion 53, an antenna 54, a power management portion 55, a power reception portion 56, a battery module 57, a shape detection portion 58, an external interface 60, a camera module 61, a sound controller 62, an audio output portion 63, an audio input portion 64, a sensor 65, a touch panel 71, a display controller 72, a touch sensor controller 73, a display controller 82, a touch sensor controller 83, and the like.

In addition, the display device 11 includes a touch panel 81.

Note that the configurations of the system 10, the electronic device 21, and the display device 11 illustrated in FIG. 19 are mere examples, and not all the components are necessarily included. The system 10, the electronic device 21, and the display device 11 include necessary components among the components illustrated in FIG. 19 and may include a component other than the components illustrated in FIG. 19.

The arithmetic portion 50 can function as a central processing unit (CPU: Central Processing Unit), and has a function of controlling components such as the memory device 51, the tilt detection portion 52, the wireless communication portion 53, the power management portion 55, the shape detection portion 58, the external interface 60, the camera module 61, the sound controller 62, and the like, for example.

Signals may be transmitted between the arithmetic portion 50 and each component via a system bus (not illustrated). In addition, the arithmetic portion 50 can process signals input from each component which is connected through the system bus and generate signals to be output to each component, so that each component connected to the system bus can be controlled comprehensively.

Note that a transistor which includes an oxide semiconductor in a channel formation region and achieves an extremely low off-state current can be used in the arithmetic portion 50. Since the transistor has an extremely low off-state current, with the use of the transistor as a switch for holding electric charge (data) which flows into a capacitor serving as a memory element, a long data retention period can be ensured. By utilizing this characteristic for a register or a cache memory of the arithmetic portion 50, normally off computing is achieved where the arithmetic portion 50 operates only when needed and data on the previous processing is stored in the memory element in the rest of time; thus, power consumption of the electronic device 21 can be reduced.

Another microprocessor such as a DSP (Digital Signal Processor) or a GPU (Graphics Processing Unit) can be used in addition to the CPU as the arithmetic portion 50. Furthermore, such a microprocessor may be obtained with a PLD (Programmable Logic Device) such as a FPGA (Field Programmable Gate Array) or a FPAA (Field Programmable Analog Array). The arithmetic portion 50 interprets and executes instructions from various programs with the processor to process various kinds of data and control programs. The programs executed by the processor may be stored in a memory region of the processor or may be stored in the memory device 51.

The arithmetic portion 50 may include a main memory. The main memory can include a volatile memory such as a RAM (Random Access Memory) or a nonvolatile memory such as a ROM (Read Only Memory).

For example, a DRAM (Dynamic Random Access Memory) is used as the RAM included in the main memory, in which case a memory space as a workspace for the arithmetic portion 50 is virtually allocated and used. An operating system, an application program, a program module, program data, and the like which are stored in the memory device 51 are loaded into the RAM to be executed. The data, program, and program module which are loaded into the RAM are directly accessed and operated by the arithmetic portion 50. Moreover, characteristic data for calculating the position of the electronic device 21 and the relative positional relationship between the electronic device 21 and the display device 11 from the data input from the tilt detection portion 52 and the shape detection portion 58 of the present invention may be read out from the memory device 51 as a lookup table and stored in the main memory.

On the other hand, in the ROM, a BIOS (Basic Input/Output System), firmware, or the like for which rewriting is not needed can be stored. As the ROM, a mask ROM, an OTPROM (One Time Programmable Read Only Memory), an EPROM (Erasable Programmable Read Only Memory), or the like can be used. As the EPROM, a UV-EPROM (Ultra-Violet Erasable Programmable Read Only Memory) which can erase stored data by irradiation with ultraviolet rays, an EEPROM (Electrically Erasable Programmable Read Only Memory), a flash memory, and the like can be given.

As the memory device 51, a memory media drive such as a hard disc drive (Hard Disc Drive: HDD) or a solid state drive (Solid State Drive: SSD); a memory device including a non-volatile memory element, such as a flash memory, an MRAM (Magnetoresistive Random Access Memory), a PRAM (Phase Change RAM), a ReRAM (Resistance RAM), or a FeRAM (Ferroelectric RAM); a memory device including a volatile memory element, such as a DRAM (Dinamic Ram) or an SRAM (Static RAM); or the like can be used.

In addition, as the memory device 51, a memory device which is attachable and detachable through the external interface 60 with a connector, such as an HDD or an SSD; or a media drive of a memory medium such as a flash memory, a Blu-ray disc, or a DVD can be used. Note that the memory device 51 is not necessarily incorporated in the electronic device 21, and a memory device outside the electronic device 21 may be used as the memory device 51. In that case, the memory device may be connected through the external interface 60, or data transmission and reception may be wirelessly performed using the wireless communication portion 53.

The tilt detection portion 52 has a function of detecting a tilt, a posture, and the like of the electronic device 21. For example, an acceleration sensor, an angular velocity sensor, a vibration sensor, a pressure sensor, a gyroscope sensor, or the like can be used for the tilt detection portion 52. Alternatively, a plurality of these sensors may be combined.

The wireless communication portion 53 can communicate via the antenna 54. For example, the wireless communication portion 53 controls a control signal for connecting the electronic device 21 to a computer network according to instructions from the arithmetic portion 50 and transmits the signal to the computer network. Accordingly, communication can be performed by connecting the electronic device 21 to a computer network such as the Internet which is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In addition, when a plurality of methods are used as its communication method, a plurality of antennas 54 may be included depending on the communication methods.

For example, a high frequency circuit (an RF circuit) may be included in the wireless communication portion 53 for receiving and transmitting an RF signal. The high frequency circuit is a circuit for mutually converting an electromagnetic signal into an electric signal in a frequency band set in accordance with different national laws and performing wireless communication with another communication device using the electromagnetic signal. Several tens of kilohertz to several tens of gigahertz is a practical frequency band which is generally used. The high frequency circuit includes a high frequency circuit portion and an antenna which are compatible with a plurality of frequency bands; the high frequency circuit portion can include an amplifier (amplifier), a mixer, a filter, a DSP, an RF transceiver, or the like. In the case of performing wireless communication, it is possible to use, as a communication protocol or a communication technology, a communications standard such as GSM (Global System for Mobile Communication: registered trademark), EDGE (Enhanced Data Rates for GSM Evolution), CDMA2000 (Code Division Multiple Access 2000), or W-CDMA (Wideband Code Division Multiple Access), or specifications with a communications standard developed by IEEE such as Wi-Fi (Wireless Fidelity: registered trademark), Bluetooth (registered trademark), or ZigBee (registered trademark).

In the case of using the electronic device 21 as a telephone, the wireless communication portion 53 controls a connection signal for connecting the electronic device 21 to the telephone line according to instructions from the arithmetic portion 50 and transmits the signal to the telephone line.

The power management portion 55 can manage a charge state of the battery module 57. In addition, the power management portion 55 supplies power from the battery module 57 to each component. The power reception portion 56 has a function of receiving power supplied from the outside and charging the battery module 57. The power management portion 55 can control the operation of the power reception portion 56 depending on the charge state of the battery module 57.

The battery module 57 includes one or more primary batteries or secondary batteries, for example. In addition, in the case of indoor use or the like, an alternate-current power source (AC) may be used as an external power source. Particularly in the case of using the electronic device 21 separately from the external power source, it is favorable that the battery module 57 have a large charge/discharge capacity which allows the electronic device 21 to be used for a long time. The battery module 57 may be charged using a battery charger separated from the electronic device 21. At this time, charging may be performed through wires using an AC adaptor; alternatively, charging may be performed by a wireless power feeding method such as an electric field coupling method, an electromagnetic induction method, or an electromagnetic resonance (electromagnetic resonant coupling) method. As the secondary battery which can be used for the battery module 57, for example, a lithium ion secondary battery, a lithium ion polymer secondary battery, or the like can be given.

The power management portion 55 may include a battery management unit (BMU), for example. The BMU collects data on cell voltage or cell temperatures of the battery, monitors overcharge and overdischarge, controls a cell balancer, handles a deterioration state of the battery, calculates the remaining battery power (State Of Charge: SOC), and controls detection of a failure, etc.

The power management portion 55 controls power transmission from the battery module 57 to each component through the system bus or other power supply lines. The power management portion 55 can include a power converter with a plurality of channels, an inverter, a protection circuit, and the like, for example.

In addition, the power management portion 55 preferably has a function of reducing power consumption. As the function of reducing power consumption, the following can be given: after detection of no input to the electronic device 21 for a given period, the power management portion 55 lowers the clock frequency of the arithmetic portion 50 or stops input of clocks of the arithmetic portion 50, stops operation of the arithmetic portion 50 itself, or stops operation of an auxiliary memory, thereby controlling power supply to each component and reducing power consumption. Such a function is performed with the power management portion 55 alone or interlocking with the arithmetic portion 50.

The shape detection portion 58 has a function of detecting the relative positional relationship between the display device 11 and the electronic device 21 and outputting the data to the arithmetic portion 50 via the system bus. In addition, in the case where the display device 11 and the electronic device 21 are detachable from each other, the shape detection portion 58 may have a function of detecting data on whether or not the display device 11 is connected to the electronic device 21 and outputting the data to the arithmetic portion 50.

As the shape detection portion 58, a sensor similar to that in the tilt detection portion 52 can be provided in the display device 11. When data on the posture of the display device 11 is input from the shape detection portion 58 to the arithmetic portion 50 via the system bus, the arithmetic portion 50 can calculate the relative positional relationship between the electronic device 21 and the display device 11 from the data on the posture of the electronic device 21 detected by the tilt detection portion 52 and the data on the posture of the display device 11.

Alternatively, a sensor for detecting the curved shape of the connection portion 14 can be used as the shape detection portion 58. When such a sensor is used, a plurality of acceleration sensors or the like may be provided in, for example, the connection portion 14 so that the arithmetic portion 50 can calculate the shape of the connection portion 14 from change in acceleration at each position. Alternatively, a sensor including a piezoelectric element may be provided in the connection portion 14 so that bending can be detected. Alternatively, a sensor whose physical characteristics (resistivity, thermal conductivity, and transmissivity) change with a curving may be incorporated in the connection portion 14 so that the shape of the connection portion 14 can be calculated from change in the physical characteristics.

In addition, in the case where a hinge is included as the connection portion 14, the rotation angle of the hinge on each rotation axis can be detected mechanically, optically, or electromagnetically.

In addition, the shape detection portion 58 may have a function of detecting two states, a state where the electronic device 21 and the display device 11 are closed and a state where they are opened. As an example of an optical detection method, for example, a light-receiving element may be provided on the surface of the housing 22 or the surface of the support 12, and blocking of external light when they are closed may be utilized for detection. Alternatively, a light-receiving element may be provided on one of the surface of the housing 22 and the surface of the support 12, a light source may be provided on the other, and incidence of light from the light source on the light-receiving element when they are closed may be utilized for detection. In that case, it is preferable to use infrared light as light from the light source because users cannot recognize it.

Note that the structure of the shape detection portion 58 is not limited to the above and any of a variety of sensors to which, for example, a mechanical, electromagnetic, thermal, acoustic, or chemical means is applied can be used as long as the sensor can detect the relative positional relationship between the electronic device 21 and the display device 11.

Note that the shape detection portion 58 is included in the electronic device 21 in the example illustrated in FIG. 19. However, in some cases, the display device 11 may include the shape detection portion 58, or a portion of the shape detection portion 58 may be included in the electronic device 21, and the other portion thereof may be included in the display device 11.

As the external interface 60, for example, one or more buttons or switches (also referred to as housing switches), an external port to which another input component can be connected, and the like which are provided on the housing can be given. The external interface 60 is connected to the arithmetic portion 50 via the system bus. As the housing switches, a switch associated with power on/off, a button for adjusting the volume, a camera shooting button, and the like may be included.

In addition, for example, the external port of the external interface 60 can be connected to an external device such as a computer or a printer through a cable. Typically, a USB (Universal Serial Bus) terminal or the like is given. In addition, as the external port, a LAN (Local Area Network) connection terminal, a digital broadcasting reception terminal, an AC adaptor connection terminal, or the like may be provided. In addition, a transceiver for optical communication, without limitation to wire communication, using infrared rays, visible light, ultraviolet rays, or the like, may be provided.

The camera module 61 is connected to the arithmetic portion 50 via the system bus. For example, a still image or a moving image can be taken in synchronization with pushing a housing switch or touch operation of the touch panel 71 or the touch panel 81.

The audio output portion 63 includes a speaker, an audio output connector, or the like, for example. In addition, the audio input portion 64 includes a microphone, an audio input connector, or the like, for example. The audio input portion 64 is connected to the sound controller 62, and is connected to the arithmetic portion 50 via the system bus. Audio data input to the audio input portion 64 is converted into a digital signal in the sound controller 62 and then processed in the sound controller 62 and the arithmetic portion 50. Meanwhile, the sound controller 62 generates an analog audio signal audible to a user according to instructions from the arithmetic portion 50 and outputs the analog audio signal to the audio output portion 63. To the audio output connector of the audio output portion 63, an audio output device such as headphones or a headset can be connected and a sound generated in the sound controller 62 is output to the device.

The sensor 65 includes a sensor unit and a sensor controller. The sensor controller supplies electric power from the battery module 57 to the sensor. Moreover, the sensor controller converts the input from the sensor into a control signal and outputs it to the arithmetic portion 50 via the system bus. The sensor controller may handle errors made by the sensor or may calibrate the sensor. Note that the sensor controller may include a plurality of controllers which control the sensor.

The sensor 65 may include any of a variety of sensors which measure force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, and infrared rays.

The touch panel 71 is connected to the display controller 72 and the touch sensor controller 73. The display controller 72 and the touch sensor controller 73 are each connected to the arithmetic portion 50 via the system bus.

The display controller 72 controls the touch panel 71 according to drawing instructions input from the arithmetic portion 50 via the system bus so that a predetermined image is displayed on the display surface of the touch panel 71.

The touch sensor controller 73 controls a touch sensor of the touch panel 71 according to requests from the arithmetic portion 50 via the system bus. In addition, the touch sensor controller 73 outputs a signal received by the touch sensor to the arithmetic portion 50 via the system bus. Note that the function of calculating touch position data from a signal received by the touch sensor may be given to the touch sensor controller 73 or the data may be calculated by the arithmetic portion 50.

The touch panel 81 of the display device 11 can be connected to the display controller 82 and the touch sensor controller 83 when the display device 11 is attached to the electronic device 21. Like the display controller 72 and the touch sensor controller 73, the display controller 82 and the touch sensor controller 83 can control the touch panel 81.

Here, the touch panel 81 and the display controller 82 or the touch sensor controller 83 may be connected to each other through a cable or a wiring or may transmit and receive signals wirelessly.

In addition, although not illustrated here, power may be supplied to the display device 11 from the power management portion 55 of the electronic device 21. In that case, a power supply line for supplying power by wire or wirelessly from the power management portion 55 to the display device 11 (or the touch panel 81) can be used.

Note that the display controller 82 and the touch sensor controller 83 are included in the electronic device 21 here, but may be included in the display device 11. In that case, the display controller 82 and the touch sensor controller 83 can be connected by wire or wirelessly to the arithmetic portion 50 through the system bus of the electronic device 21.

In addition, the display controller 72 may also serve as the display controller 82, and similarly, the touch sensor controller 73 may also serve as the touch sensor controller 83. That is, the display controller 72 and the touch sensor controller 73 may control both the touch panel 71 and the touch panel 81.

It is preferable that the display device 11 include minimum components such as the touch panel 81 and the electronic device 21 include the other components as illustrated in FIG. 19 because the configuration of the display device 11 can be simplified. Accordingly, the display device 11 can be lightweight and compact. This makes it possible to minimize the total weight and an increase in thickness of the system 10 including the electronic device 21 and the display device 11. It is also preferable that components originally included in the electronic device 21 be used as components for driving the display device 11, such as the display controller 82 and the touch sensor controller 83, because no new components, or only minimum components, need to be added to the electronic device 21 to obtain the system 10.

Figure 20:
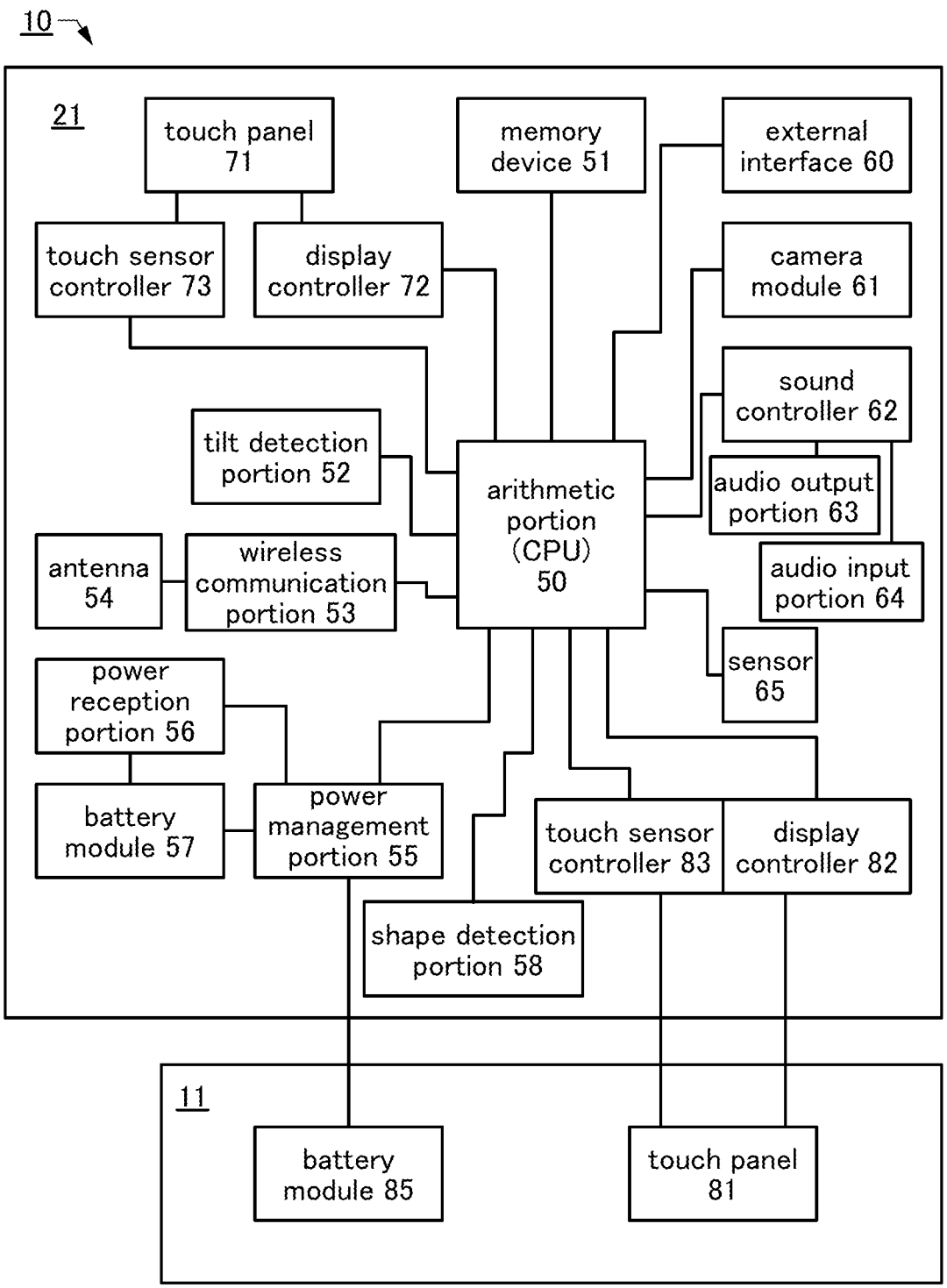
FIG. 20 A structure example of a system according to an embodiment.

FIG. 20 illustrates an example in which the display device 11 includes the battery module 85.

The battery module 85 can be connected to the power management portion 55 of the electronic device 21 when the display device 11 is attached to the electronic device 21. The power management portion 55 can control the battery module 85 in addition to the battery module 57. It is also preferable that power be supplied to the battery module 85 from the power reception portion 56 through the power management portion 55 so that the battery module 85 can be charged.

Note that the display device 11 may include a power management portion and a power reception portion in the case where the display device 11 is detachable. Accordingly, the battery module 85 can be charged in the display device 11 alone.

The battery module 85 is preferably positioned so as to overlap with the touch panel 81. In that case, when the support 12 and the touch panel 81 of the display device 11 are flexible and can be used in a bent state, it is preferable that the battery module 85 be also at least partly flexible. As the secondary battery which can be used for the battery module 85, for example, a lithium ion secondary battery, a lithium ion polymer secondary battery, and the like are given. It is also preferable that a laminate pouch be used as an external package of the battery so that the battery has flexibility.

A film used for the laminate pouch is a single-layer film selected from a metal film (aluminum, stainless steel, nickel steel, and the like), a plastic film made of an organic material, a hybrid material film including an organic material (an organic resin, fiber, or the like) and an inorganic material (ceramic or the like), and a carbon-containing inorganic film (a carbon film, a graphite film, or the like); or a stacked-layer film including a plurality of the above films. A metal film can easily be embossed. Forming depressions or projections by embossing increases the surface area of the film exposed to outside air, achieving an efficient heat dissipation effect.

In particular, by using a laminate pouch including a metal film having depressions and projections by embossing as a laminate pouch, a strain caused by stress applied to the laminate pouch can be relieved, leading to an effective decrease of defects such as a break of the laminate pouch due to bending of a secondary battery.

Note that the configuration examples are described herein in which the display device 11 includes the touch panel 81 or includes the touch panel 81 and the battery module 85, but the display device 11 may include other components. For example, the display device 11 may include one or more of the above-described components of the electronic device 21 or may include another or other components. In one example, the display device 11 may include the touch panel 81, the battery module 85, a power management portion, and a power reception portion. In another example, the display device 11 may include the touch panel 81, the battery module 85, a power management portion, a power reception portion, an arithmetic portion, and a camera module.

The above is the description of system hardware configurations.

At least part of this embodiment can be implemented in combination with any of the other embodiments described in this specification as appropriate.

Embodiment 2

In this embodiment, structure examples of an input/output device (a touch panel), an input device (a touch sensor), an output device (a display panel), and the like which can be used for the display portion of the above embodiment will be described.

<Structure Example of Sensor Electrode or the Like>

A structure example of the input device (touch sensor) will be described below with reference to the drawings.

Figure 21A:
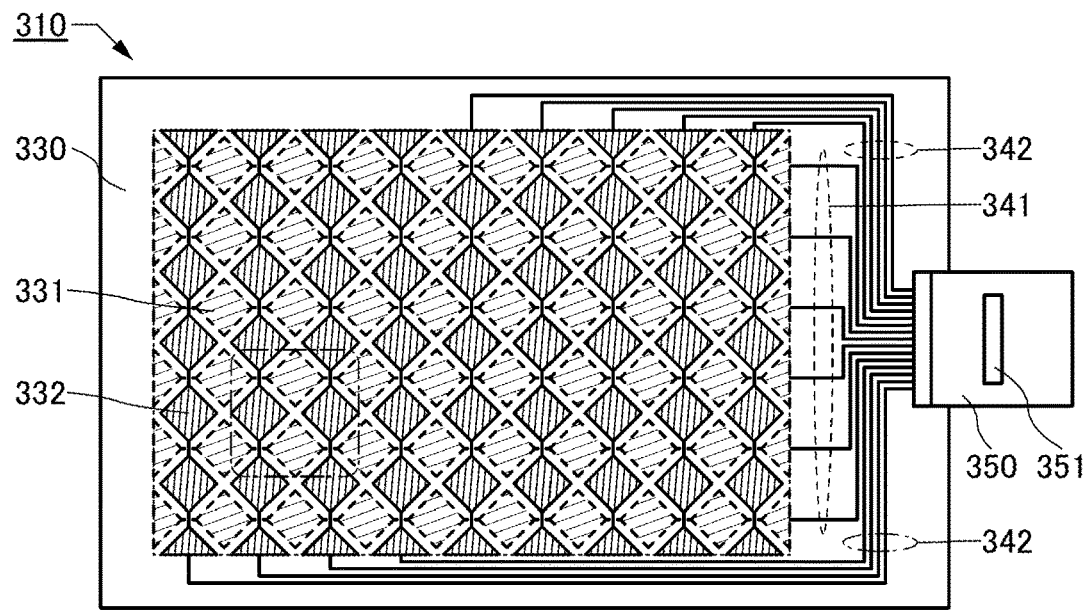
FIGS. 21A to 21D A structure example of an input device of according to an embodiment.

FIG. 21(A) is a schematic top view of an input device 310. The input device 310 includes a plurality of electrodes 331, a plurality of electrodes 332, a plurality of wirings 341, and a plurality of wirings 342 over a substrate 330. In addition, the substrate 330 is provided with an FPC (Flexible Printed Circuit) 350 which is electrically connected to each of the plurality of wirings 341 and the plurality of wirings 342. FIG. 21(A) also illustrates an example in which the FPC 350 is provided with an IC 351.

Figure 21B:
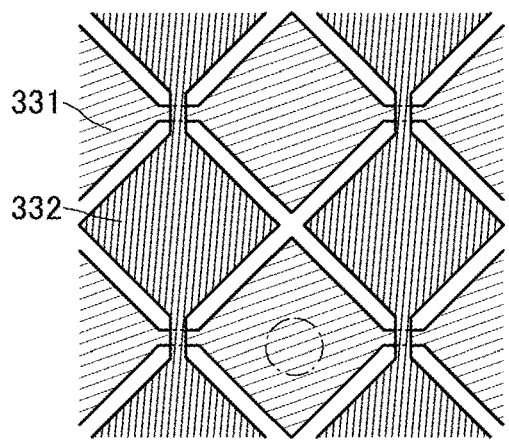

FIG. 21(B) shows an enlarged view of a region surrounded by a dashed dotted line in FIG. 21(A). The electrodes 331 are each in the form of a row of a plurality of rhombic electrode patterns arranged in a lateral direction of this figure. The rhombic electrode patterns aligned in a line are electrically connected to each other. The electrodes 332 are also each in the form of a row of a plurality of rhombic electrode patterns arranged in a longitudinal direction of this figure, and the rhombic electrode patterns aligned in a line are electrically connected to each other. In addition, part of the electrode 331 and part of the electrode 332 overlap and intersect with each other. At this intersection portion, an insulator is sandwiched in order to avoid an electrical short-circuit (short-circuit) between the electrode 331 and the electrode 332.

Figure 21C:
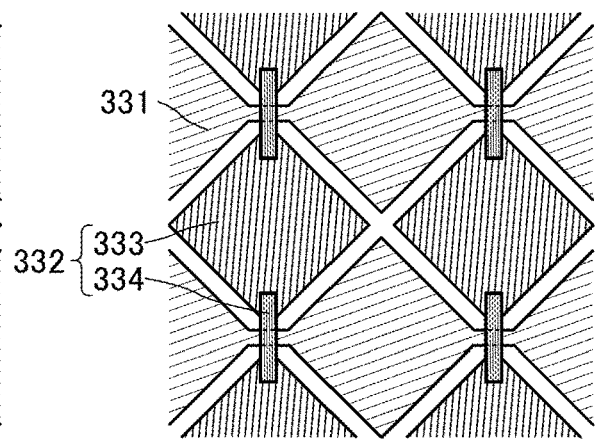

In addition, as illustrated in FIG. 21(C), the electrodes 332 may include a plurality of rhombic electrodes 333 and bridge electrodes 334. The island-shaped electrodes 333 are arranged in the longitudinal direction of the figure, and two adjacent electrodes 333 are electrically connected to each other by the bridge electrode 334. Such a structure makes it possible that the electrodes 333 and the electrodes 331 can be formed at the same time by processing the same conductive film. This can prevent variations in the thickness of these films, and can prevent the resistance value and the light transmittance of each electrode from varying from place to place. Note that although the electrodes 332 include the bridge electrodes 334 here, the electrodes 331 may have such a structure.

Figure 21D:
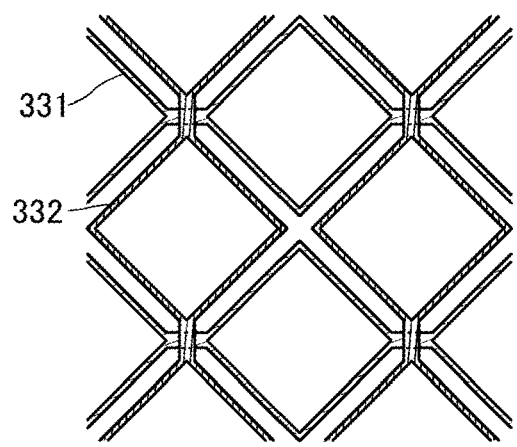

In addition, as illustrated in FIG. 21(D), a shape in which rhombic electrode patterns of the electrodes 331 and the electrodes 332 illustrated in FIG. 21(B) are hollowed out and only edge portions are left may be used. In that case, when the widths of the electrodes 331 and the electrodes 332 are small enough to be invisible to the users, the electrodes 331 and the electrodes 332 can be formed using a light-blocking material such as a metal or an alloy, as will be described later. In addition, either the electrodes 331 or the electrodes 332 illustrated in FIG. 21(D) may include the above bridge electrodes 334.

One of the electrodes 331 is electrically connected to one of the wirings 341. In addition, one of the electrodes 332 is electrically connected to one of the wirings 342. Here, either one of the electrodes 331 and the electrodes 332 corresponds to a row wiring, and the other corresponds to a column wiring.

The IC 351 has a function of driving the touch sensor. A signal output from the IC 351 is supplied to either of the electrodes 331 and the electrodes 332 through the wiring 341 or the wiring 342. In addition, a current (or a potential) flowing to either of the electrodes 331 and the electrodes 332 is input to the IC 351 through the wiring 341 or the wiring 342.

When a touch panel is formed in such a manner that the input device 310 overlaps with a display screen of the display panel, a light-transmitting conductive material is preferably used for the electrodes 331 and the electrodes 332. In addition, in the case where a light-transmitting conductive material is used for the electrodes 331 and the electrodes 332 and light from the display panel is extracted through the electrodes 331 or the electrodes 332, it is preferable that a conductive film containing the same conductive material be placed between the electrodes 331 and the electrodes 332 as a dummy pattern. In this manner, part of a space between the electrodes 331 and the electrodes 332 is filled with the dummy pattern, which can reduce variation in light transmittance. As a result, unevenness in luminance of light transmitted through the input device 310 can be reduced.

As a light-transmitting conductive material, a conductive oxide such as indium oxide, indium tin oxide, indium zinc oxide, zinc oxide, or zinc oxide to which gallium is added can be used. Note that a film including graphene can be used as well. The film including graphene can be formed, for example, by reducing a film containing graphene oxide formed in a film shape. As a reducing method, a method with application of heat or the like can be given.

Furthermore, a metal or an alloy which is thin enough to have a light-transmitting property can be used. For example, a metal such as gold, silver, platinum, magnesium, nickel, tungsten, chromium, molybdenum, iron, cobalt, copper, palladium, or titanium, or an alloy containing any of these metals can be used. Alternatively, a nitride of the metal or the alloy (e.g., titanium nitride), or the like may be used. Alternatively, a stacked film in which two or more of conductive films containing the above materials are stacked may be used.

In addition, for the electrodes 331 and the electrodes 332, a conductive film that is processed to be thin enough to be invisible to the users may be used. Such a conductive film is processed into a lattice shape (a mesh shape), for example, which makes it possible to achieve both high conductivity and high visibility of the display device. In that case, it is preferable that the conductive film have a portion in which the width is greater than or equal to 30 nm and less than or equal to 100 μm, preferably greater than or equal to 50 nm and less than or equal to 50 μm, more preferably greater than or equal to 50 nm and less than or equal to 20 μm. In particular, the conductive film having a pattern width of 10 μm or less is preferable because it is extremely difficult to see by the users.

Figure 22A:
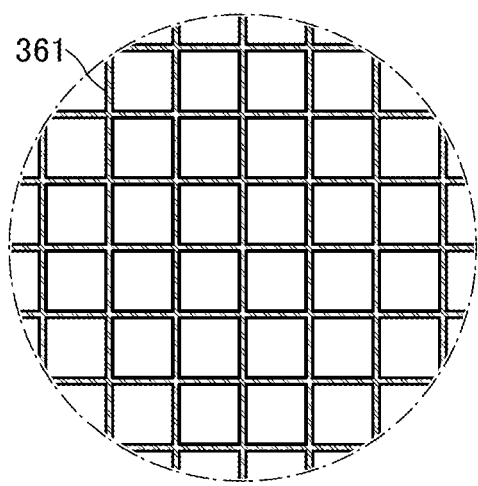
FIGS. 22A to 22D A structure example of an input device of according to an embodiment.

As examples, enlarged schematic views of part of the electrodes 331 (a region surrounded by a dashed-dotted line in FIG. 21(B)) are shown in FIGS. 22(A) to (D). FIG. 22(A) illustrates an example of the case where a lattice-shaped conductive film 361 is used. At this time, the conductive film 361 is preferably placed so as not to overlap with the display element included in the display device so that light from the display device is not blocked. In that case, it is preferable that the direction of the lattice be provided so as to be the same as the direction of the display element arrangement and that the pitch of the lattice be an integer multiple of the pitch of the display element arrangement.

Figure 22B:
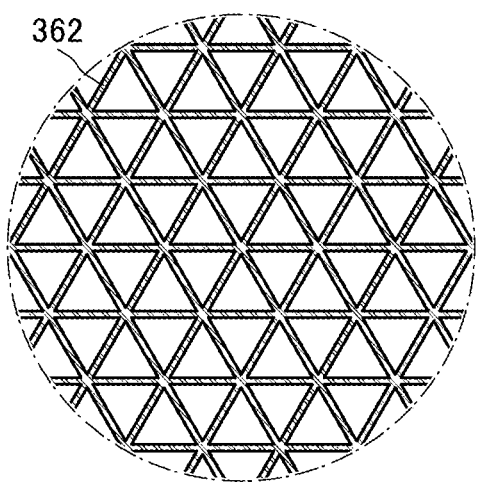

In addition, FIG. 22(B) illustrates an example of a lattice-shaped conductive film 362, which is processed so as to be provided with triangle openings. Such a structure makes it possible to further reduce the resistance compared with the case illustrated in FIG. 22(A).

Figure 22C:
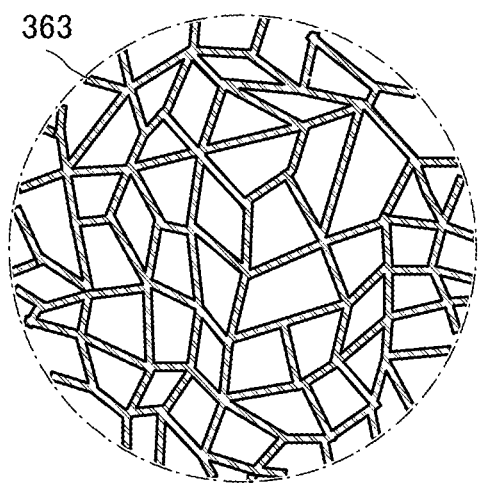

In addition, a conductive film 363, which has an irregular pattern shape, may be used as illustrated in FIG. 22(C). Such a structure can prevent generation of moire when overlapping with the display portion of the display device.

Figure 22D:
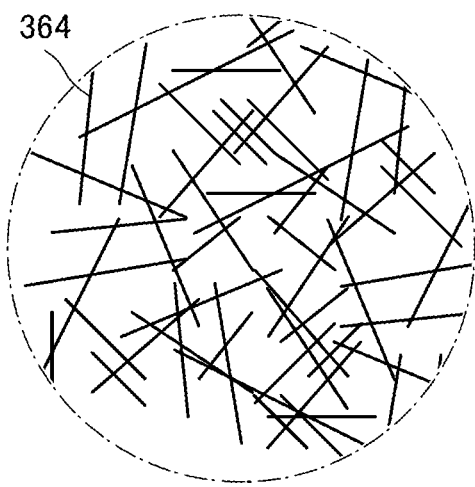

In addition, conductive nanowires may be used for the electrodes 331 and the electrodes 332. FIG. 22(D) illustrates an example in which nanowires 364 are used. The nanowires 364 are dispersed at appropriate density so as to be in contact with the adjacent nanowires, which can form a two-dimensional network; therefore, the nanowires 364 can function as a conductive film with an extremely high light-transmitting property. For example, a nanowire which has a mean value of the diameters of greater than or equal to 1 nm and less than or equal to 100 nm, preferably greater than or equal to 5 nm and less than or equal to 50 nm, more preferably greater than or equal to 5 nm and less than or equal to 25 nm can be used. As the nanowire 364, a metal nanowire such as an Ag nanowire, a Cu nanowire, or an Al nanowire, a carbon nanotube, or the like can be used. In the case of using an Ag nanowire, for example, a light transmittance of 89% or more and a sheet resistance of 40 ohms/square or more and 100 ohms/square or less can be achieved.

Although examples in which a plurality of rhombuses are aligned in one direction are shown in FIG. 21(A) and the like as top surface shapes of the electrodes 331 and the electrodes 332, the shapes of the electrodes 331 and the electrodes 332 are not limited thereto and can have various top surface shapes such as a belt shape (a rectangular shape), a belt shape having a curve, and a zigzag shape. In addition, although the above shows the electrodes 331 and the electrodes 332 arranged to be perpendicular to each other, they are not necessarily arranged to be perpendicular and the angle formed by the two electrodes may be less than 90°.

Figure 23A:
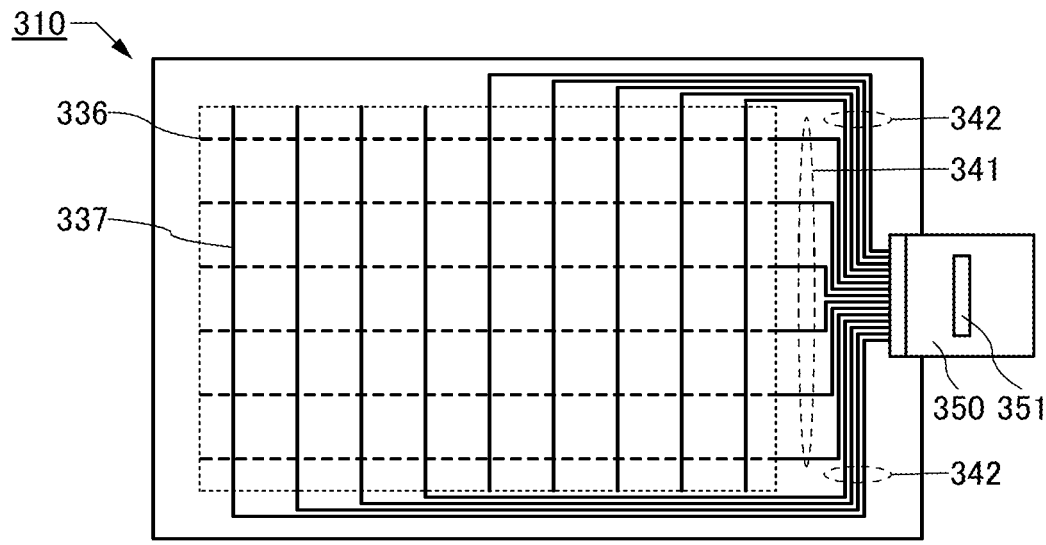
FIGS. 23A to 23C A structure example of an input device of according to an embodiment.
Figure 23B:
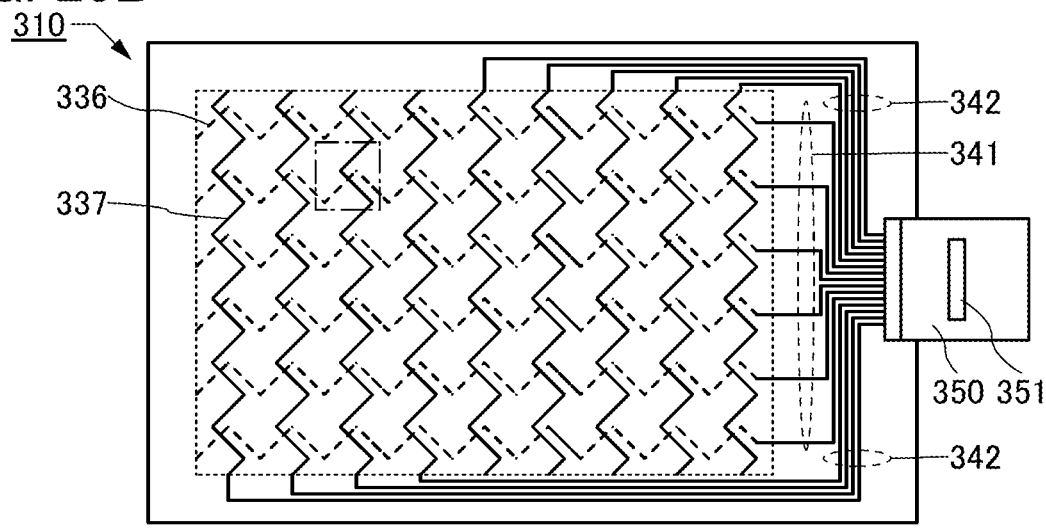
Figure 23C:
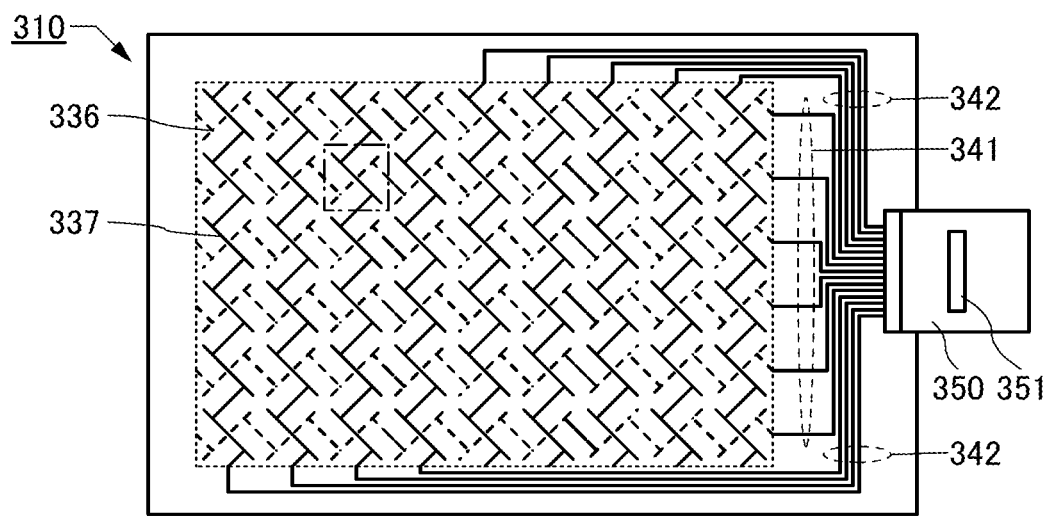

FIGS. 23(A) to (C) illustrate examples of the case where electrodes 336 and electrodes 337, which have a top surface shape of thin lines, are used instead of the electrodes 331 and the electrodes 332. FIG. 23(A) shows an example in which the linear electrodes 336 and electrodes 337 are arranged so as to form a lattice shape.

In addition, FIG. 23(B) shows an example in which the electrodes 336 and the electrodes 337 have a top surface shape of a zigzag shape. In that case, as shown in FIG. 23(B), the electrodes 336 and the electrodes 337 are preferably arranged such that the centers of their straight-line portions do not overlap with each other but are relatively displaced from each other. This enables a longer length of a portion where the electrodes 336 and the electrodes 337 face parallel to each other. This is preferable because the capacitance between the electrodes can be increased and the sensitivity can be increased. Alternatively, as shown in FIG. 23(C), a shape in which part of the straight-line portion of a zigzag shape is projected is used as a top surface shape of the electrodes 336 and the electrodes 337, which can increase the capacitance between the electrodes because the length of the parts facing each other can be longer even when the centers of the straight-line portions overlap with each other.

Figure 24A:
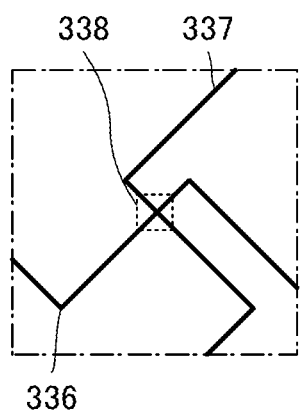
FIGS. 24A to 24F A structure example of an input device of according to an embodiment.
Figure 24B:
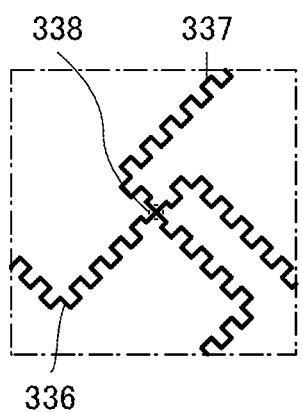
Figure 24C:
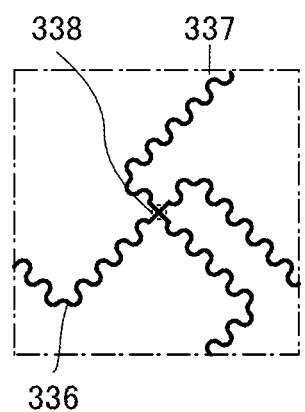
Figure 24D:
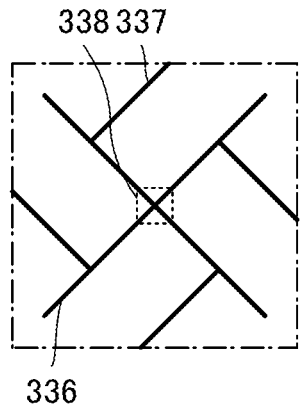
Figure 24E:
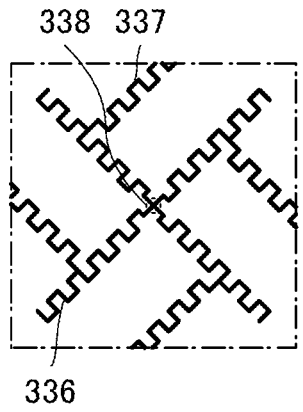
Figure 24F:
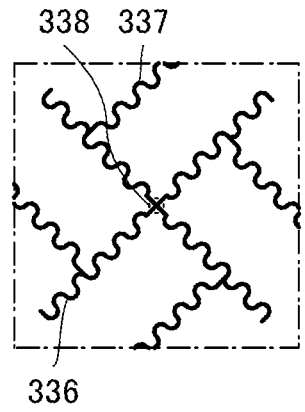

FIGS. 24(A), (B), and (C) show enlarged views of a region surrounded by a dashed dotted line in FIG. 23(B), and FIGS. 24(D), (E), and (F) show enlarged views of a region surrounded by a dashed dotted line in FIG. 23(C). In addition, in these drawings, the electrodes 336, the electrodes 337, and intersection portions 338 at which the electrodes 336 and the electrodes 337 intersect are illustrated. The straight-line portions of the electrodes 336 and the electrodes 337 shown in FIGS. 24(A) and (D) may have a serpentine shape that meanders with angled corners as shown in FIGS. 24(B) and (E) or may have a serpentine shape in which a curve continuously meanders as shown in FIGS. 24(C) and (F).

The above is the description of the electrode shapes or the like.

<Structure Example of Touch Panel>

A structure example of a touch panel will be described below with reference to the drawings as an example of an input/output device including the input device of one embodiment of the present invention.

<Structure Example>

Figure 25A:
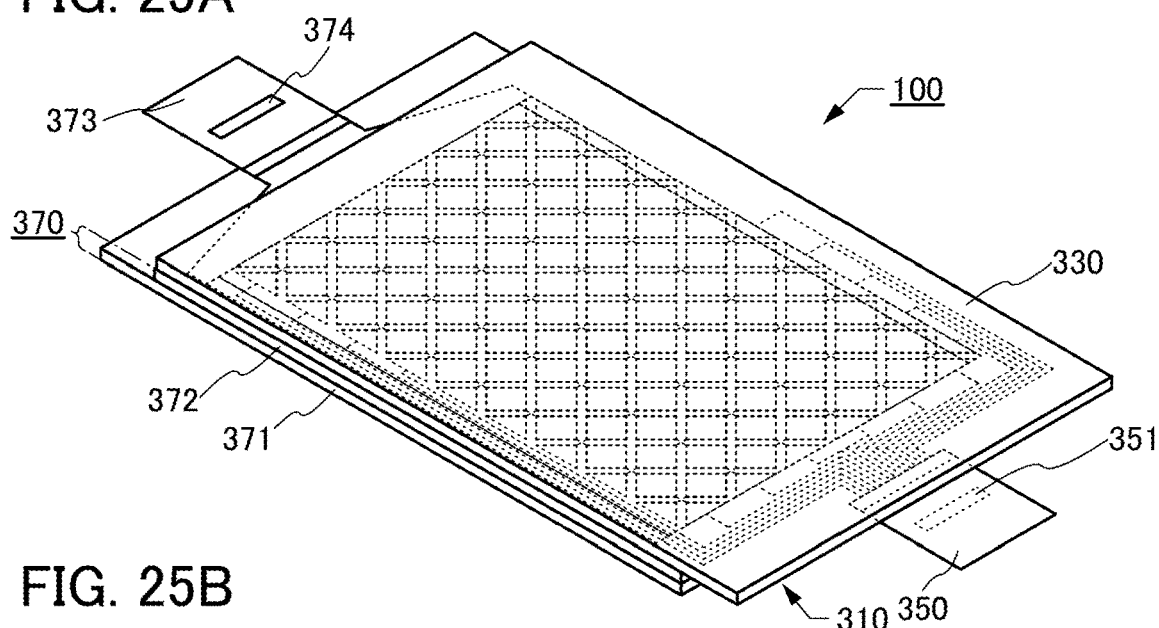
FIGS. 25A and 25B A structure example of an input/output device according to an embodiment.
Figure 25B:
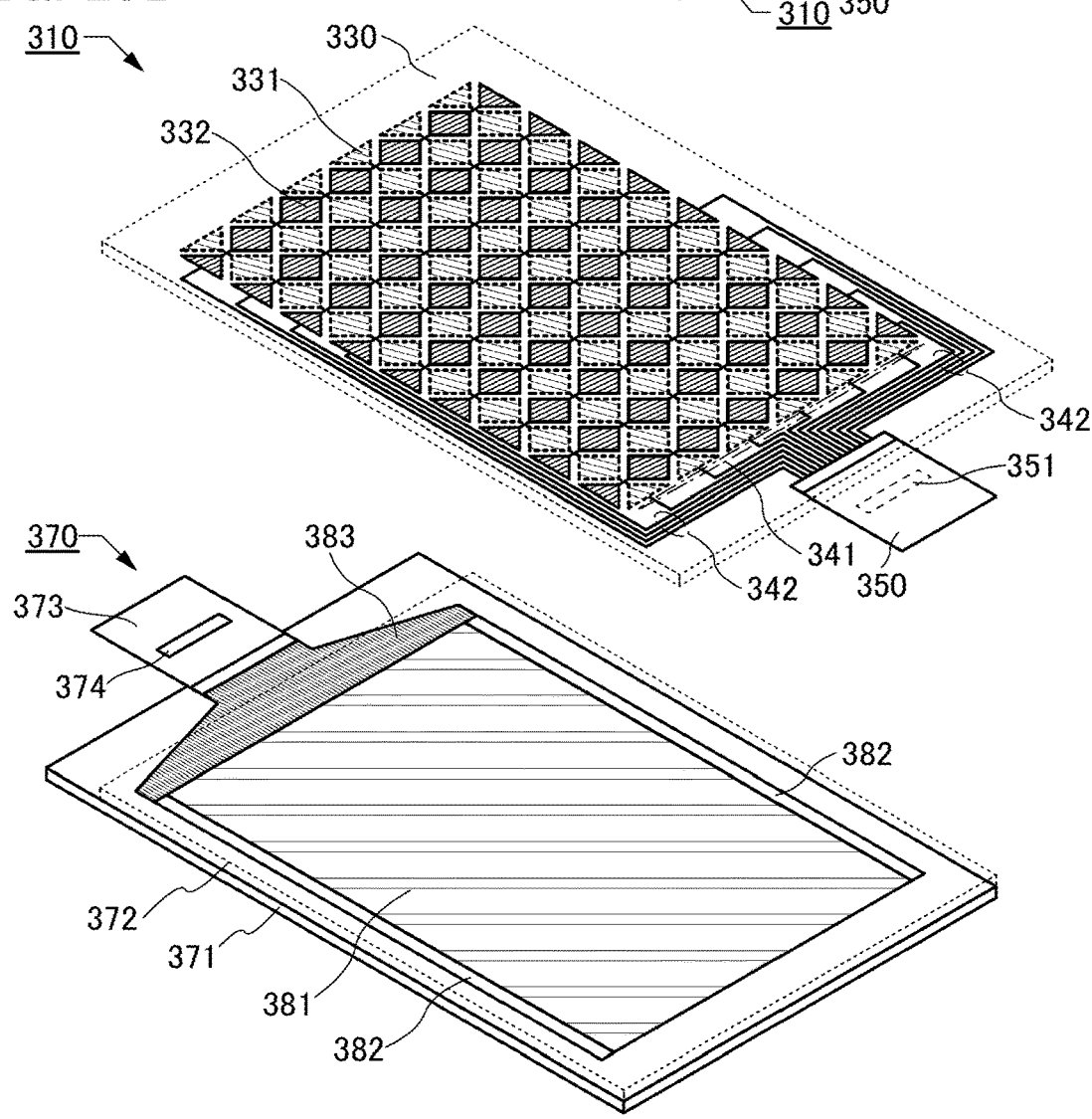

FIG. 25(A) is a schematic perspective view of a touch panel 100. In addition, FIG. 25(B) is a developed schematic perspective view of FIG. 25(A). Note that only typical components are illustrated for simplicity. In addition, in FIG. 25(B), some components (such as the substrate 330 and a substrate 372) are shown by only outlines of a dashed line.

The touch panel 100 includes the input device 310 and a display panel 370, which are provided to overlap with each other.

The above can be referred to for the structure of the input device 310. FIGS. 25(A) and (B) illustrate the case where the input device 310 includes the substrate 330, the electrodes 331, the electrodes 332, the plurality of wirings 341, the plurality of wirings 342, the FPC 350, and the IC 351.

As the input device 310, for example, a capacitive touch sensor can be used. As the capacitive type, a surface capacitive type, a projected capacitive type, and the like are given. In addition, as the projected capacitive type, a self capacitive type, a mutual capacitive type, and the like which differ mainly in the driving method are given. The use of a mutual capacitive type is preferable because multiple points can be detected simultaneously. An example of using a projected capacitive touch sensor will be described below.

Note that without being limited thereto, any of a variety of sensors capable of sensing the proximity or touch of an object to be sensed, such as a finger or a stylus, can be used as the input device 310.

The display panel 370 includes the substrate 371 and a substrate 372 which are provided so as to face each other. In addition, a display portion 381, a driver circuit 382, a wiring 383, and the like are provided over the substrate 371. The substrate 371 is also provided with an FPC 373 which is electrically connected to the wiring 383. In addition, in the example illustrated in FIGS. 25(A) and (B), an IC 374 is provided over the FPC 373.

The display portion 381 includes at least a plurality of pixels. The pixel includes at least one display element. In addition, it is preferable that the pixel include a transistor and a display element. As the display element, typically, a light-emitting element such as an organic EL element, a liquid crystal element, or the like can be used.

As the driver circuit 382, for example, a circuit functioning as a scan line driver circuit, a signal line driver circuit, or the like can be used.

The wiring 383 has a function of supplying a signal or electric power to the display portion 381 or the driver circuit 382. The signal or the electric power is input from the outside through the FPC 373 or from the IC 374 to the wiring 383.

In addition, in the example illustrated in FIGS. 25(A) and (B), the IC 374 is mounted on the FPC 373 by a COF (Chip On Film) method. As the IC 374, for example, an IC functioning as a scan line driver circuit, a signal line driver circuit, or the like can be used. Note that it is possible that the IC 374 is not provided when the display panel 370 includes circuits serving as a scan line driver circuit and a signal line driver circuit or when circuits serving as a scan line driver circuit and a signal line driver circuit are externally provided and a signal for driving the display panel 370 is input through the FPC 373. The IC 374 may also be directly mounted on the substrate 371 by a COG (Chip On Glass) method or the like.

<Cross-Sectional Structure Example 1>

Figure 26:
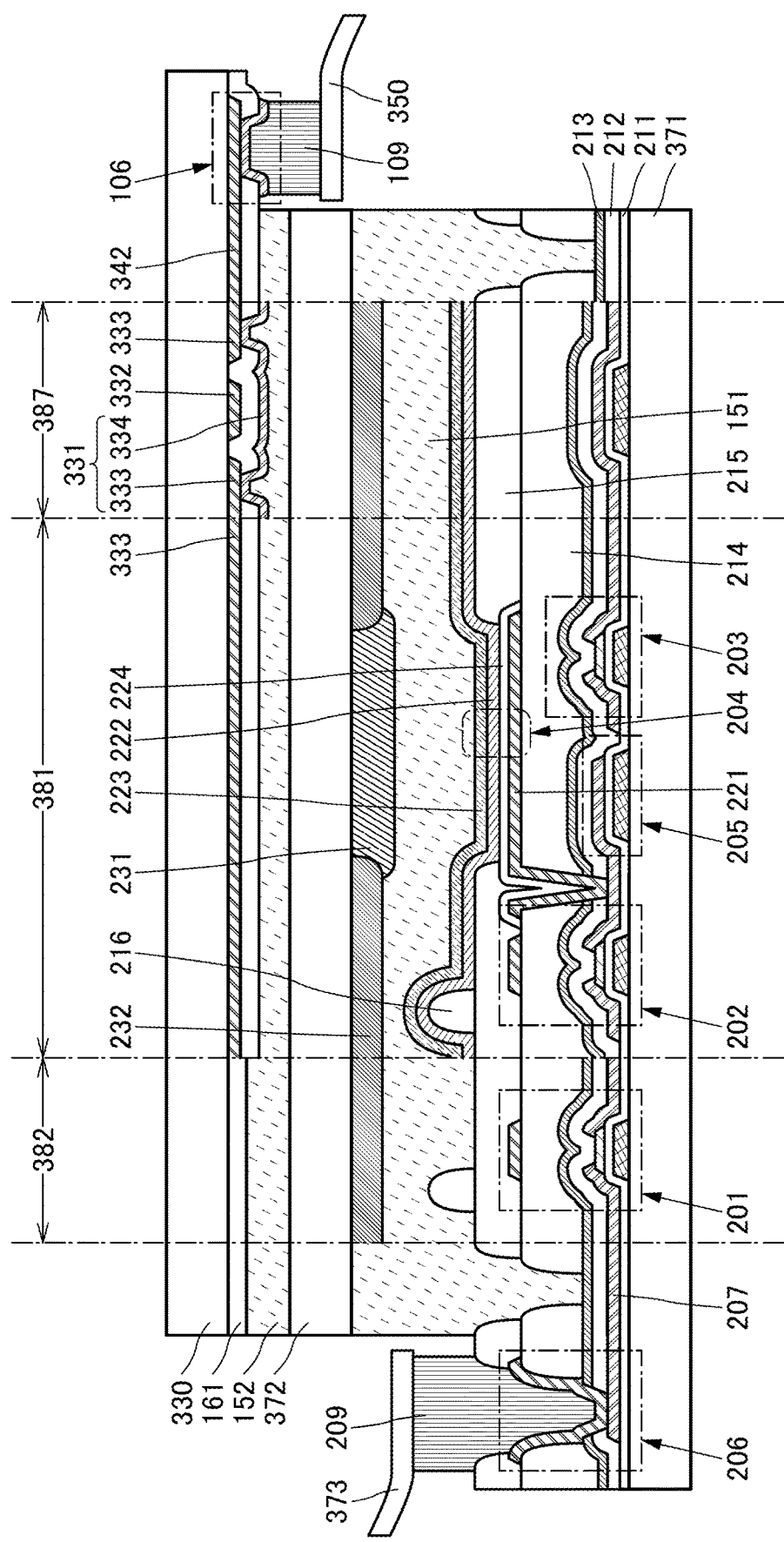
FIG. 26 A structure example of an input/output device according to an embodiment.

Next, an example of a cross-sectional structure of the touch panel 100 will be described with reference to the drawing. FIG. 26 is a schematic cross-sectional view of the touch panel 100. FIG. 26 illustrates cross sections of a region including the FPC 373, a region including the driver circuit 382, a region including the display portion 381, and a region including the FPC 350 in FIG. 25(A).

The substrate 371 and the substrate 372 are attached to each other with an adhesive layer 151. In addition, the substrate 372 and the substrate 330 are attached to each other with an adhesive layer 152. Here, a structure including the substrate 371, the substrate 372, and components provided therebetween corresponds to the display panel 370. In addition, a structure including the substrate 330 and components formed over the substrate 330 corresponds to the input device 310.

<Display Panel 370>

The display panel 370 is provided with a transistor 201, a transistor 202, a transistor 203, a display element 204, a capacitor 205, a connection portion 206, a wiring 207, and the like.

An insulating layer 211, an insulating layer 212, an insulating layer 213, an insulating layer 214, an insulating layer 215, a spacer 216, and the like are provided over the substrate 371. A portion of the insulating layer 211 functions as a gate insulating layer of each transistor, and another portion thereof functions as a dielectric of the capacitor 205. The insulating layer 212, the insulating layer 213, and the insulating layer 214 are provided to cover each transistor, the capacitor 205, and the like. The insulating layer 214 functions as a planarization layer. Note that the case where the three insulating layers, the insulating layer 212, the insulating layer 213, and the insulating layer 214, are provided to cover the transistors and the like is described here; however, without being limited thereto, four or more layers, a single layer, or two layers may be provided. In addition, the insulating layer 214 functioning as a planarization layer is not necessarily provided when not needed.

The display element 204 is provided over the insulating layer 214. An example of the case where a top-emission type (top-emission type) organic EL element is used as the display element 204 is described here. The display element 204 includes an EL layer 222 between a first electrode 221 and a second electrode 223. The display element 204 emits light to the second electrode 223 side. The transistor 202, the transistor 203, the capacitor 205, a wiring, and the like are provided to overlap with a light-emitting region of the display element 204. Thus, the aperture ratio of the display portion 381 can be increased.

In addition, an optical adjustment layer 224 is provided between the first electrode 221 and the EL layer 222. The insulating layer 215 is provided to cover end portions of the first electrode 221 and the optical adjustment layer 224.

FIG. 26 illustrates a cross section of one pixel as an example of the display portion 381. The case where the pixel includes the transistor 202 for current control, the transistor 203 for switching control, and the capacitor 205 is described here. One of a source and a drain of the transistor 202 and one electrode of the capacitor 205 are electrically connected to the first electrode 221 through an opening provided in the insulating layer 212, the insulating layer 213, and the insulating layer 214.

FIG. 26 also illustrates an example of the driver circuit 382 in which the transistor 201 is provided.

In the example illustrated in FIG. 26, the transistor 201 and the transistor 202 each have a structure in which a semiconductor layer where a channel is formed is provided between two gate electrodes. Such transistors can have a higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a display panel in which the number of wirings is increased because of increase in size or resolution.

Note that the transistors provided in the driver circuit 382 and the display portion 381 may be transistors having the same structure, or transistors having different structures may be used in combination.

A material through which impurities such as water or hydrogen do not easily diffuse is preferably used for at least one of the insulating layer 212 and the insulating layer 213 which cover the transistors. That is, the insulating layer 212 or the insulating layer 213 can function as a barrier film. Such a structure can effectively suppress diffusion of the impurities into the transistors from the outside, and a highly reliable touch panel can be achieved.

The spacer 216 is provided over the insulating layer 215 and has a function of adjusting the distance between the substrate 371 and the substrate 372. FIG. 26 illustrates the case where there is a gap between the spacer 216 and a light-blocking layer 232, which may however be in contact with each other. In addition, although the spacer 216 is provided on the substrate 371 side in the structure described here, the spacer 216 may be provided on the substrate 372 side (e.g., closer to the substrate 371 than the light-blocking layer 232). Alternatively, a particulate spacer may be used instead of the spacer 216. Although a material such as silica can be used for the particulate spacer, an elastic material such as an organic resin or rubber is preferably used. At this time, in some cases, the particulate spacer may be vertically crushed.

A coloring layer 231, the light-blocking layer 232, and the like are provided on the substrate 371 side of the substrate 372. The light-blocking layer 232 has an opening, and the opening is provided to overlap with the display region of the display element 204.

As a material that can be used for the light-blocking layer 232, carbon black, a metal oxide, a composite oxide containing a solid solution of a plurality of metal oxides, or the like can be given. Stacked films containing the material of the coloring layer 231 can also be used for the light-blocking layer 232. For example, a material containing an acrylic resin can be used for the coloring layer 231, and a stacked-layer structure of a film containing a material of a coloring layer which transmits light of a certain color and a film containing a material of a coloring layer which transmits light of another color can be employed. It is preferable that the coloring layer 231 and the light-blocking layer 232 be formed using the same material because the same manufacturing apparatus can be used and the process can be simplified.

For example, as a material that can be used for the coloring layer 231, a metal material, a resin material, a resin material containing a pigment or dye, or the like can be given.

In addition, an insulating layer which functions as an overcoat may be provided to cover the coloring layer 231 and the light-blocking layer 232.

The connection portion 206 is provided in a region near an end portion of the substrate 371. The connection portion 206 is electrically connected to the FPC 373 through a connection layer 209. In the example of the structure illustrated in FIG. 26, the connection portion 206 is formed by stacking a portion of the wiring 207 which is electrically connected to the driver circuit 382 and a conductive layer which is formed by processing the same conductive film as that for the first electrode 221. When the connection portion 206 is formed by stacking two or more conductive layers as described above, electric resistance can be reduced and mechanical strength of the connection portion 206 can be increased.

Furthermore, FIG. 26 illustrates, as an example, a cross-sectional structure of an intersection portion 387 where a wiring formed by processing the conductive film as the gate electrode of the transistor and a wiring formed by processing the same conductive film as the source electrode and the drain electrode of the transistor cross each other.

<Input Device 310>

The electrode 331 and the electrode 332 are provided on the substrate 372 side of the substrate 330. An example in which the electrode 331 includes the electrode 333 and the bridge electrode 334 is described here. As illustrated in the intersection portion 387 in FIG. 26, the electrode 332 and the electrode 333 are formed on the same plane. In addition, the bridge electrode 334 is provided over an insulating layer 161 which covers the electrode 332 and the electrode 333. The bridge electrode 334 electrically connects two electrodes 333, between which the electrode 332 is provided, through openings formed in the insulating layer 161.

A connection portion 106 is provided in a region near an end portion of the substrate 330. The connection portion 106 is electrically connected to the FPC 350 through a connection layer 109. In the example of the structure illustrated in FIG. 26, the connection portion 106 is formed by stacking a portion of the wiring 342 and a conductive layer which is formed by processing the same conductive film as the bridge electrode 334.

As the connection layer 109 or the connection layer 209, an anisotropic conductive film (ACF: Anisotropic Conductive Film), an anisotropic conductive paste (ACP: Anisotropic Conductive Paste), or the like can be used.

The substrate 330 here can be used also as a substrate with which an object to be sensed, such as a finger or a stylus, is to be in direct contact. In that case, a protective layer (such as a ceramic coat) is preferably provided over the substrate 330. The protective layer can be formed using an inorganic insulating material such as silicon oxide, aluminum oxide, yttrium oxide, or yttria-stabilized zirconia (YSZ). Alternatively, tempered glass may be used for the substrate 330. Physical or chemical processing by an ion exchange method, a wind tempering method, or the like may be performed on the tempered glass, so that compressive stress is applied on the surface. In the case where the touch sensor is provided on one side of the tempered glass and the opposite side of the tempered glass is provided on, for example, the outermost surface of an electronic device for use as a touch surface, the thickness of the whole device can be decreased.

<About Components>

The above-described components will be described below.

A material having a flat surface can be used for the substrate included in the touch panel. The substrate through which light from the display element is extracted is formed using a material that transmits the light. For example, a material such as glass, quartz, ceramic, sapphire, or an organic resin can be used.

The weight and thickness of the touch panel can be decreased by using a thin substrate. Furthermore, a flexible touch panel can be obtained by using a substrate that has such a thickness to have flexibility.

As glass, for example, alkali-free glass, barium borosilicate glass, aluminoborosilicate glass, or the like can be used.

As materials having flexibility and a light-transmitting property with respect to visible light, glass that has such a thickness to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, a polytetrafluoroethylene (PTFE) resin, and the like are given, for example. In particular, a material whose thermal expansion coefficient is low is preferred, and for example, a polyamide imide resin, a polyimide resin, PET, or the like can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a touch panel using this substrate can also be lightweight.

In addition, since the substrate through which light emission is not extracted does not need to have a light-transmitting property, a metal substrate or the like can be used in addition to the above-mentioned substrates. A metal material or an alloy material, which has high thermal conductivity, is preferable because it can easily conduct heat to the whole sealing substrate and accordingly can prevent a local temperature rise in the touch panel. To obtain flexibility or bendability, the thickness of a metal substrate is preferably greater than or equal to 10 μm and less than or equal to 200 μm, more preferably greater than or equal to 20 μm and less than or equal to 50 μm.

Although there is no particular limitation on a material of a metal substrate, it is favorable to use, for example, a metal such as aluminum, copper, or nickel, an aluminum alloy, an alloy such as stainless steel, or the like.

In addition, it is preferable to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, a sputtering method, or the like. An oxide film may be formed on the substrate surface by exposure to or heating in an oxygen atmosphere or by an anodic oxidation method or the like.

The flexible substrate may have a stacked structure of a layer of any of the above-mentioned materials and a hard coat layer (e.g., a silicon nitride layer) which protects a surface of the touch panel from damage or the like, a layer (e.g., an aramid resin layer) which can disperse pressure, or the like. Furthermore, to suppress a decrease in the lifetime of the light-emitting element due to moisture or the like, an insulating film with low water permeability, such as a film containing nitrogen and silicon such as a silicon nitride film or a silicon oxynitride film, or a film containing nitrogen and aluminum such as an aluminum nitride film, may be provided.

The substrate may be formed by stacking a plurality of layers. In particular, when a structure including a glass layer is used, a barrier property against water and oxygen can be improved and thus a highly reliable touch panel can be provided.

For example, a substrate in which a glass layer, an adhesive layer, and an organic resin layer are stacked in this order from the side closer to a light-emitting element can be used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and a high flexibility. In addition, the thickness of the organic resin layer is greater than or equal to 10 µm and less than or equal to 200 µm, preferably greater than or equal to 20 µm and less than or equal to 50 µm. Providing such an organic resin layer, occurrence of a crack or a break in the glass layer can be suppressed and mechanical strength can be improved. With such a substrate that includes such a composite material of a glass material and an organic resin, a highly reliable and flexible touch panel can be provided.

The transistors each include a conductive layer functioning as the gate electrode, the semiconductor layer, a conductive layer functioning as the source electrode, a conductive layer functioning as the drain electrode, and an insulating layer functioning as a gate insulating layer. FIG. 26 shows the case where a bottom-gate transistor is used.

Note that there is no particular limitation on the structure of the transistor included in the touch panel of one embodiment of the present invention. For example, a staggered transistor or an inverted staggered transistor may be used. A top-gate type or a bottom-gate type may also be used as the transistor structure. There is no particular limitation on a semiconductor material used for the transistor, and an oxide semiconductor, silicon, germanium, or the like can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

In addition, as a semiconductor material for the semiconductor layer of the transistor, an element of Group 14, a compound semiconductor, or an oxide semiconductor can be used, for example. A semiconductor containing silicon, a semiconductor containing gallium arsenide, an oxide semiconductor containing indium, or the like can be typically used.

In particular, an oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because the off-state current of the transistor can be reduced.

For example, the oxide semiconductor preferably contains at least indium (In) or zinc (Zn). More preferably, an oxide represented by In-M-Zn-based oxide (M is a metal such as Al, Ti, Ga, Ge, Y, Zr, Sn, La, Ce, or Hf) is included.

As the semiconductor layer, it is particularly preferable to use an oxide semiconductor film including a plurality of crystal parts. The c-axes of the crystal parts are oriented substantially perpendicular to a surface on which the semiconductor layer is formed or the top surface of the semiconductor layer, and no grain boundary is observed between adjacent crystal parts.

Such an oxide semiconductor without grain boundary prevents a crack in an oxide semiconductor film from being caused by stress generated when the display panel is curved. Consequently, such an oxide semiconductor is preferably used for a flexible touch panel that is curved when used.

Moreover, the use of such an oxide semiconductor with crystallinity for the semiconductor layer makes it possible to provide a highly reliable transistor in which a change in the electric characteristics is suppressed.

In addition, a transistor with an oxide semiconductor whose band gap is wider than that of silicon can hold electric charge stored in a capacitor that is series-connected to the transistor for a long time, owing to its low off-state current. The use of such a transistor in pixels allows a driver circuit to stop while the gray level of an image displayed in display regions is maintained. As a result, a display device with extremely low power consumption can be obtained.

Alternatively, silicon is preferably used as a semiconductor in which a channel of the transistor is formed. Silicon may be amorphous silicon but is preferably silicon having crystallinity. For example, microcrystalline silicon, polycrystalline silicon, single crystal silicon, or the like is preferably used. In particular, polycrystalline silicon can be formed at a lower temperature than single crystal silicon and has higher field-effect mobility and higher reliability than amorphous silicon. The use of such a polycrystalline semiconductor in pixels increases the aperture ratio of the pixels. Even in the case where pixels are provided at extremely high resolution, a scan line driver circuit and a signal line driver circuit can be formed over the same substrate as the pixels, and the number of components of an electronic device can be reduced.

As materials for a conductive layer such as a gate, a source, and a drain of a transistor, and a wiring or an electrode included in the touch panel, a metal such as aluminum, titanium, chromium, nickel, copper, yttrium, zirconium, molybdenum, silver, tantalum, or tungsten, an alloy containing any of these metals as its main component, or the like can be given. A single-layer or stacked-layer structure including a film containing any of these materials can also be used. For example, a single-layer structure of an aluminum film containing silicon; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film over the titanium film or the titanium nitride film, and a titanium film or a titanium nitride film thereover are stacked; a three-layer structure in which a molybdenum film or a molybdenum nitride film, an aluminum film or a copper film over the molybdenum film or the molybdenum nitride film, and a molybdenum film or a molybdenum nitride film thereover are stacked; and the like are given. Note that a transparent conductive material containing indium oxide, tin oxide, or zinc oxide may also be used. In addition, copper containing manganese is preferably used because controllability of shape by etching is increased.

In addition, as a light-transmitting material that can be used for conductive layers such as a variety of wirings and electrodes in the touch panel, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the film thickness is set small enough to transmit light. Alternatively, a stacked film of any of the above materials can be used for the conductive layers. For example, a stacked film of an alloy of silver and magnesium and indium tin oxide or the like is preferably used because the conductivity can be increased.

As an insulating material that can be used for the insulating layers, the overcoat, the spacer, and the like, a resin such as an acrylic or an epoxy, a resin having a siloxane bond, and an inorganic insulating material such as silicon oxide, silicon oxynitride, silicon nitride oxide, silicon nitride, or aluminum oxide can be used.

In addition, the light-emitting element is preferably provided between a pair of insulating films with low water permeability, in which case impurities such as water can be prevented from entering the light-emitting element. Thus, a decrease in device reliability can be prevented.

As the insulating film with low water permeability, a film containing nitrogen and silicon such as a silicon nitride film or a silicon nitride oxide film, a film containing nitrogen and aluminum such as an aluminum nitride film, and the like are given. Alternatively, a silicon oxide film, a silicon oxynitride film, an aluminum oxide film, or the like may be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], more preferably lower than or equal to $1\times10^{-8}$ [g/(m$^2$·day)].

For the adhesive layers, any of a variety of types of curable adhesives, e.g., a light curable adhesive such as a UV curable adhesive, a reactive curable adhesive, a heat curable adhesive, and an anaerobic adhesive, can be used. As these adhesives, an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, and the like are given. In particular, a material with low moisture permeability, such as an epoxy resin, is preferred. Alternatively, a two-component type resin may be used. Alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering a functional element, thereby improving the reliability of the display panel.

In addition, a filler with a high refractive index or a light-scattering member may be mixed into the resin, in which case the efficiency of light extraction from the light-emitting element can be improved. For example, titanium oxide, barium oxide, zeolite, zirconium, or the like can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top-emission type, a bottom-emission type, or a dual-emission type. A conductive film that transmits visible light is used as the electrode through which light is extracted. In addition, a conductive film that reflects visible light is preferably used as the electrode through which light is not extracted.

The EL layer includes at least a light-emitting layer. In addition to the light-emitting layer, the EL layer may further include a layer containing any of a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), and the like.

For the EL layer, either a low-molecular compound or a high-molecular compound can be used, and an inorganic compound may also be included. Each of the layers included in the EL layer can be formed by a method such as an evaporation method (including a vacuum evaporation method), a transfer method, a printing method, an inkjet method, or a coating method.

When a voltage higher than the threshold voltage of the light-emitting element is applied between a cathode and an anode, holes are injected to the EL layer from the anode side and electrons are injected from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the light-emitting substances are selected such that the colors of light emission of two or more light-emitting substances are complementary to each other, so that white light emission can be obtained. For example, it is preferable to contain two or more selected from light-emitting substances emitting light of R (red), G (green), B (blue), Y (yellow), O (orange), and the like and light-emitting substances emitting light containing two or more colors of spectral components of R, G, and B. In addition, a light-emitting element whose emission spectrum has two or more peaks in the wavelength range of a visible light region (e.g., 350 nm-750 nm) is preferably used. In addition, an emission spectrum of a material having a peak in a yellow wavelength range preferably includes spectral components also in green and red wavelength ranges.

More preferably, a light-emitting layer containing a light-emitting material emitting light of one color and a light-emitting layer containing a light-emitting material emitting light of another color are stacked in the EL layer. For example, the plurality of light-emitting layers in the EL layer may be stacked in contact with each other or may be stacked with a region which does not include any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

In addition, the light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, zinc oxide to which gallium is added, or the like. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to have a light-transmitting property to be used. Alternatively, a stacked film of any of the above materials can be used for the conductive layers. For example, a stacked film of an alloy of silver and magnesium and indium tin oxide or the like is preferably used, in which case conductivity can be increased. Alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum and titanium, nickel, or neodymium (an aluminum alloy) may be used. Alternatively, an alloy containing silver and copper, palladium, or magnesium may be used. An alloy containing silver and copper is preferable because of its high heat resistance. Furthermore, when a metal film or a metal oxide film is stacked in contact with an aluminum film or an aluminum alloy film, oxidation of the aluminum alloy film can be suppressed. As a material for the metal film or the metal oxide film, titanium, titanium oxide, and the like are given. Alternatively, the above conductive film that transmits visible light and a film containing a metal material may be stacked. For example, a stacked film of silver and indium tin oxide, a stacked film of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

The above is the description of the components.

Examples whose structures are partly different from that of the above cross-sectional Structure Example 1 will be described below with reference to the drawings. Note that the description of the portions already described is omitted and different portions are described below.

<Cross-Sectional Structure Example 2>

Figure 27:
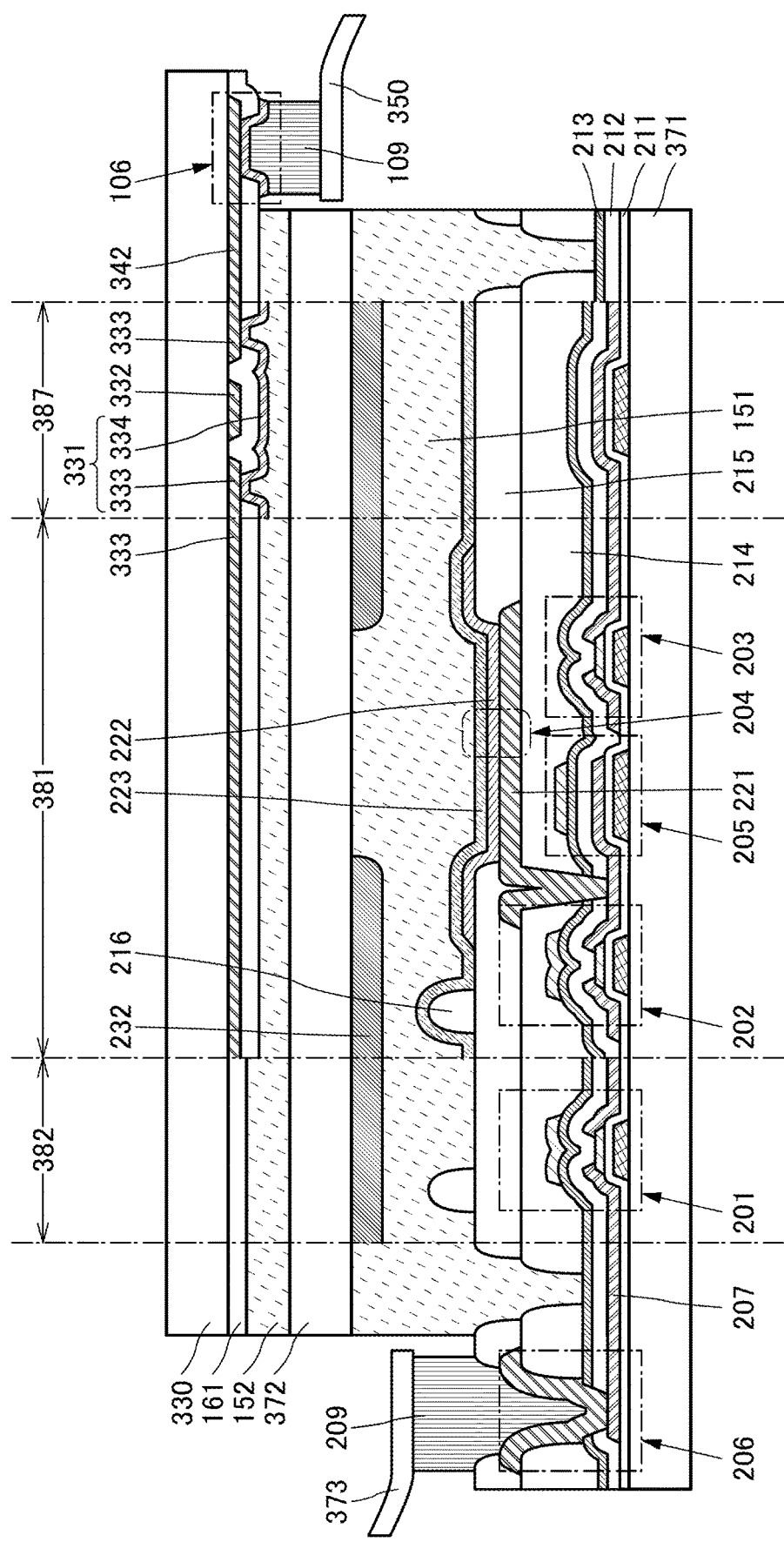
FIG. 27 A structure example of an input/output device according to an embodiment.

FIG. 27 illustrates a cross-sectional structure example of the touch panel 100 whose structure is partly different from that in FIG. 26. Note that the description of the portions already described is omitted and different portions are described.

In FIG. 27, in the transistor 201 and the transistor 202, conductive layers functioning as their second gates are provided between the insulating layer 213 and the insulating layer 214. Such a structure is preferable because the voltage to be applied to the second gates can be lowered as compared with the structure in FIG. 26.

In addition, FIG. 27 illustrates an example of the case where the display element 204 is formed by a separate coloring method. Specifically, in pixels for different colors, EL layers 222 which emit light of different colors are formed. In addition, in a region outside the light-emitting region of the display element 204, an end portion of the EL layer 222 is covered with the second electrode 223. The EL layer 222 can be formed by, for example, an evaporation method using a metal mask, a printing method, an inkjet method, or the like.

In addition, in the example illustrated in FIG. 27, the optical adjustment layer 224 and the coloring layer 231 illustrated in FIG. 26 are not provided.

Note that the structure of the transistors, the structure of the display element 204, and the like which are illustrated here can be interchanged with any of the structures of the transistors, display elements, and the like which are illustrated in FIG. 26 and in the following cross-sectional structures.

The above is the description of the cross-sectional Structure Example 2.

<Cross-Sectional Structure Example 3>

Figure 28:
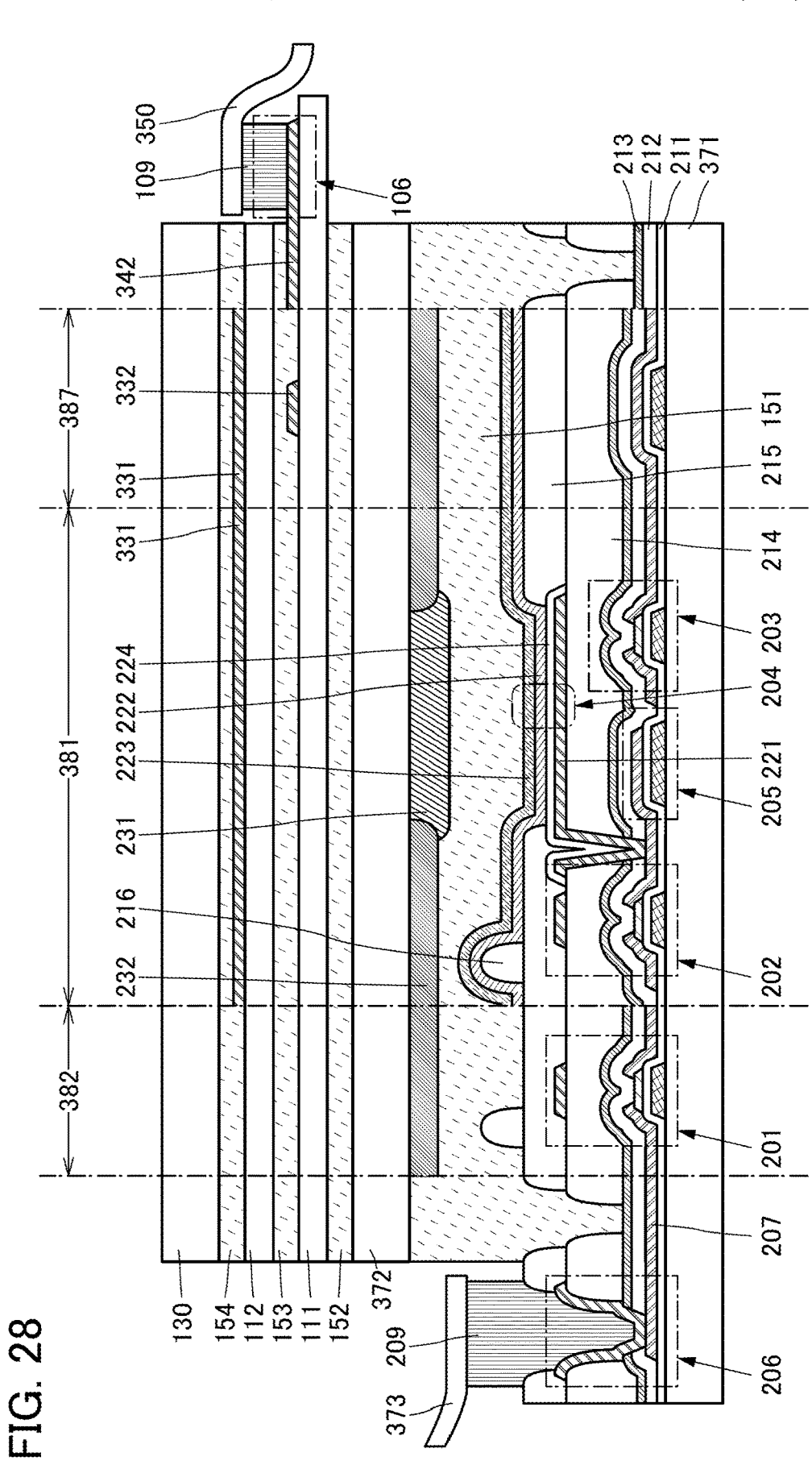
FIG. 28 A structure example of an input/output device according to an embodiment.

A touch panel illustrated in FIG. 28 includes a substrate 111 and a substrate 112. The substrate 111 and the substrate 372 are bonded to each other with the adhesive layer 152, and the substrate 111 and the substrate 112 are bonded to each other with an adhesive layer 153.

The electrode 332, the wiring 342, and the like are formed over the substrate 111. In addition, the electrode 331, the wiring 341 (not illustrated), and the like are formed over the substrate 112. In FIG. 28, the FPC 350 is provided over the substrate 111; an FPC is similarly connected to the substrate 112 in a region not illustrated in the drawing.

In the case where two substrates are used in the structure of the input device 310 as described above, substrates as thin as, or thinner than, the substrate 371 and the substrate 372 are preferably used as the substrate 111 and the substrate 112. It is particularly preferable to use a material having flexibility for the substrate 111 and the substrate 112, in which case the thickness of the touch panel 100 can be decreased.

Alternatively, a protective substrate 130 may be provided over the substrate 112 with an adhesive layer 154 therebetween as illustrated in FIG. 28. A surface of the protective substrate 130 on a side opposite to the substrate 112 side functions as a touch surface. The above description of the substrate 330 can be referred to for a material of the protective substrate 130.

<Cross-Sectional Structure Example 4>

Figure 29:
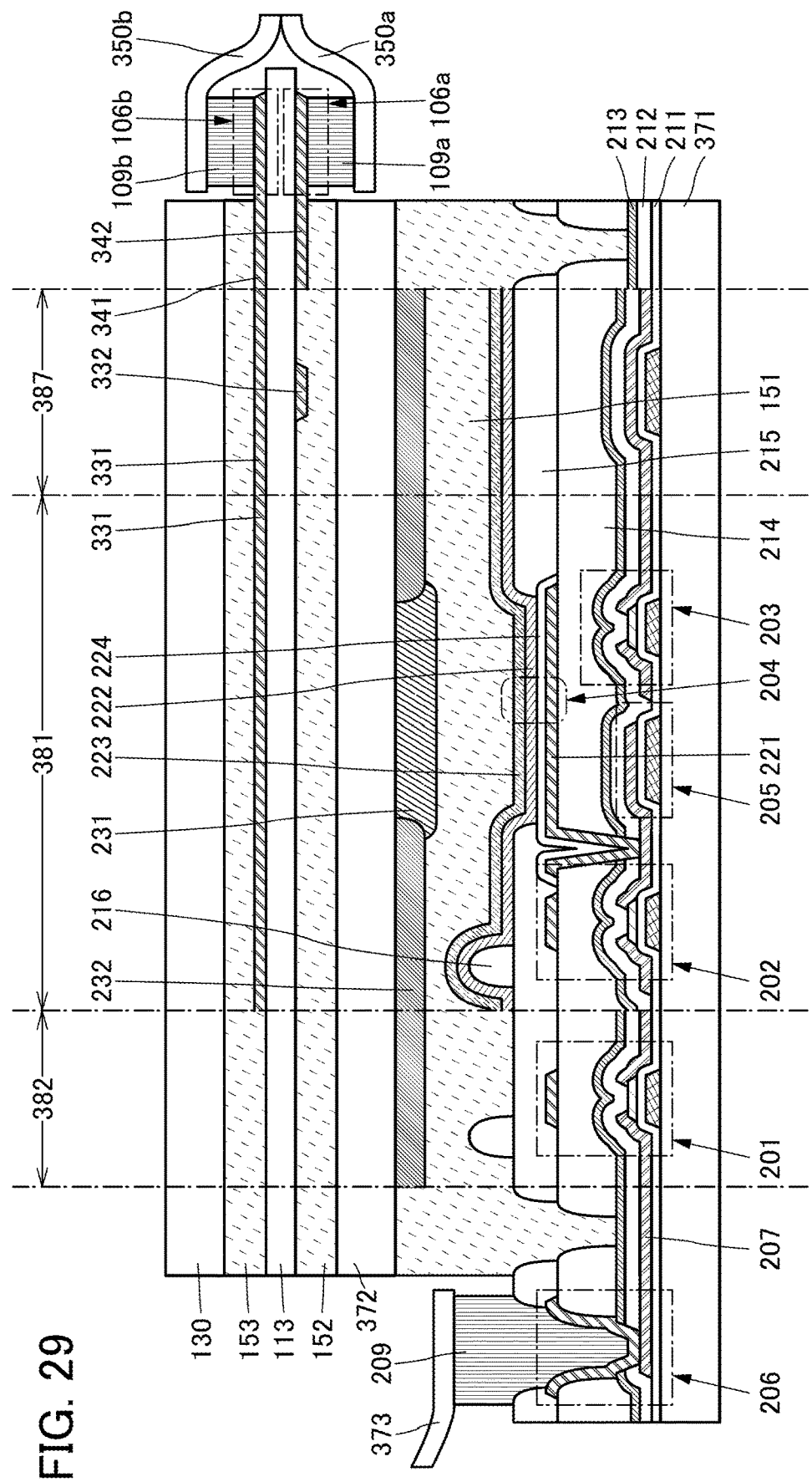
FIG. 29 A structure example of an input/output device according to an embodiment.

A touch panel illustrated in FIG. 29 includes a substrate 113. The substrate 113 and the substrate 372 are bonded to each other with the adhesive layer 152.

The substrate 113 is provided with the electrode 332, the wiring 342, and the like on one side. The substrate 113 is also provided with the electrode 331, the wiring 341, and the like on the other side. That is, the electrodes and wirings in the touch sensor are provided on both sides of the substrate 113.

In addition, FIG. 29 illustrates an example in which an FPC 350a and a connection layer 109a are provided in a connection portion 106a where part of the wiring 342 is exposed, and an FPC 350b and a connection layer 109b are provided in a connection portion 106b where part of the wiring 341 is exposed. Note that the connection portion 106a and the connection portion 106b may overlap with each other in a plan view, or may be displaced positioned so as not to overlap with each other.

<Cross-Sectional Structure Example 5>

Figure 30:
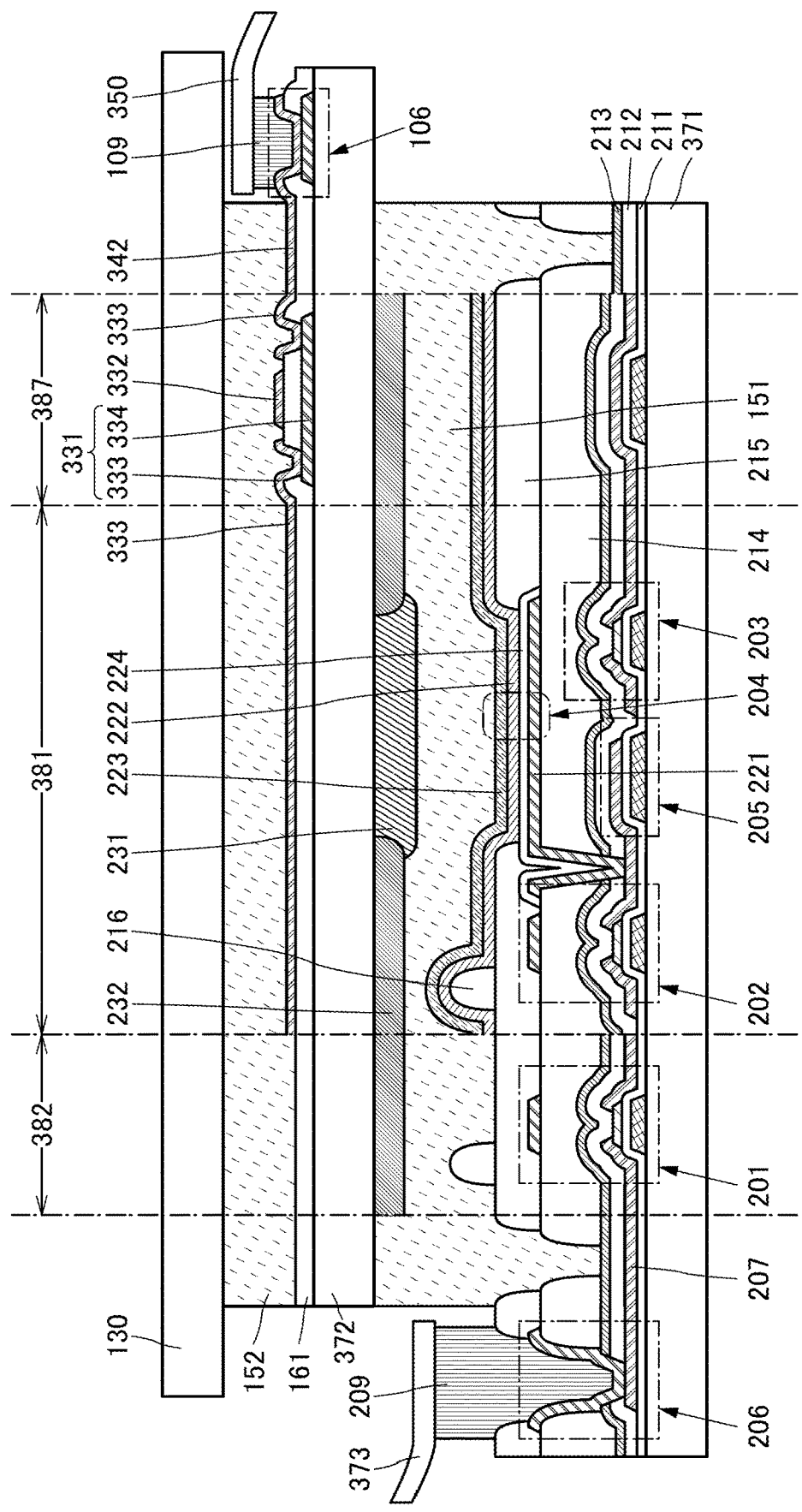
FIG. 30 A structure example of an input/output device according to an embodiment.

In a touch panel illustrated in FIG. 30, the electrodes and the like in the touch sensor are provided on the side of the substrate 372 opposite to the substrate 371. Specifically, the bridge electrode 334 and the insulating layer 161 covering part of the bridge electrode 334 are provided over the substrate 372, and the electrode 331, the electrode 332, the wiring 341 (not illustrated), the wiring 342, and the like are provided over the insulating layer 161.

In addition, as illustrated in FIG. 30, the protective substrate 130 and the substrate 372 may be bonded to each other with the adhesive layer 152.

In such a structure, the input device 310 and the display panel 370 can share the substrate; thus, the thickness of the touch panel can be significantly decreased.

<Cross-Sectional Structure Example 6>

Figure 31:
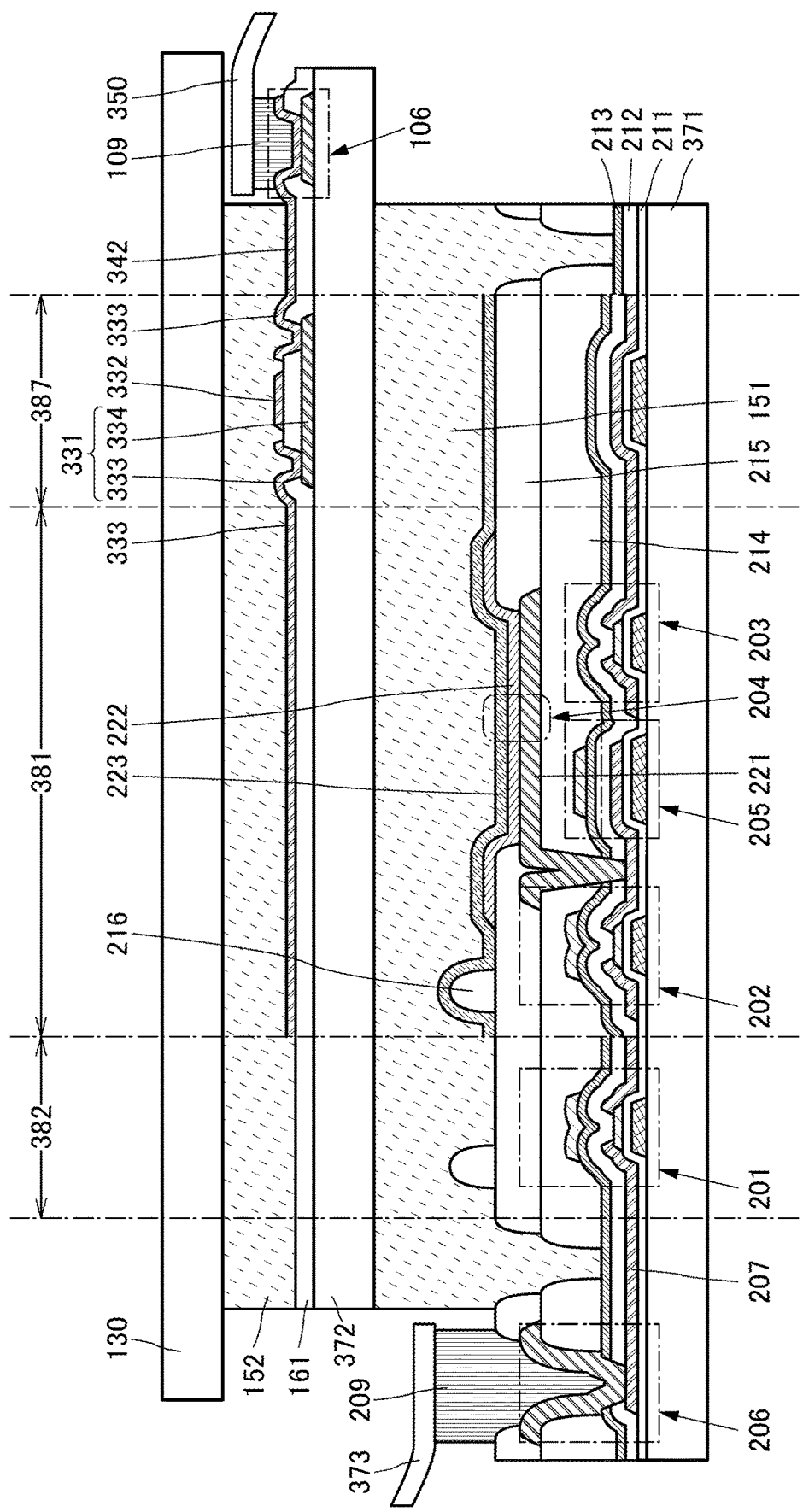
FIG. 31 A structure example of an input/output device according to an embodiment.

FIG. 31 illustrates an example of the case where the structure of the touch sensor illustrated in FIG. 30 is combined with the structure of the touch panel illustrated in FIG. 27 where the light-emitting element formed by a separate coloring method is used as the display element 204. In addition, in the example illustrated in FIG. 31, the coloring layer 231 and the light-blocking layer 232 are not provided.

<Cross-Sectional Structure Example 7>

Figure 32:
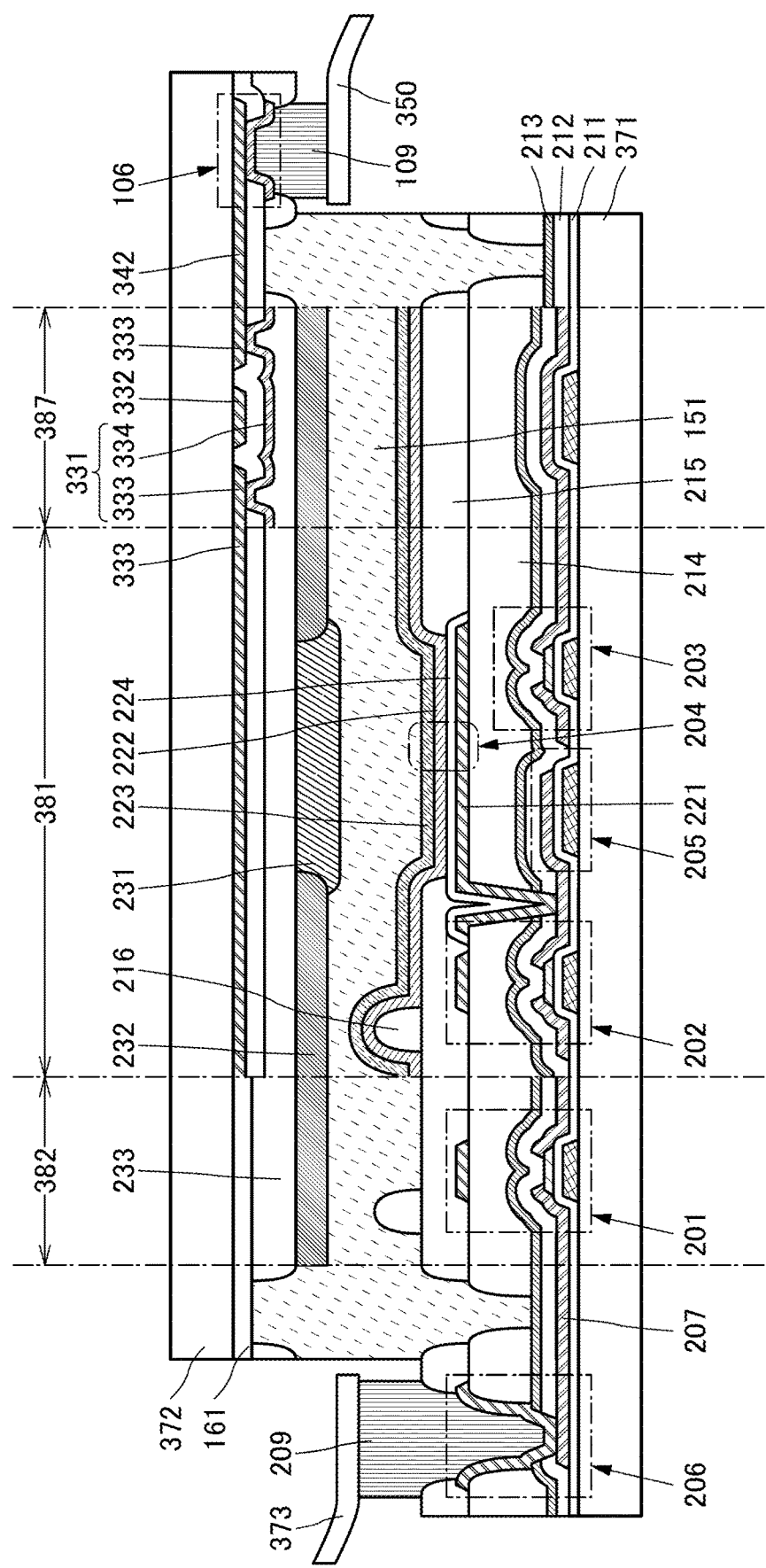
FIG. 32 A structure example of an input/output device according to an embodiment.

In a touch panel illustrated in FIG. 32, the electrodes and the like in the touch sensor are provided on the substrate 371 side of the substrate 372. Specifically, the electrode 332, the electrode 333, the wiring 341 (not illustrated), the wiring 342, and the like, and the insulating layer 161 covering these components are provided over the substrate 372; and the bridge electrode 334 and the like are provided over the insulating layer 161.

In addition, an insulating layer 233 is provided to cover the electrodes and the like in the touch sensor. Furthermore, the coloring layer 231, the light-blocking layer 232, and the like are provided over the insulating layer 233.

In such a structure, the input device 310 and the display panel 370 can share the substrate, and one surface of the substrate 372 can be used as a touch surface; thus, the thickness of the touch panel 100 can be further decreased.

<Cross-Sectional Structure Example 8>

Figure 33:
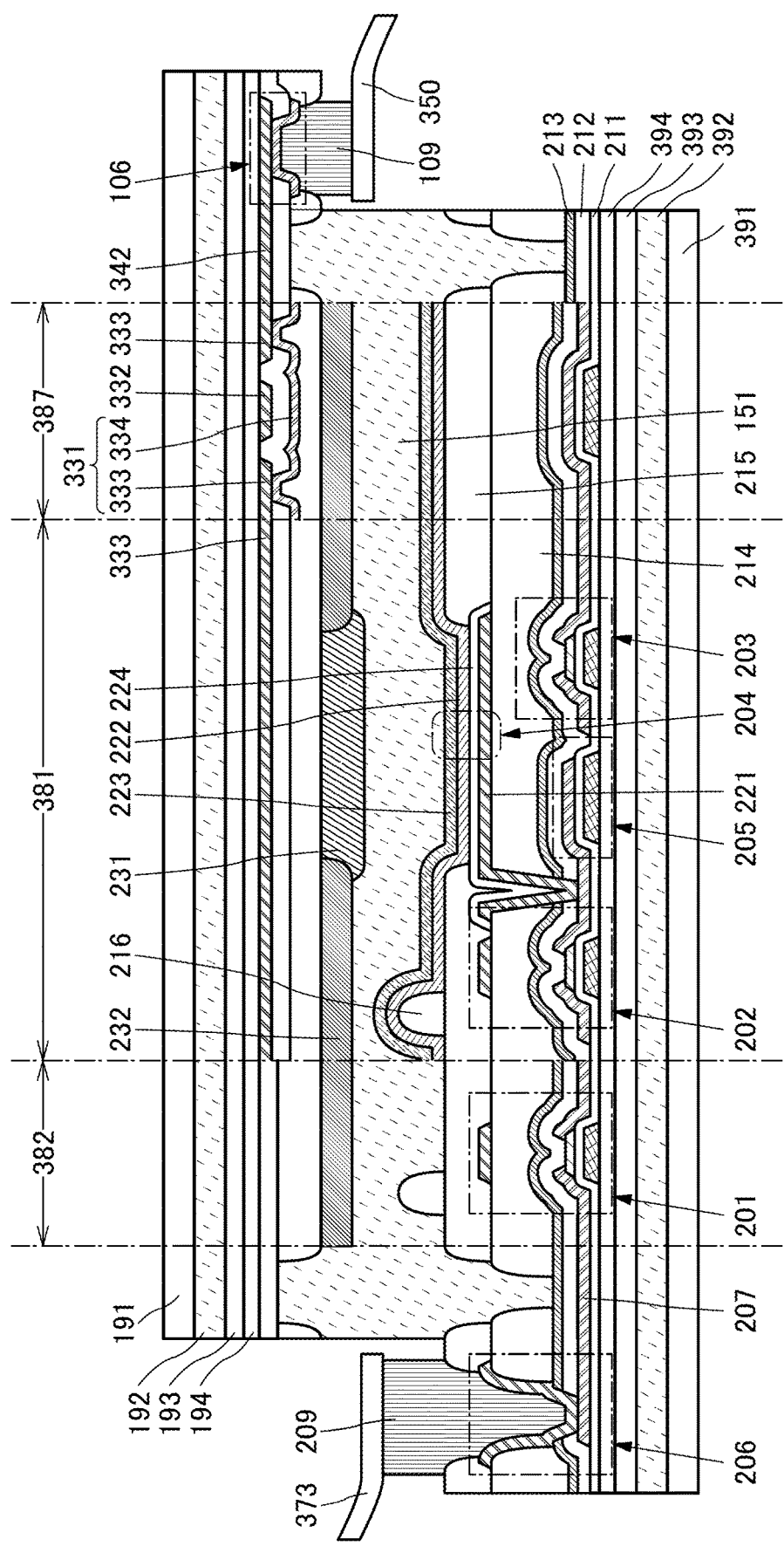
FIG. 33 A structure example of an input/output device according to an embodiment.

FIG. 33 illustrates a modification example of the touch panel illustrated in FIG. 32.

The touch panel in FIG. 33 has a stacked-layer structure including a substrate 391, an adhesive layer 392, a substrate 393, and an insulating layer 394 in place of the substrate 371. The touch panel also has a stacked-layer structure including a substrate 191, an adhesive layer 192, a substrate 193, and an insulating layer 194 in place of the substrate 372.

A material through which impurities such as water or hydrogen do not easily diffuse can be used for the insulating layer 394 and the insulating layer 194. Such a structure can effectively suppress diffusion of the impurities from the outside into the display element 204 and the transistors even in the case of using a material permeable to moisture for the substrate 391, the substrate 393, the substrate 191, and the substrate 193, and a highly reliable touch panel can be achieved.

A material such as a resin having flexibility can be used for the substrate 393 and the substrate 193. Films having flexibility or the like are preferably used as the substrate 391 and the substrate 191. With the use of a material having flexibility for these substrates, a bendable touch panel can be achieved.

<Cross-Sectional Structure Example 9>

Figure 34:
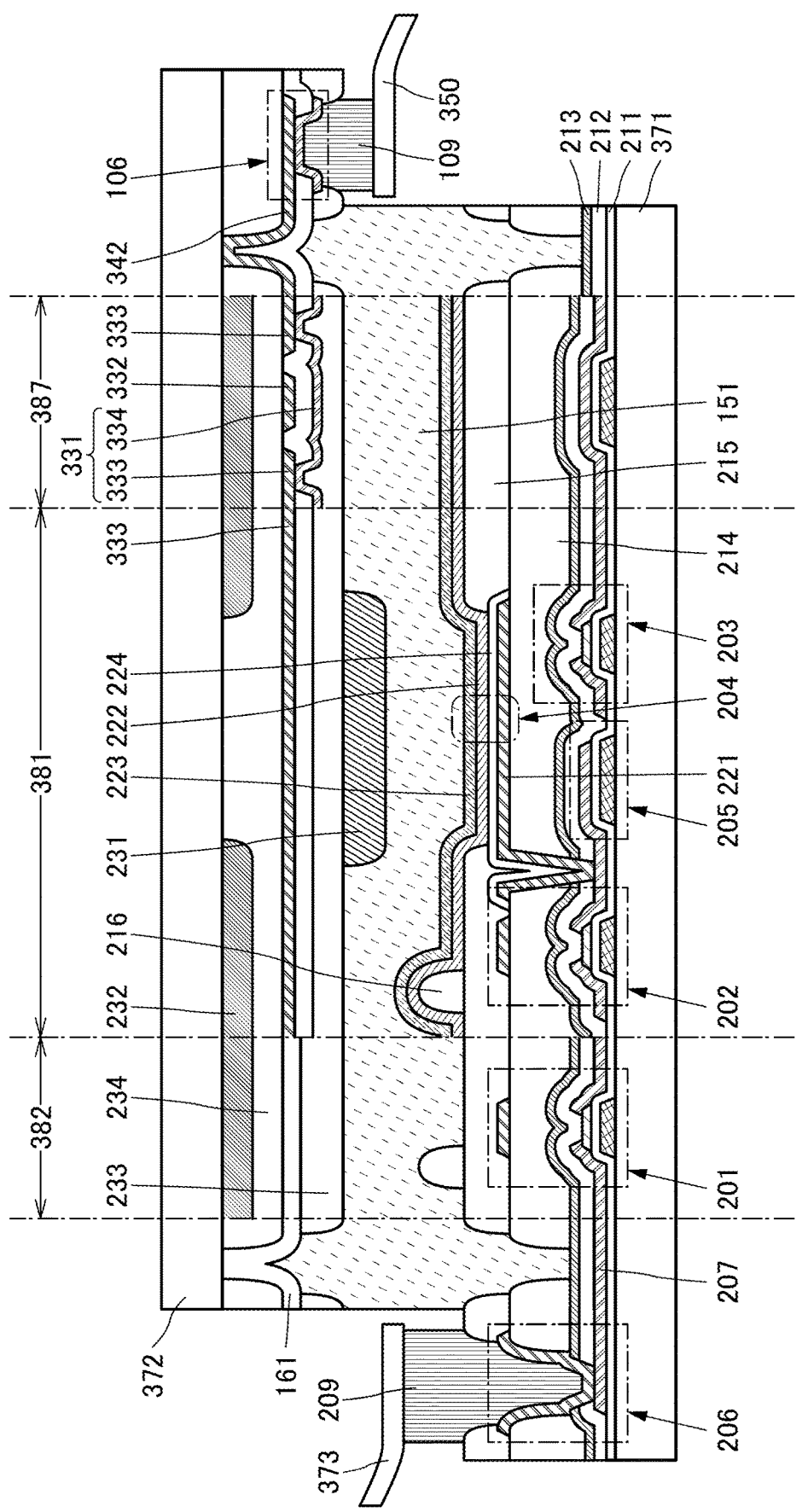
FIG. 34 A structure example of an input/output device according to an embodiment.

In a touch panel illustrated in FIG. 34, the light-blocking layer 232 is provided between the electrodes and the like in the touch sensor and the substrate 372. Specifically, the light-blocking layer 232 is provided over the substrate 372, and an insulating layer 234 is provided to cover the light-blocking layer 232. The electrode 332, the electrode 333, the wiring 341 (not illustrated), the wiring 342, and the insulating layer 161 covering these components are provided over the insulating layer 234; and the bridge electrode 334 and the like are provided over the insulating layer 161. In addition, the insulating layer 233 is provided over the bridge electrode 334 and the insulating layer 161, and the coloring layer 231 is provided over the insulating layer 233.

The insulating layer 233 and the insulating layer 234 have a function as a planarization film. Note that the insulating layer 233 and the insulating layer 234 are not necessarily provided when not needed.

In such a structure, the light-blocking layer 232 provided closer to the viewing side than the electrodes and the like in the touch sensor can prevent the electrode and the like from being visible. Thus, a touch panel with not only a small thickness but also improved visibility can be achieved.

<Cross-Sectional Structure Example 10>

Figure 35:
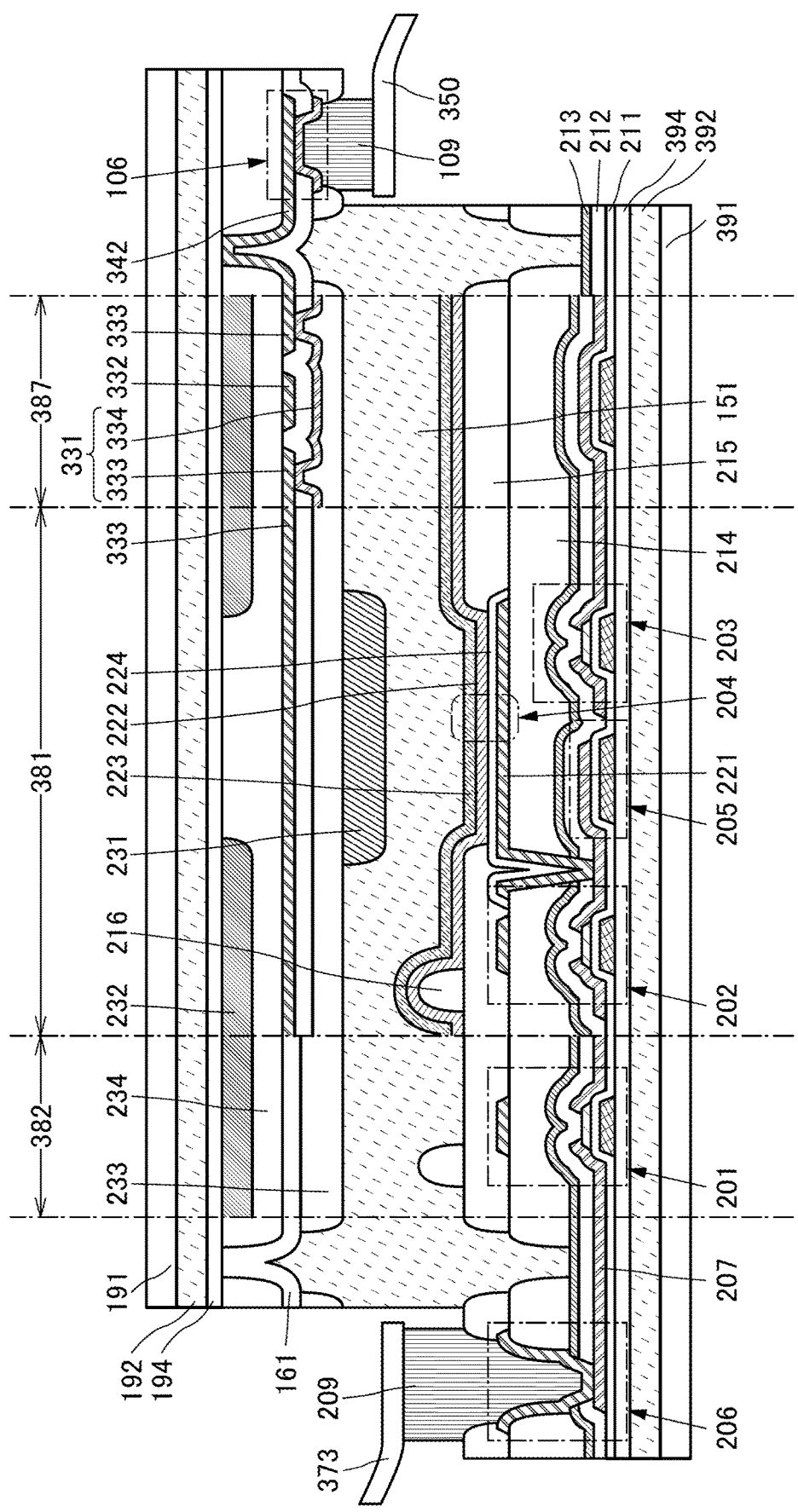
FIG. 35 A structure example of an input/output device according to an embodiment.

FIG. 35 illustrates a modification example of the touch panel illustrated in FIG. 34.

The touch panel in FIG. 35 has a stacked-layer structure including a substrate 391, an adhesive layer 392, and an insulating layer 394 in place of the substrate 371. The touch panel also has a stacked-layer structure including a substrate 191, an adhesive layer 192, and an insulating layer 194 in place of the substrate 372.

With the use of a material having flexibility for the substrate 391 and the substrate 191, a bendable touch panel can be achieved.

<Cross-Sectional Structure Example 11>

Figure 36:
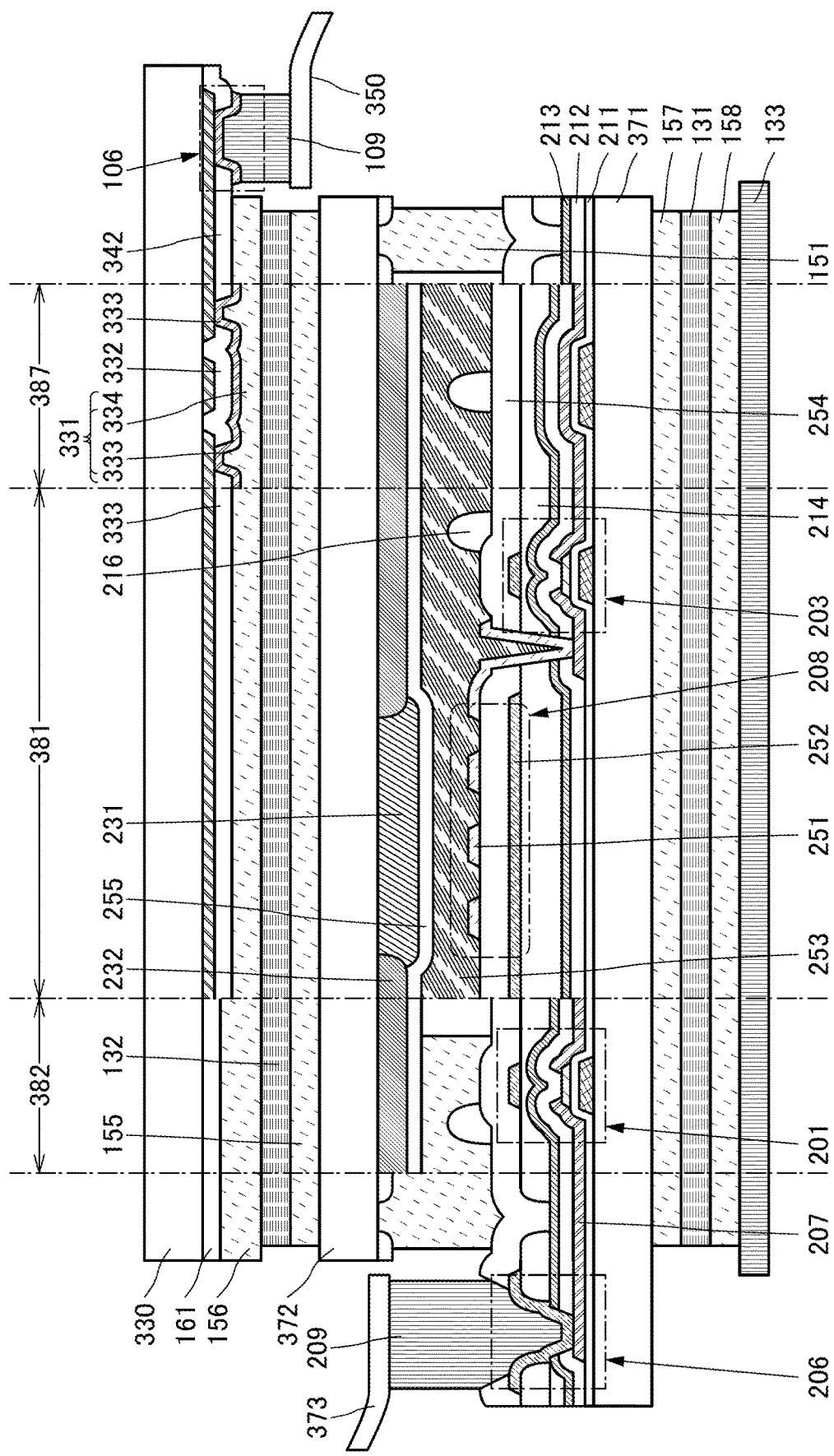
FIG. 36 A structure example of an input/output device according to an embodiment.

FIG. 36 illustrates a cross-sectional structure example of a touch panel in the case where a liquid crystal display device is used as the display panel 370. In the touch panel illustrated in FIG. 36, a liquid crystal element is used as a display element 208. In addition, the touch panel includes a polarizing plate 131, a polarizing plate 132, and a backlight 133.

In the example illustrated here, a liquid crystal element using an FFS (Fringe Field Switching) mode is used as the display element 208. The display element 208 includes an electrode 252, an electrode 251, and liquid crystal 253. The electrode 251 is provided over the electrode 252 with an insulating layer 254 provided therebetween, and has a comb-like shape or a shape provided with a slit.

In addition, an overcoat 255 is provided to cover the coloring layer 231 and the light-blocking layer 232. The overcoat 255 has a function of preventing a pigment or the like which is included in the coloring layer 231 or the light-blocking layer 232 from diffusing into the liquid crystal 253.

In addition, surfaces of the overcoat 255, the insulating layer 254, the electrode 251, and the like which are in contact with the liquid crystal 253 may be provided with alignment films for controlling the orientation of the liquid crystal 253.

In FIG. 36, the polarizing plate 131 is bonded to the substrate 371 with an adhesive layer 157. In addition, the backlight 133 is bonded to the polarizing plate 131 with an adhesive layer 158. In addition, the polarizing plate 132 is positioned between the substrate 372 and the substrate 330. The polarizing plate 132 is bonded to the substrate 372 with an adhesive layer 155, and is bonded to the substrate 330

(specifically, a portion of the insulating layer 161 formed over the substrate 330) with an adhesive layer 156.

Although the liquid crystal element using an FFS mode is described above, a VA (Vertical Alignment) mode, a TN (Twisted Nematic) mode, an IPS (In-Plane-Switching) mode, an ASM (Axially Symmetric aligned Micro-cell) mode, an OCB (Optically Compensated Birefringence) mode, an FLC (Ferroelectric Liquid Crystal) mode, an AFLC (AntiFerroelectric Liquid Crystal) mode, or the like can be used.

In addition, as the liquid crystal, thermotropic liquid crystal, low-molecular liquid crystal, high-molecular liquid crystal, ferroelectric liquid crystal, anti-ferroelectric liquid crystal, polymer dispersed liquid crystal (PDLC: Polymer Dispersed Liquid Crystal), or the like can be used. Moreover, liquid crystal exhibiting a blue phase is preferably used because an alignment film is not needed and a wide viewing angle is obtained.

<Cross-Sectional Structure Example 12>

Figure 37:
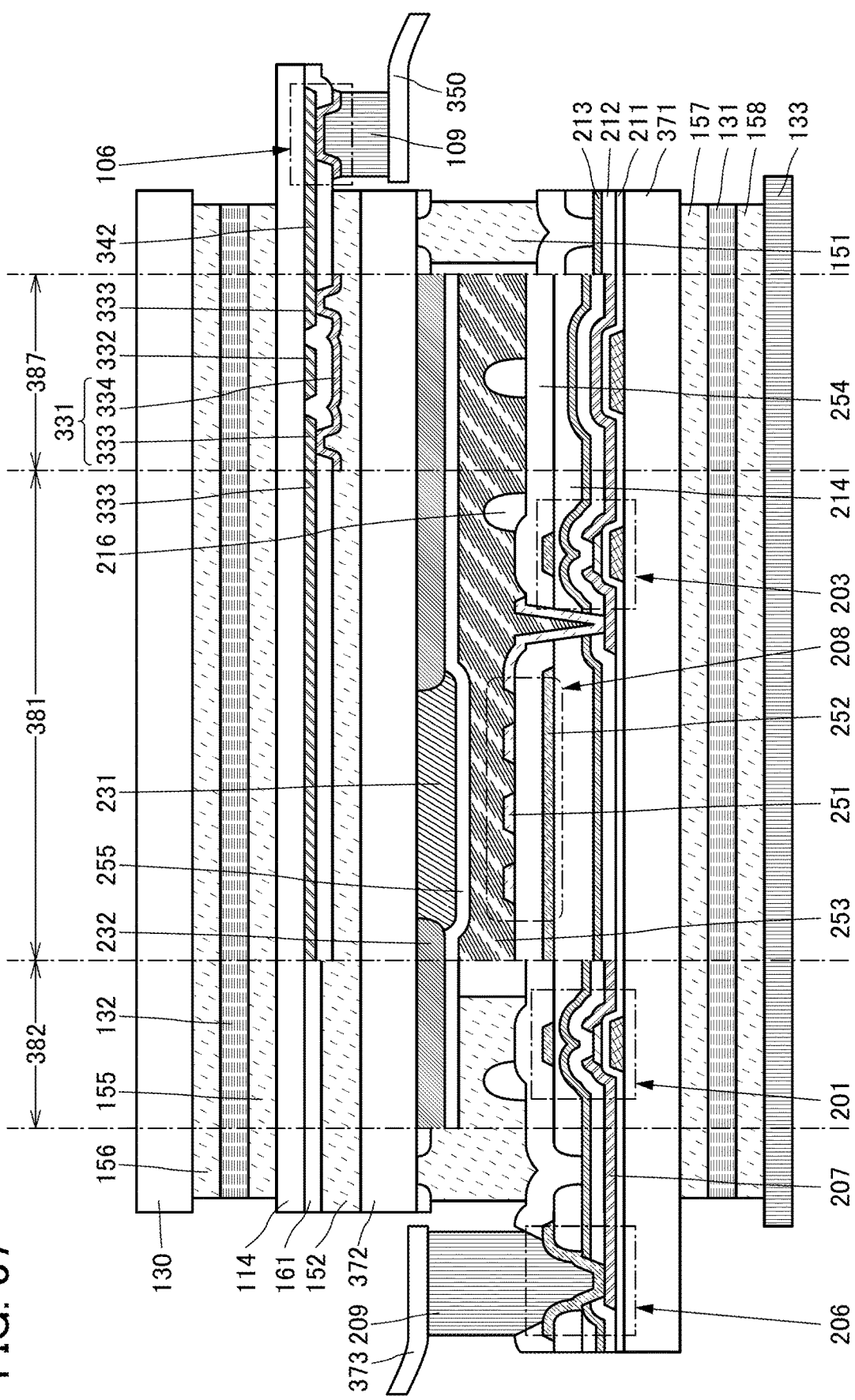
FIG. 37 A structure example of an input/output device according to an embodiment.

FIG. 37 illustrates a cross-sectional structural example of a touch panel in the case where a liquid crystal display device is used as the display panel 370. In the touch panel illustrated in FIG. 37, the polarizing plate 132 is provided closer to the viewing side than the electrodes and the like in the touch sensor. Specifically, a substrate 114 provided with the electrode 331, the electrode 332, and the like is bonded to the substrate 372 with the adhesive layer 152, and the polarizing plate 132 is bonded to the substrate 114 with the adhesive layer 155. In addition, the protective substrate 130 bonded to the polarizing plate 132 with the adhesive layer 156 is provided closer to the viewing side than the polarizing plate 132.

A film having flexibility or the like is preferably used as the substrate 114 because the thickness of the touch panel can be decreased.

<Cross-Sectional Structure Example 13>

Figure 38:
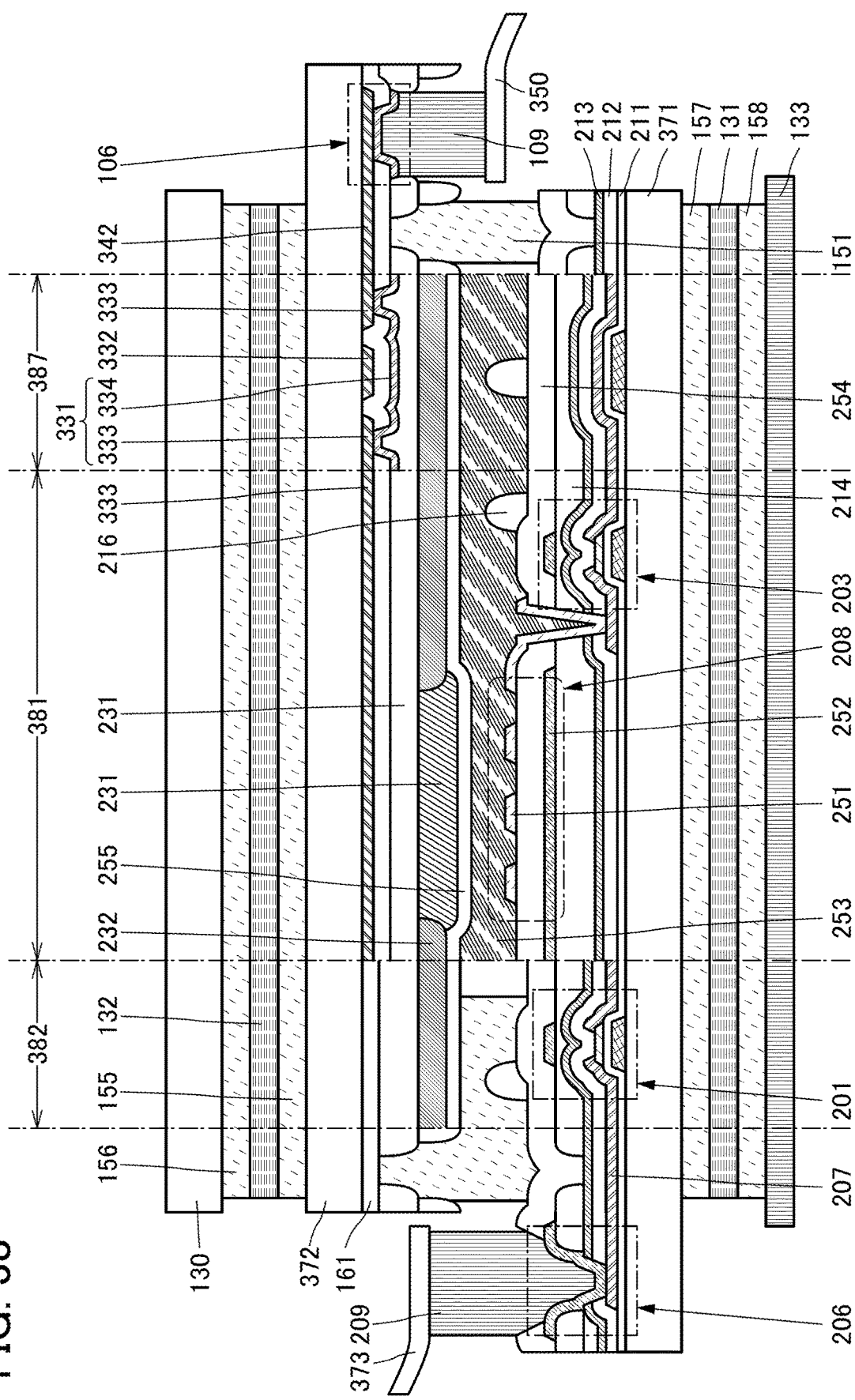
FIG. 38 A structure example of an input/output device according to an embodiment.

FIG. 38 illustrates a cross-sectional structure example of a touch panel in the case where a liquid crystal display device is used as the display panel. In the example of the touch panel illustrated in FIG. 38, the electrodes and the like of the touch sensor are formed on the substrate 371 side of the substrate 372. Specifically, the electrode 332, the electrode 333, the wiring 341 (not illustrated), the wiring 342, and the like, and the insulating layer 161 covering these components are provided over the substrate 372; and the bridge electrode 334 and the like are provided over the insulating layer 161. In addition, the insulating layer 233 is provided to cover the electrodes and the like in the touch sensor. In addition, the coloring layer 231, the light-blocking layer 232, and the like are provided over the insulating layer 233.

In addition, the polarizing plate 132 is bonded to the opposite side of the substrate 372 with the adhesive layer 155. In addition, the protective substrate 130 is bonded to the polarizing plate 132 with the adhesive layer 156.

In such a structure, the input device and the display panel can share the substrate and one surface of the substrate 372 can be used as a touch surface; thus, the thickness of the touch panel can be further decreased.

<Cross-Sectional Structure Example 14>

Figure 39:
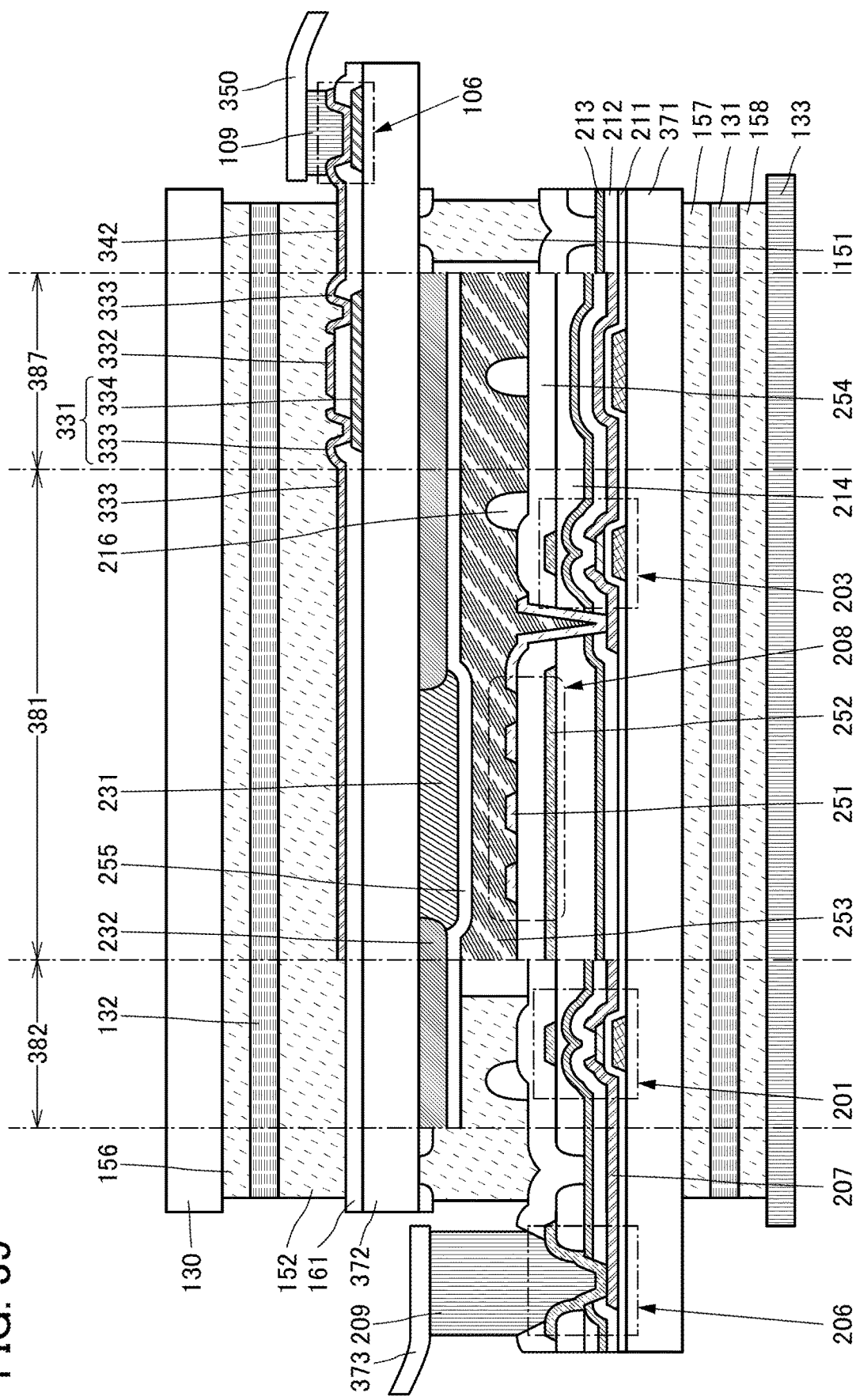
FIG. 39 A structure example of an input/output device according to an embodiment.

FIG. 39 illustrates a cross-sectional structure example of a touch panel in the case where a liquid crystal display device is used as the display panel. In the example of the touch panel illustrated in FIG. 39, the electrodes and the like in the touch sensor are provided on a side of the substrate 372 opposite to the substrate 371 side. Specifically, the bridge electrode 334 and the insulating layer 161 covering part of the bridge electrode 334 are provided over a surface of the substrate 372 on a side opposite to the side where the coloring layer 231 and the like are provided; and the electrode 331, the electrode 332, the wiring 341 (not illustrated), the wiring 342, and the like are provided over the insulating layer 161. In addition, the polarizing plate 132 is attached to the substrate 372 with the adhesive layer 152, and the protective substrate 130 is attached to the polarizing plate 132 with the adhesive layer 156.

<Cross-Sectional Structure Example 15>

Figure 40:
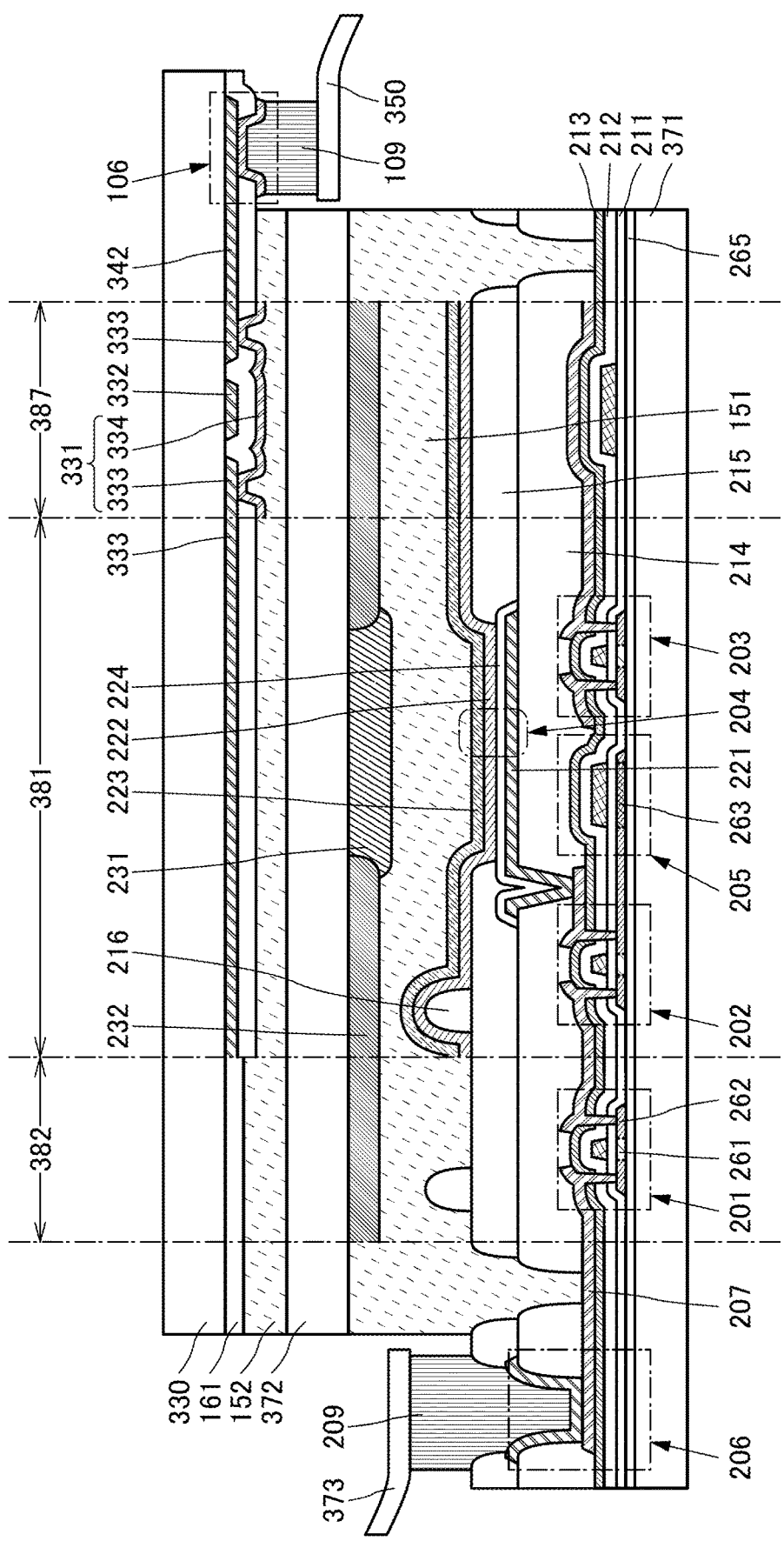
FIG. 40 A structure example of an input/output device according to an embodiment.

FIG. 40 illustrates an example of the case where a top-gate transistor is used as each of the transistor 201, the transistor 202, and the transistor 203 in the cross-sectional structural example illustrated in FIG. 26.

Each of the transistors includes a semiconductor layer 261, and a gate electrode is provided over the semiconductor layer 261 with the insulating layer 211 provided therebetween. In addition, the semiconductor layer 261 may include a low-resistance region 262.

Source electrodes and drain electrodes of the transistors are provided over the insulating layer 213 and electrically connected to the regions 262 through openings provided in the insulating layer 213, the insulating layer 212, and the insulating layer 211.

FIG. 40 also illustrates an example in which the capacitor 205 has a stacked-layer structure including a layer formed by processing the same semiconductor film as the semiconductor layer 261, the insulating layer 211, and a layer formed by processing the same conductive film as the gate electrode. It is preferable here that a region 263 having a higher conductivity than a region in which a channel of the transistor is formed be formed in a portion of the semiconductor film of the capacitor 205.

The region 262 and the region 263 can be, for example, a region containing a larger amount of impurities than the region where the channel of the transistor is formed, a region with a high carrier concentration, a region with low crystallinity, or the like. An impurity which can increase the conductivity depends on a semiconductor used for the semiconductor layer 261; typically, an element that can impart n-type conductivity, such as phosphorus, an element that can impart p-type conductivity, such as boron, a rare gas such as helium, neon, or argon, hydrogen, lithium, sodium, magnesium, aluminum, nitrogen, fluorine, potassium, calcium, or the like can be given. In addition to the above, titanium, iron, nickel, copper, zinc, silver, indium, tin, or the like also functions as an impurity which influences the conductivity of the semiconductor. For example, the region 262 and the region 263 contain the above impurity in a larger amount than the region where the channel of the transistor is formed.

<Cross-Sectional Structure Example 16>

Figure 41:
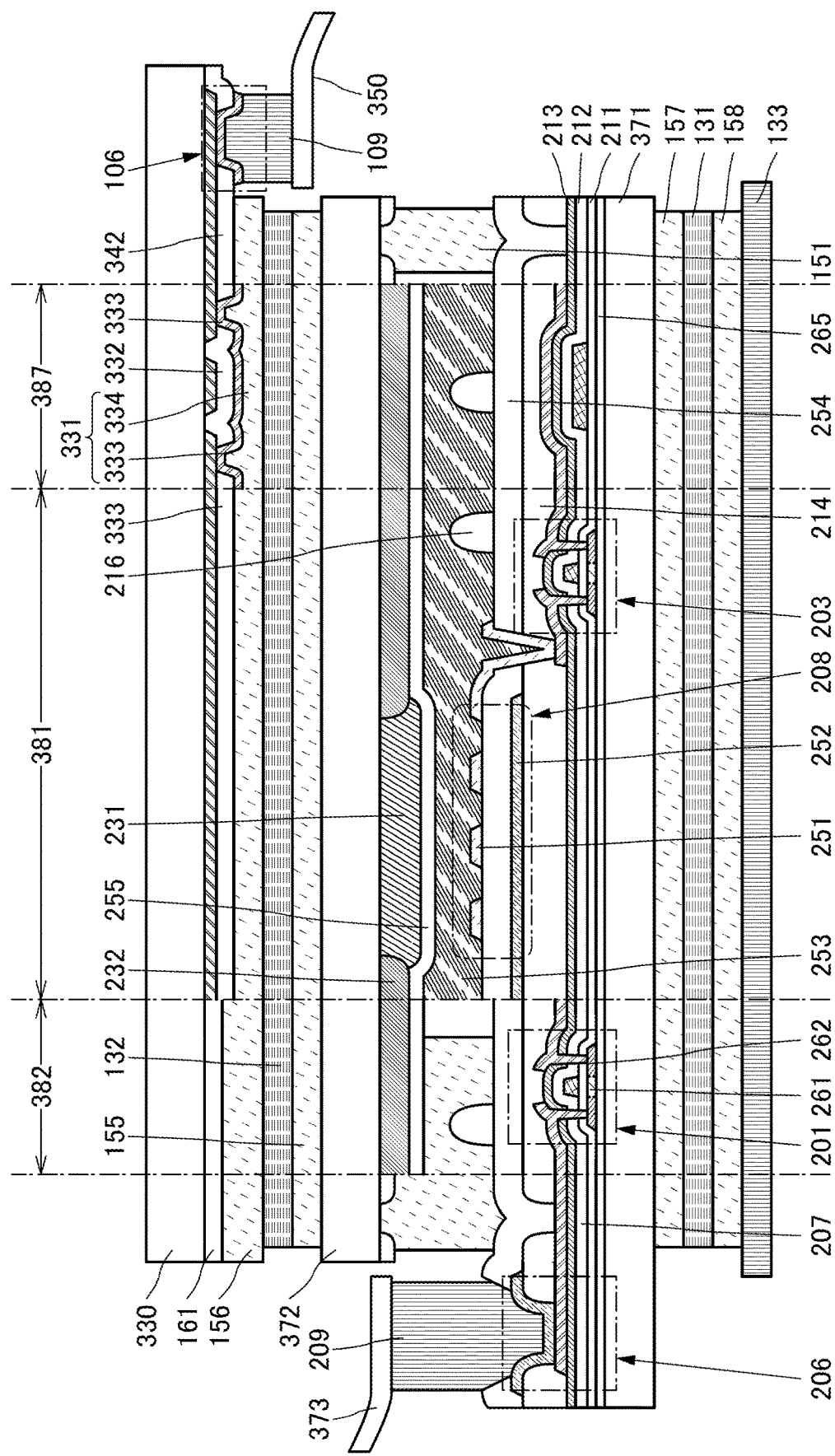
FIG. 41 A structure example of an input/output device according to an embodiment.

FIG. 41 illustrates an example of the case where top-gate transistors are used as the transistor 201 and the transistor 203 in the cross-sectional structural example illustrated in FIG. 36.

Modification Example

Figure 42A:
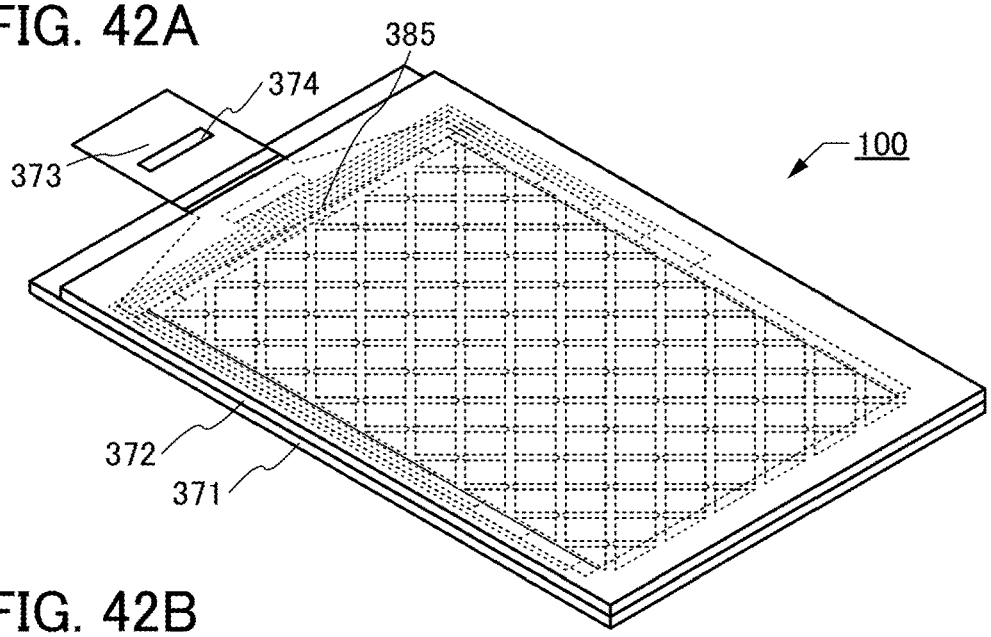
FIGS. 42A and 42B A structure example of an input/output device according to an embodiment.

FIGS. 42(A) and (B) are perspective schematic views of the touch panel 100 whose structure is partly different from the structure illustrated in each drawing of FIG. 25.

In FIGS. 42(A) and (B), the substrate 372 of the display panel 370 is provided with the input device 310. In addition, the wiring 341, the wiring 342, and the like of the input device 310 are electrically connected to the FPC 373 provided for the display panel 370 through a connection portion 385.

With such a structure, the FPC connected to the touch panel 100 can be provided only on one substrate side (on the substrate 371 side here). In addition, although two or more FPCs may be attached to the touch panel 100, it is preferable that the touch panel 100 be provided with one FPC 373 and the FPC 373 has a function of supplying signals to both the display panel 370 and the input device 310 as illustrated in FIGS. 42(A) and (B), for the simplicity of the structure.

In addition, in that case, the IC 374 can have a function of driving the input device 310. Alternatively, an IC for driving the input device 310 may further be provided. Alternatively, an IC for driving the input device 310 may be mounted on the substrate 371.

Figure 42B:
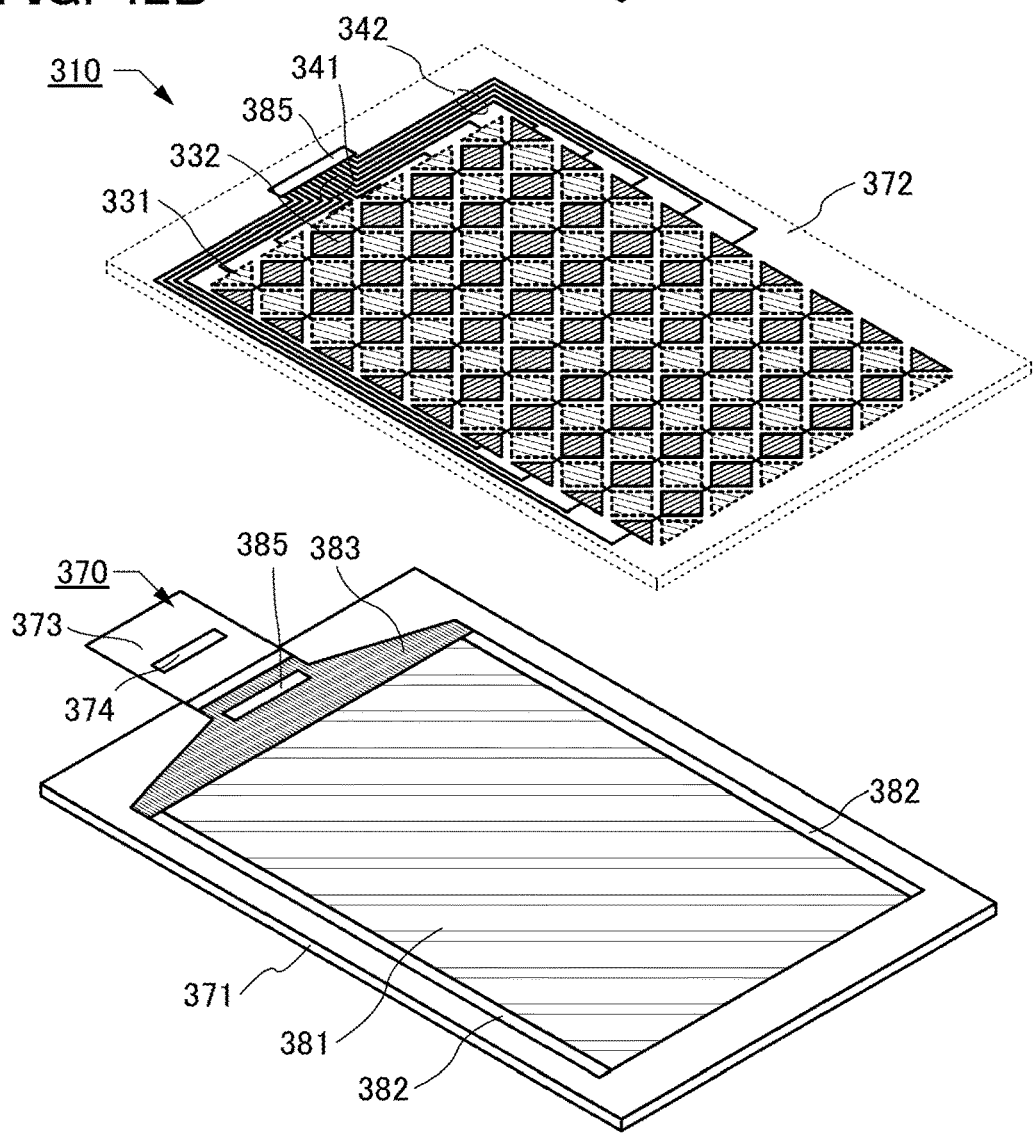
Figure 43:
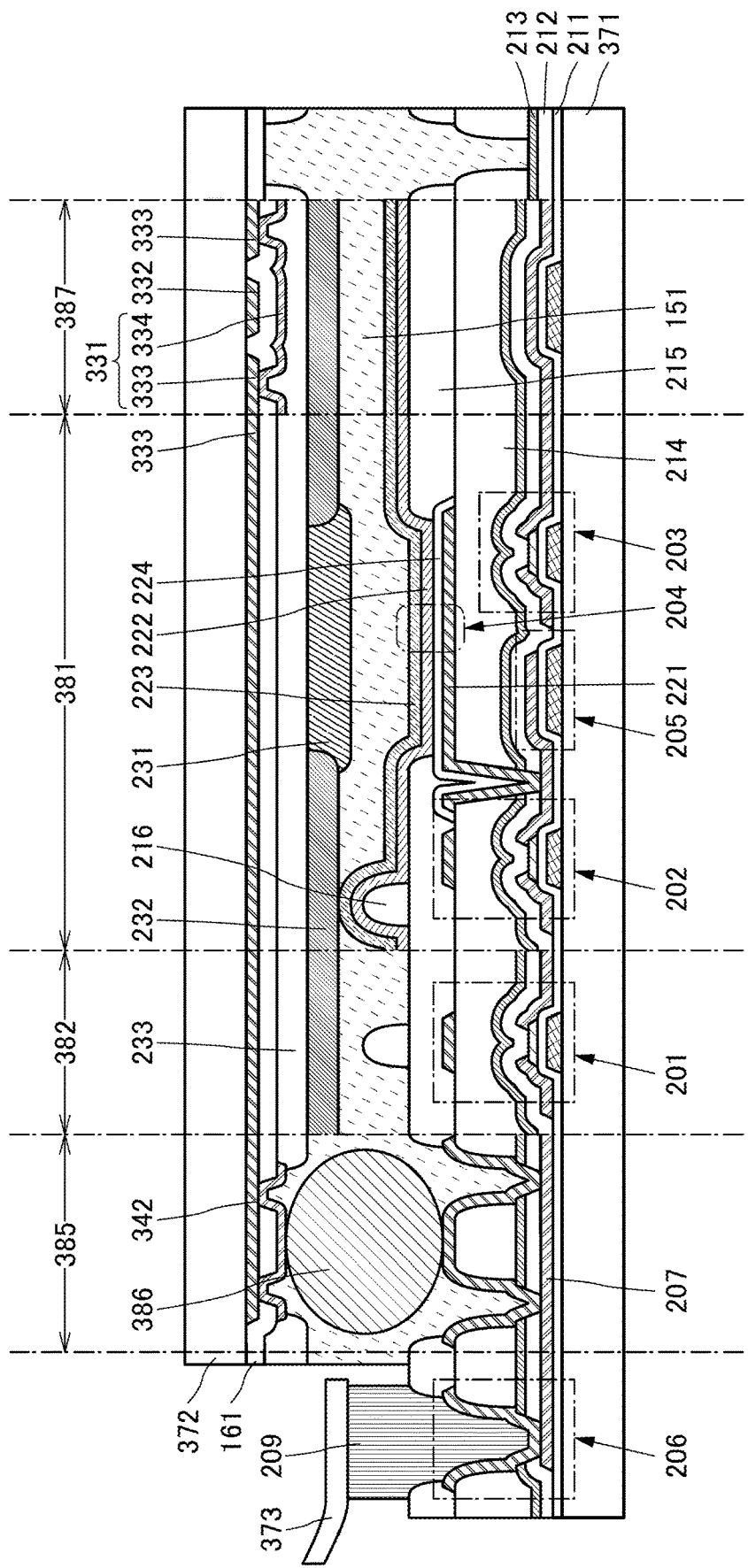
FIG. 43 A structure example of an input/output device according to an embodiment.

FIG. 43 illustrates the cross sections of a region including the FPC 373, a region including the connection portion 385, a region including the driver circuit 382, and a region including the display portion 381 in FIG. 42.

In the connection portion 385, one of the wirings 342 (or the wirings 341) and one of the wirings 207 are electrically connected to each other through a connector 386.

As the connector 386, a conductive particle can be used, for example. As the conductive particle, a particle of an organic resin, silica, or the like whose surface is coated with a metal material can be used. It is preferable to use nickel or gold as the metal material because contact resistance can be decreased. It is also preferable to use a particle coated with layers of two or more kinds of metal materials, such as a particle coated with nickel and further with gold. In addition, as the connector 386, a material capable of elastic deformation or plastic deformation is preferably used. As illustrated in FIG. 43, the conductive particle here has a shape that is vertically crushed in some cases. Accordingly, the contact area between the connector 386 and a conductive layer electrically connected to the connector 386 can be increased, thereby reducing contact resistance and suppressing the generation of problems such as disconnection.

The connector 386 is preferably provided so as to be covered with the adhesive layer 151. For example, a paste or the like for forming the adhesive layer 151 may be applied, and then, the connectors 386 may be scattered in the connection portion 385. By providing the connection portion 385 in a portion where the adhesive layer 151 is provided, not only a structure in which the adhesive layer 151 is also provided over the display element 204 as illustrated in FIG. 43 (also referred to as a solid sealing structure) but also, for example, a structure in which the adhesive layer 151 is provided in the peripheral portion, such as a light-emitting device, a liquid crystal display device, or the like having a hollow sealing structure, can be similarly applied.

The above is the description of the cross-sectional structure examples.

<Structure Example of In-Cell Touch Panel>

Although the case where the electrodes in the touch sensor are formed over a substrate different from a substrate where the display element and the like are provided is described above, one or both of the pair of electrodes in the touch sensor may be formed over the substrate where the display element and the like are provided.

A structure example of a touch panel incorporating the touch sensor into a display portion including a plurality of pixels will be described below. Here, an example in which a liquid crystal element is used as a display element provided in the pixel is shown.

Figure 44A:
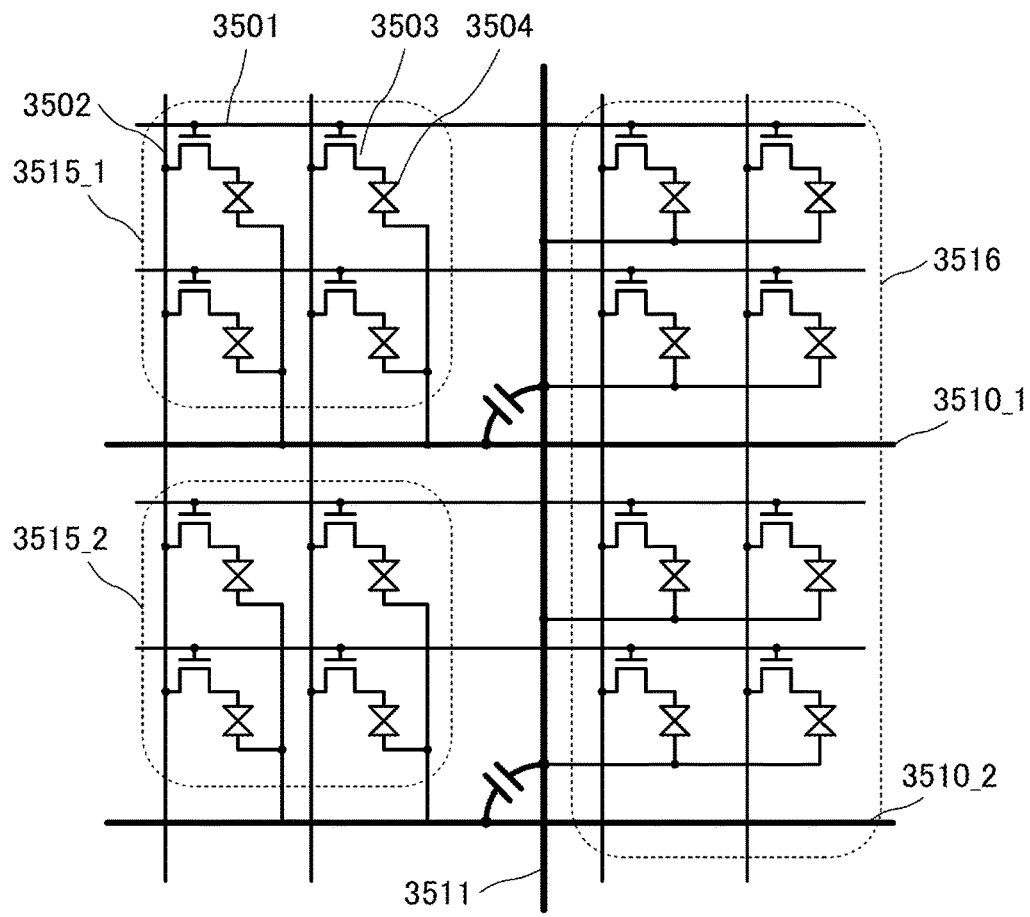
FIGS. 44A and 44B Drawings illustrating a pixel provided with a touch sensor according to an embodiment.

FIG. 44(A) is an equivalent circuit diagram of part of a pixel circuit provided in the display portion of the touch panel exemplified in this structure example.

One pixel includes at least a transistor 3503 and a liquid crystal element 3504. In addition, a gate of the transistor 3503 is electrically connected to a wiring 3501 and one of a source and a drain thereof is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511). They are provided to intersect with each other, and capacitance is formed therebetween.

In addition, in the pixels provided in the pixel circuit, one electrodes of the liquid crystal elements of some of a plurality of pixels adjacent to each other are electrically connected to each other to form one block. The block is classified into two types: an island-shaped block (e.g., a block 3515_1 or a block 3515_2) and a linear block (e.g., a block 3516) extending in the Y direction. Note that only part of the pixel circuit is illustrated in FIG. 44; actually, these two kinds of blocks are repeatedly arranged in the X direction and the Y direction.

The wiring 3510_1 (or 3510_2) extending in the X direction is electrically connected to the island-shaped block 3515_1 (or the block 3515_2). Although not illustrated, the wiring 3510_1 extending in the X direction is electrically connected to a plurality of island-shaped blocks 3515_1 which are provided discontinuously along the X direction with the linear blocks therebetween. Furthermore, the wiring 3511 extending in the Y direction is electrically connected to the linear block 3516.

Figure 44B:
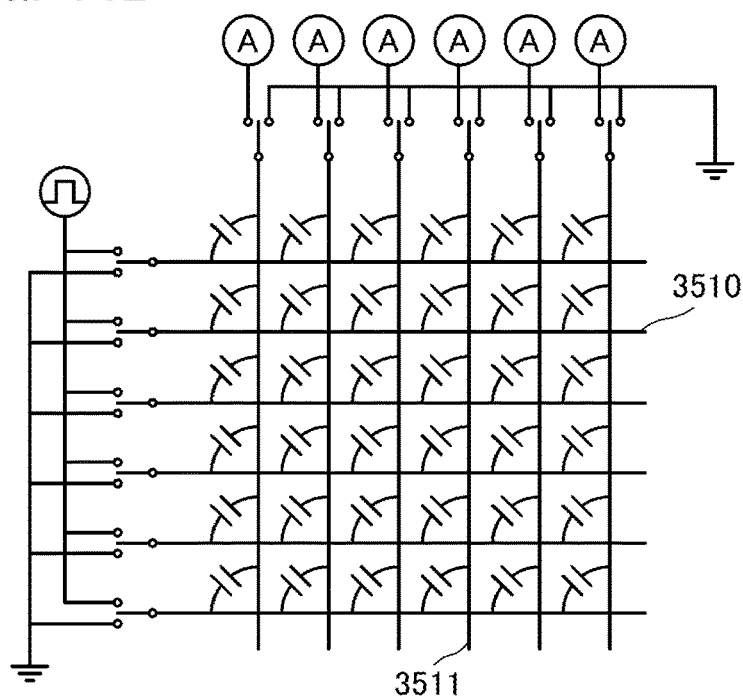

FIG. 44(B) is an equivalent circuit diagram illustrating the connection structure between the plurality of wirings 3510 extending in the X direction and the plurality of wirings 3511 extending in the Y direction. Input voltage or a common potential can be input to each of the wirings 3510 extending in the X direction. Furthermore, a ground potential can be input to each of the wirings 3511 extending in the Y direction, or the wirings 3511 can be electrically connected to a detection circuit.

Operation of the above-described touch panel is described with reference to FIGS. 45(A) and (B) below.

Here, one frame period is divided into a writing period and a sensing period. The writing period is a period during which image data is written to a pixel, and the wirings 3510 (also referred to as gate lines) are sequentially selected. On the other hand, the sensing period is a period during which sensing is performed by a touch sensor, and the wirings 3510 extending in the X direction are sequentially selected and input voltage is input.

FIG. 45(A) is an equivalent circuit diagram in the writing period. In the writing period, a common potential is input to both the wiring 3510 extending in the X direction and the wiring 3510 extending in the Y direction.

FIG. 45(B) is an equivalent circuit diagram at some point in time in the sensing period. In the sensing period, each of the wirings 3511 extending in the Y direction is electrically connected to the detection circuit. In addition, input voltage is input to the wirings 3510 extending in the X direction which are selected, and a common potential is input to other wirings 3510.

Note that the driving method described here can be applied to not only an in-cell type but also the above-described touch panels, and can be used in combination with the method described in the driving method example.

It is preferable that a period during which an image is written and a period during which sensing is performed by a touch sensor be separately provided as described above. Thus, a decrease in sensitivity of the touch sensor caused by noise generated when data is written to a pixel can be suppressed.

<Example of Manufacturing Method>

Here, a method for manufacturing a flexible touch panel will be described.

Here, for convenience, a structure including a pixel and a circuit, a structure including an optical member such as a color filter, a structure including electrodes and wirings in a touch sensor, or the like is referred to as an element layer. An element layer includes a display element, for example, and may include a wiring electrically connected to the display element or an element such as a transistor used in a pixel or a circuit in addition to the display element.

In addition, here, a support (e.g., the substrate 391 or the substrate 191 in FIG. 35) with an insulating surface where an element layer is formed is referred to as a substrate.

As a method for forming an element layer over a flexible substrate provided with an insulating surface, there are a method in which an element layer is formed directly over a substrate, and a method in which an element layer is formed over a supporting base that is different from a substrate and then the element layer is separated from the supporting base and transferred to the substrate.

In the case where a material of the substrate can withstand heat applied in a process for forming the element layer, it is preferable that the element layer be formed directly over the substrate, in which case the process can be simplified. At this time, the element layer is preferably formed in a state where the substrate is fixed to the supporting base, in which case transfer thereof in an apparatus and between apparatuses can be easy.

In addition, in the case of employing the method in which the element layer is formed over the supporting base and then transferred to the substrate, first, a separation layer and an insulating layer are stacked over the supporting base, and then, the element layer is formed over the insulating layer. Next, the element layer is separated from the supporting base and then transferred to the substrate. In that case, a material is selected that would cause separation at the interface between the supporting base and the separation layer, at the interface between the separation layer and the insulating layer, or in the separation layer.

For example, it is preferable that a stacked layer of a layer including a high-melting-point metal material, such as tungsten, and a layer including an oxide of the metal material be used as the separation layer, and a stacked layer of a plurality of silicon nitride and silicon oxynitride be used as the insulating layer over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, the separation may be performed by heating the separation interface by utilizing a difference in thermal expansion.

In addition, the separation layer is not necessarily provided in the case where separation can occur at the interface between the supporting base and the insulating layer. For example, glass is used as the supporting base and an organic resin such as polyimide is used as the insulating layer, a separation trigger is formed by locally heating part of the organic resin by laser light or the like, and separation is performed at the interface between the glass and the insulating layer. Alternatively, a metal layer may be provided between the supporting base and the insulating layer formed of an organic resin, and separation may be performed at the interface between the metal layer and the insulating layer by heating the metal layer by feeding a current to the metal layer. Alternatively, a layer of a light-absorbing material (e.g., a metal, a semiconductor, or an insulator) may be provided between the supporting base and the insulating layer formed of an organic resin and may be locally heated by being irradiated with light such as laser light to form a separation trigger. In these methods, the insulating layer formed of an organic resin can be used as a substrate.

As a flexible substrate, for example, polyester resins such as polyethylene terephthalate (PET) and polyethylene naphthalate (PEN), a polyacrylonitrile resin, a polyimide resin, polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and the like are given. In particular, a material whose thermal expansion coefficient is low is preferred, and for example, a polyamide imide resin, a polyimide resin, PET, or the like with a thermal expansion coefficient of $30 \times 10^{-6}$/K or less can be suitably used. In addition, a substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. As typical examples thereof, a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber can be given. As the glass fiber, a glass fiber using E glass, S glass, D glass, Q glass, or the like can be given. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material in which glass and a resin material are bonded to each other may be used.

In the structure illustrated in FIG. 35, for example, a first separation layer and the insulating layer 394 are formed in this order over a first supporting base, and then, upper components are formed. Separately, a second separation layer and the insulating layer 194 are formed in this order over a second supporting base, and then, upper components are formed. Next, the first supporting base and the second supporting base are attached to each other with the adhesive layer 151. After that, separation at the interface between the second separation layer and the insulating layer 194 is performed so that the second supporting base and the second separation layer are removed, and then, the substrate 191 is attached to the insulating layer 194 with the adhesive layer 192. Furthermore, separation at the interface between the first separation layer and the insulating layer 394 is performed so that the first supporting base and the first separation layer are removed, and then, the substrate 391 is attached to the insulating layer 394 with the adhesive layer 392. Note that either side may be subjected to separation and attachment first.

The above is the description of the method for manufacturing a flexible touch panel.

The input/output device (the touch panel), the input device (the touch sensor), the output device (the display panel), and the like which are described as examples in this embodiment can be applied to the display portions of the electronic device 21 and the display device 11 which are described as examples in Embodiment 1. In addition, the flexible display panel or touch panel can be applied to the display portion 24 provided along the curved surface of the housing 22 or the display portion 13 of the display device 11 which is intended to be bent. In addition, the flexible display panel or touch panel, or alternatively, an inflexible display panel or touch panel may be applied to the display portion 23 which performs display along a flat surface.

At least part of this embodiment can be implemented in combination with any of the other embodiments described in this specification as appropriate.

REFERENCE NUMERALS

10: system
11: display device
12: support
13: display portion
14: connection portion
14a: movable portion
14b: detachment portion
15: connection mechanism
16: terminal
17: window portion
18: fastener
20: electronic device
21: electronic device
22: housing
23: display portion
24: display portion
25: support mechanism
26: engagement portion
27: connection mechanism
28: terminal
29: projection
31: hinge
31a: portion
31b: portion
32: immovable portion
36: rotation axis
37: rotation axis
38: rotation axis
50: arithmetic portion
51: memory device
52: detection portion
53: wireless communication portion
54: antenna
55: power management portion
56: power reception portion
57: battery module
58: shape detection portion
60: external interface
61: camera module
62: sound controller
63: audio output portion
64: audio input portion
65: sensor
71: touch panel
72: display controller
73: touch sensor controller
81: touch panel
82: display controller
83: touch sensor controller
85: battery module
100: touch panel
106: connection portion
106a: connection portion
106b: connection portion
109: connection layer
109a: connection layer
109b: connection layer
111: substrate
112: substrate
113: substrate
114: substrate
130: protective substrate
131: polarizing plate
132: polarizing plate
133: backlight
151: adhesive layer
152: adhesive layer
153: adhesive layer
154: adhesive layer
155: adhesive layer
156: adhesive layer
157: adhesive layer
158: adhesive layer
161: insulating layer
191: substrate
192: adhesive layer
193: substrate
194: insulating layer
201: transistor
202: transistor
203: transistor
204: display element
205: capacitor
206: connection portion
207: wiring
208: display element
209: connection layer
211: insulating layer
212: insulating layer
213: insulating layer
214: insulating layer
215: insulating layer
216: spacer
221: electrode
222: EL layer
223: electrode
224: optical adjustment layer
231: coloring layer
232: light-blocking layer
233: insulating layer
234: insulating layer
251: electrode
252: electrode
253: liquid crystal
254: insulating layer
255: overcoat
261: semiconductor layer
262: region 263: region
310: input device
330: substrate
331: electrode
332: electrode
333: electrode
334: bridge electrode
336: electrode
337: electrode
338: intersection portion
341: wiring
342: wiring
350: FPC
350a: FPC
350b: FPC
351: IC
361: conductive film
362: conductive film
363: conductive film
364: nanowire
370: display panel
371: substrate
372: substrate
373: FPC
374: IC
381: display portion
382: driver circuit
383: wiring
385: connection portion
386: connector
387: intersection portion
391: substrate
392: connection layer
393: substrate
394: insulating layer
3501: wiring
3502: wiring
3503: transistor
3504: liquid crystal element
3510: wiring
3510_1: wiring
3510_2: wiring
3511: wiring
3515_1: block
35152: block
3516: block

The invention claimed is:

1. A flexible display device attachable to and detachable from an electronic device,
wherein the electronic device includes a first display portion on an upper surface of a housing and a second display portion on a first side surface of the housing,
wherein the flexible display device includes a connection portion, a third display portion, and a portion capable of transmitting visible light,
wherein the third display portion is positioned on a first surface of the flexible display device,
wherein relative positions of the flexible display device and the electronic device have a closed configuration and an open configuration when the connection portion is attached to a second side surface of the housing, and
wherein, in the closed configuration, the third display portion covers the first display portion and the portion capable of transmitting visible light covers the second display portion.

2. The flexible display device according to claim 1, wherein the portion capable of transmitting visible light is provided on a side opposite to the connection portion with the third display portion located therebetween.

3. The flexible display device according to claim 1, wherein the second display portion has a curved surface.

4. The flexible display device according to claim 1, wherein the second side surface is opposite to the first side surface.

5. The flexible display device according to claim 1, wherein, in the closed configuration, the first display portion and the third display portion face each other.

6. The flexible display device according to claim 1, wherein, in the closed configuration, the second display portion is visible through the portion capable of transmitting visible light.

7. The flexible display device according to claim 1, wherein the connection portion includes a reception portion supplied with electric power and signals from the electronic device.

8. The flexible display device according to claim 7, wherein the reception portion is supplied with the electric power and the signals from the electronic device wirelessly.

9. A system comprising an electronic device and a flexible display device attachable to and detachable from the electronic device,
wherein the electronic device includes a first display portion on an upper surface of a housing and a second display portion on a first side surface of the housing,
wherein the flexible display device includes a connection portion, a third display portion, and a portion capable of transmitting visible light,
wherein the third display portion is positioned on a first surface of the flexible display device,
wherein relative positions of the flexible display device and the electronic device have a closed configuration and an open configuration when the connection portion is attached to a second side surface of the housing, and
wherein, in the closed configuration, the third display portion covers the first display portion and the portion capable of transmitting visible light covers the second display portion.

10. The system according to claim 9, wherein the portion capable of transmitting visible light is provided on a side opposite to the connection portion with the third display portion located therebetween.

11. The system according to claim 9, wherein the second display portion has a curved surface.

12. The system according to claim 9, wherein the second side surface is opposite to the first side surface.

13. The system according to claim 9, wherein, in the closed configuration, the first display portion and the third display portion face each other.

14. The system according to claim 9, wherein, in the closed configuration, the second display portion is visible through the portion capable of transmitting visible light.

15. The system according to claim 9, wherein the connection portion includes a reception portion supplied with electric power and signals from the electronic device.

16. The system according to claim 15, wherein the reception portion is supplied with the electric power and the signals from the electronic device wirelessly.

* * * * *